(12) United States Patent
Sugiyama et al.

(10) Patent No.: US 11,646,546 B2
(45) Date of Patent: May 9, 2023

(54) SEMICONDUCTOR LIGHT EMITTING ARRAY WITH PHASE MODULATION REGIONS FOR GENERATING BEAM PROJECTION PATTERNS

(71) Applicant: HAMAMATSU PHOTONICS K.K., Hamamatsu (JP)

(72) Inventors: Takahiro Sugiyama, Hamamatsu (JP); Yuu Takiguchi, Hamamatsu (JP); Yoshitaka Kurosaka, Hamamatsu (JP); Kazuyoshi Hirose, Hamamatsu (JP); Yoshiro Nomoto, Hamamatsu (JP); Soh Uenoyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 537 days.

(21) Appl. No.: 16/433,127

(22) Filed: Jun. 6, 2019

(65) Prior Publication Data
US 2019/0288483 A1 Sep. 19, 2019

Related U.S. Application Data

(63) Continuation-in-part of application No. PCT/JP2018/012188, filed on Mar. 26, 2018.

(30) Foreign Application Priority Data

Mar. 27, 2017 (JP) .............................. JP2017-061582
Dec. 8, 2017 (JP) .............................. JP2017-236198
Jun. 8, 2018 (JP) .............................. JP2018-110112

(51) Int. Cl.
*H01S 5/11* (2021.01)
*H01S 5/042* (2006.01)
(Continued)

(52) U.S. Cl.
CPC ............ *H01S 5/11* (2021.01); *H01S 5/04256* (2019.08); *H01S 5/42* (2013.01); *H01S 5/026* (2013.01);
(Continued)

(58) Field of Classification Search
CPC ........ H01S 5/11; H01S 5/04256; H01S 5/124; H01S 5/026; H01S 5/0425;
(Continued)

(56) References Cited

U.S. PATENT DOCUMENTS 5,561,683 A 10/1996 Kwon
5,583,351 A 12/1996 Brown et al.
(Continued)

FOREIGN PATENT DOCUMENTS

CN 1908764 A 2/2007
CN 101040409 A 9/2007
(Continued)

OTHER PUBLICATIONS

International Preliminary Report on Patentability (IPRP) dated Dec. 26, 2019 that issued in WO Patent Application No. PCT/JP2018/022609.
(Continued)

*Primary Examiner* — M. A. Golub-Miller
(74) *Attorney, Agent, or Firm* — Faegre Drinker Biddle & Reath LLP

(57) ABSTRACT

The present embodiment relates to a single semiconductor light-emitting element including a plurality of light-emitting portions each of which is capable of generating light of a desired beam projection pattern and a method for manufacturing the semiconductor light-emitting element. In the semiconductor light-emitting element, an active layer and a phase modulation layer are formed on a common substrate layer, and the phase modulation layer includes at least a
(Continued)

plurality of phase modulation regions arranged along the common substrate layer. The plurality of phase modulation regions are obtained by separating the phase modulation layer into a plurality of places after manufacturing the phase modulation layer, and as a result, the semiconductor light-emitting element provided with a plurality of light-emitting portions that have been accurately aligned can be obtained through a simple manufacturing process as compared with the related art.

14 Claims, 41 Drawing Sheets

(51) Int. Cl.
  *H01S 5/12* (2021.01)
  *H01S 5/42* (2006.01)
  *H01S 5/026* (2006.01)
  *H01S 5/343* (2006.01)
  *H01S 5/183* (2006.01)

(52) U.S. Cl.
  CPC ......... *H01S 5/0425* (2013.01); *H01S 5/04254* (2019.08); *H01S 5/1835* (2013.01); *H01S 5/34313* (2013.01); *H01S 5/34353* (2013.01); *H01S 5/423* (2013.01); *H01S 2301/16* (2013.01); *H01S 2301/18* (2013.01); *H01S 2301/20* (2013.01)

(58) Field of Classification Search
  CPC ............... H01S 5/04254; H01S 5/1835; H01S 5/34313; H01S 5/34353; H01S 5/423; H01S 2301/16; H01S 2301/18; H01S 2301/20; H01S 5/2063
  See application file for complete search history.

(56) References Cited

U.S. PATENT DOCUMENTS

| | | | |
|---|---|---|---|
| 6,005,262 | A | 12/1999 | Cunningham et al. |
| 6,810,056 | B1 | 10/2004 | Lipson et al. |
| 6,826,223 | B1 | 11/2004 | Meyer et al. |
| 9,531,160 | B2 | 12/2016 | Noda et al. |
| 9,991,669 | B2 | 6/2018 | Hirose et al. |
| 10,734,786 | B2 | 8/2020 | Hirose et al. |
| 11,031,747 | B2 | 6/2021 | Kurosaka et al. |
| 11,031,751 | B2 | 6/2021 | Kurosaka et al. |
| 2003/0010763 | A1 | 1/2003 | Fukuchi et al. |
| 2003/0235229 | A1 | 12/2003 | Deng et al. |
| 2004/0247009 | A1 | 12/2004 | Noda et al. |
| 2004/0252741 | A1 | 12/2004 | Meyer et al. |
| 2007/0008998 | A1 | 1/2007 | Ohta et al. |
| 2007/0019099 | A1 | 1/2007 | Lieberman et al. |
| 2007/0030873 | A1 | 2/2007 | Deng |
| 2007/0075318 | A1 | 4/2007 | Noda et al. |
| 2007/0177647 | A1 | 8/2007 | Noda et al. |
| 2008/0175286 | A1 | 7/2008 | Kamijima |
| 2008/0240179 | A1 | 10/2008 | Otsuka et al. |
| 2008/0259981 | A1 | 10/2008 | Wang et al. |
| 2009/0010298 | A1 | 1/2009 | Kiyota |
| 2009/0074024 | A1 | 3/2009 | Noda et al. |
| 2009/0135869 | A1 | 5/2009 | Noda et al. |
| 2009/0175304 | A1 | 7/2009 | Noda et al. |
| 2009/0232179 | A1 | 9/2009 | Ikuta |
| 2009/0289266 | A1 | 11/2009 | Lee et al. |
| 2010/0220763 | A1 | 9/2010 | Ikuta |
| 2011/0188526 | A1 | 8/2011 | Noda et al. |
| 2012/0002692 | A1 | 1/2012 | Noda et al. |
| 2012/0050694 | A1 | 3/2012 | Huang et al. |
| 2013/0039375 | A1 | 2/2013 | Noda et al. |
| 2013/0121358 | A1 | 5/2013 | Hirose et al. |
| 2013/0163626 | A1 | 6/2013 | Seurin et al. |
| 2013/0243026 | A1 | 9/2013 | Noda et al. |
| 2013/0343415 | A1 | 12/2013 | Hori et al. |
| 2014/0211822 | A1 | 7/2014 | Fattal et al. |
| 2014/0299742 | A1 | 10/2014 | Fujii |
| 2014/0348195 | A1 | 11/2014 | Sakaguchi et al. |
| 2014/0355635 | A1 | 12/2014 | Iwahashi et al. |
| 2015/0185523 | A1 | 7/2015 | Matsumoto et al. |
| 2016/0020580 | A1 | 1/2016 | Takiguchi et al. |
| 2016/0020581 | A1 | 1/2016 | Hirose et al. |
| 2016/0036201 | A1 | 2/2016 | Takiguchi et al. |
| 2016/0072258 | A1 | 3/2016 | Seurin et al. |
| 2016/0075258 | A1 | 3/2016 | Kim |
| 2016/0248224 | A1 | 8/2016 | Noda et al. |
| 2016/0257036 | A1 | 9/2016 | Fang et al. |
| 2016/0261093 | A1 | 9/2016 | Noda et al. |
| 2016/0327906 | A1 | 11/2016 | Futterer |
| 2016/0380405 | A1 | 12/2016 | Takiguchi et al. |
| 2018/0006426 | A1 | 1/2018 | Takiguchi et al. |
| 2018/0109075 | A1 | 4/2018 | Kurosaka et al. |
| 2019/0165546 | A1 | 5/2019 | Hogg et al. |
| 2019/0181613 | A1 | 6/2019 | Kurosaka et al. |
| 2019/0288483 | A1 | 9/2019 | Sugiyama et al. |
| 2019/0312410 | A1* | 10/2019 | Sugiyama ................. H01S 5/42 |
| 2020/0373739 | A1 | 11/2020 | Hirose et al. |
| 2021/0249841 | A1* | 8/2021 | Aoki ....................... H01S 5/185 |

FOREIGN PATENT DOCUMENTS

| | | |
|---|---|---|
| CN | 101258652 | 9/2008 |
| CN | 101685941 A | 3/2010 |
| CN | 102447028 A | 5/2012 |
| CN | 102638003 A | 8/2012 |
| CN | 103038959 A | 4/2013 |
| CN | 103988379 A | 8/2014 |
| CN | 104471465 A | 3/2015 |
| CN | 104852278 A | 8/2015 |
| CN | 105191029 A | 12/2015 |
| CN | 105960744 A | 9/2016 |
| JP | S49-24190 U | 3/1974 |
| JP | S59-177282 A | 10/1984 |
| JP | H7-297110 A | 11/1995 |
| JP | H09-139540 A | 5/1997 |
| JP | H9-282437 A | 10/1997 |
| JP | H9-311614 A | 12/1997 |
| JP | 2006-026726 A | 2/2006 |
| JP | 2007-19277 A | 1/2007 |
| JP | 2008-256823 A | 10/2008 |
| JP | 2009-111360 A | 5/2009 |
| JP | 2009-212359 A | 9/2009 |
| JP | 2009-540593 A | 11/2009 |
| JP | 2010-283335 A | 12/2010 |
| JP | 2012-195341 A | 10/2012 |
| JP | 2013-161965 A | 8/2013 |
| JP | 2014-026083 A | 2/2014 |
| JP | 2014-27264 A | 2/2014 |
| JP | 2014-197665 A | 10/2014 |
| JP | 2014-202867 A | 10/2014 |
| JP | 2014-236127 A | 12/2014 |
| JP | 2016-122711 A | 7/2016 |
| JP | 2016-129208 A | 7/2016 |
| JP | 2016-167639 A | 9/2016 |
| JP | 2018-026463 A | 2/2018 |
| WO | WO-01/53876 A1 | 7/2001 |
| WO | WO 2008/041138 A2 | 4/2008 |
| WO | WO 2012/035620 A1 | 3/2012 |
| WO | WO 2012/036300 A1 | 3/2012 |
| WO | WO-2014/017289 A1 | 1/2014 |
| WO | WO-2014/136607 A1 | 9/2014 |
| WO | WO-2014/136955 A1 | 9/2014 |
| WO | WO-2014/136962 A1 | 9/2014 |
| WO | WO 2014/175447 A1 | 10/2014 |
| WO | WO-2015/008627 A1 | 1/2015 |
| WO | WO 2015/118741 A1 | 8/2015 |
| WO | WO 2016/031965 A1 | 3/2016 |
| WO | WO-2016/111332 A1 | 7/2016 |
| WO | WO-2016/148075 A1 | 9/2016 |
| WO | WO-2017/191320 A1 | 11/2017 |

OTHER PUBLICATIONS

(56) References Cited

OTHER PUBLICATIONS

International Preliminary Report on Patentability (IPRP) dated Oct. 10, 2019 that issued in WO Patent Application No. PCT/JP2018/012188.

International Preliminary Report on Patentability (IPRP) dated Oct. 10, 2019 that issued in WO Patent Application No. PCT/JP2018/012191.

JP Office Action dated Mar. 23, 2021 from counterpart Japanese patent application No. 2017-117736 (with attached English-language translation).

Kyosuke Sakai et al., "Coupled-Wave Theory for Square-Lattice Photonic Crystal Lasers with TE Polarization," IEEE Journal of Quantum Electronics, May 2010, pp. 788-795, vol. 46, No. 5.

Chao Peng et al., "Coupled-wave analysis for photonic-crystal surface-emitting lasers on air holes with arbitrary sidewalls," Optics Express, Nov. 21, 2011, pp. 24672-24686, vol. 19, No. 24.

Yoshitaka Kurosaka et al., "Effects of non-lasing band in two-dimensional photonic-crystal lasers clarified using omnidirectional band structure," Optics Express, Sep. 10, 2012, pp. 21773-21783, vol. 20, No. 19.

Wai Hon Lee, "Sampled Fourier Transform Hologram Generated by Computer," Applied Optics, Mar. 1970, pp. 639-644, vol. 9, No. 3.

Yoshitaka Kurosaka et al., "Phase-modulating lasers toward on-chip integration," Scientific Reports, Jul. 26, 2016, pp. 30138 (8 pages), vol. 6.

International Preliminary Report on Patentability dated Mar. 21, 2019 for PCT/JP2017/031466.

International Preliminary Report on Patentability dated Feb. 21, 2019 for PCT/JP2017/029152.

English-language translation of International Preliminary Report on Patentability (IPRP) dated Dec. 17, 2020 that issued in WO Patent Application No. PCT/JP2019/022363.

English-language translation of International Preliminary Report on Patentability (IPRP) dated Jun. 18, 2020 that issued in WO Patent Application No. PCT/JP2018/043843.

JP Office Action dated Aug. 17, 2021 from counterpart Japanese patent application No. P2019-509823 (with attached English-language translation).

* cited by examiner

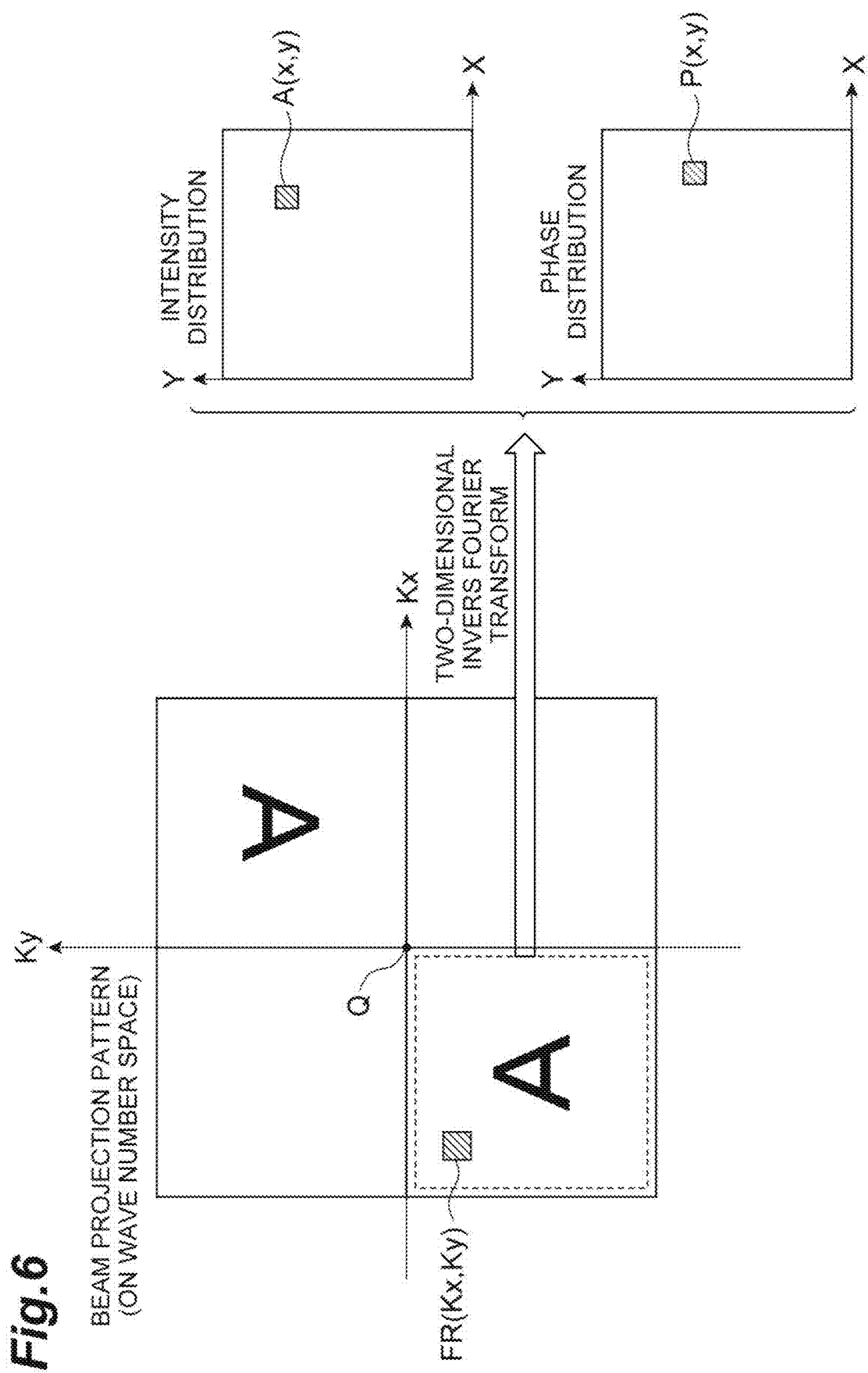

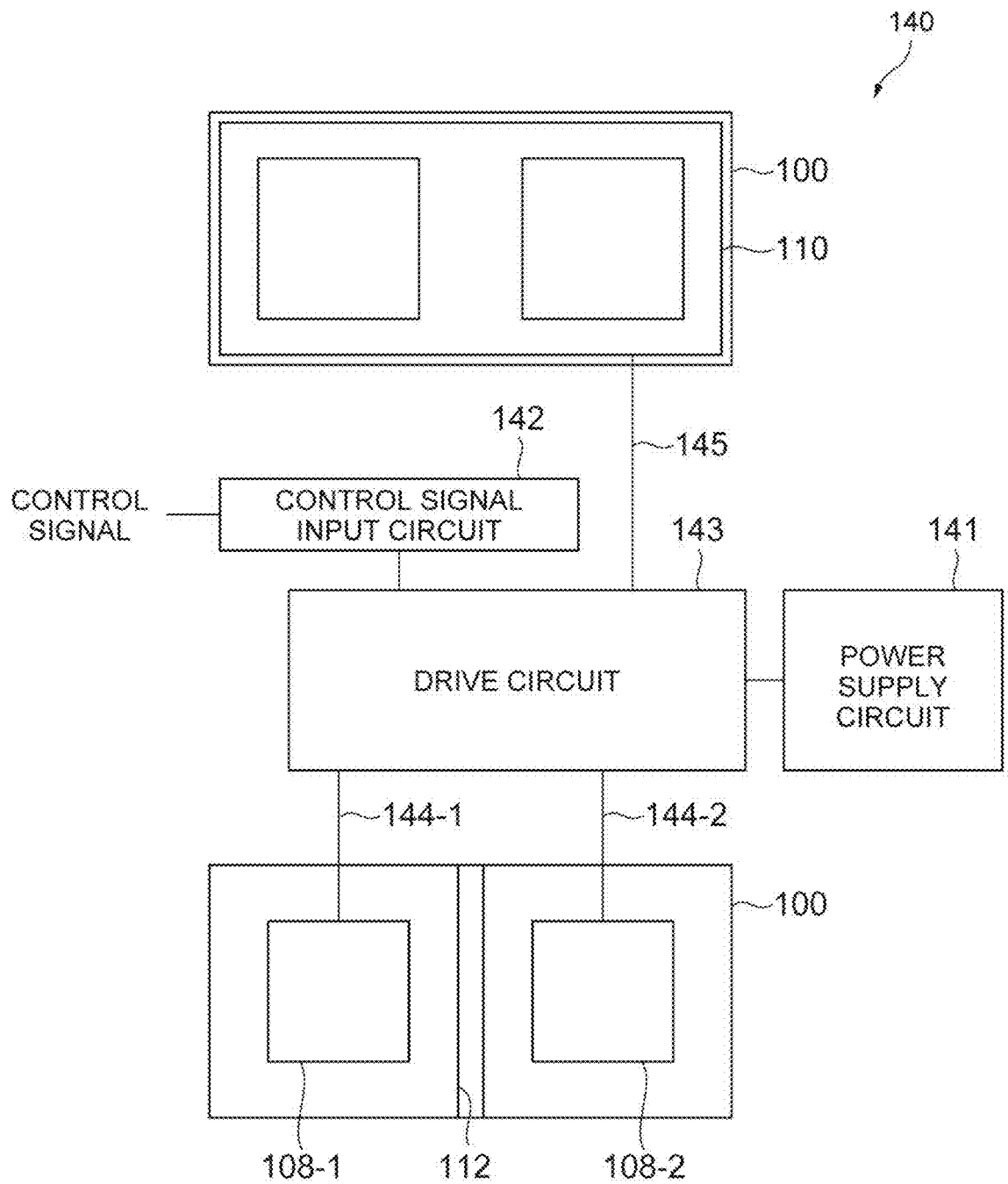

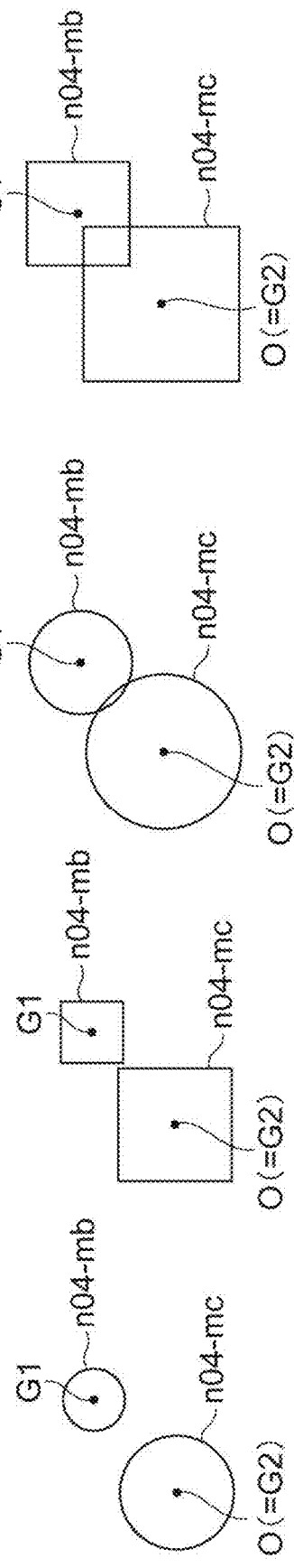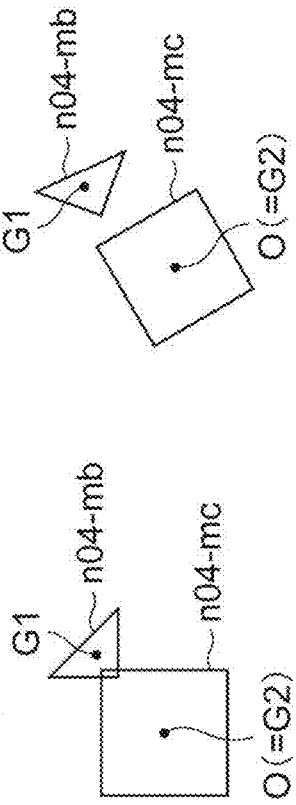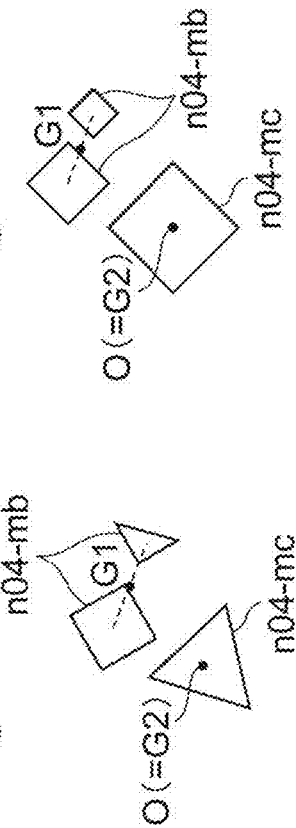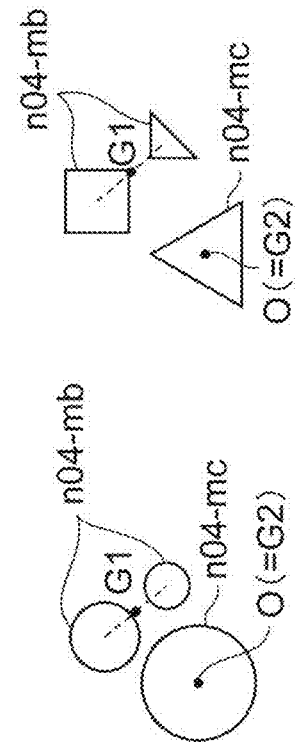

Fig.31A

| A2 | A1 |
|---|---|
| A3 | A4 |

ORIGINAL IMAGE

Fig.31B

| A4<br><br>ROTATION OF A2 | A3<br><br>ROTATION OF A1 |
|---|---|
| A1<br><br>ROTATION OF A3 | A2<br><br>ROTATION OF A4 |

OBTAINED BEAM PROJECTION PATTERN

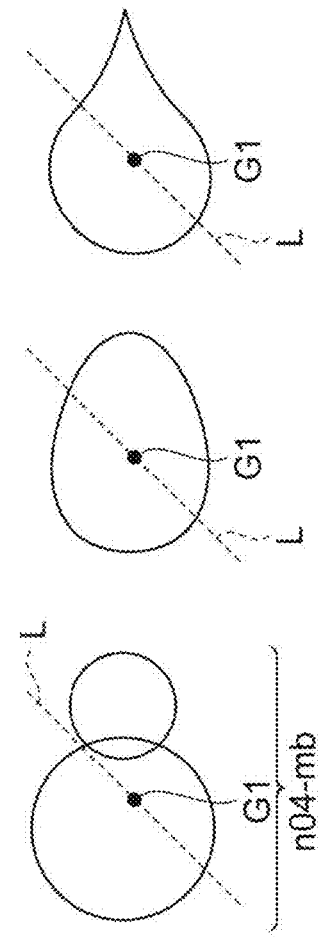
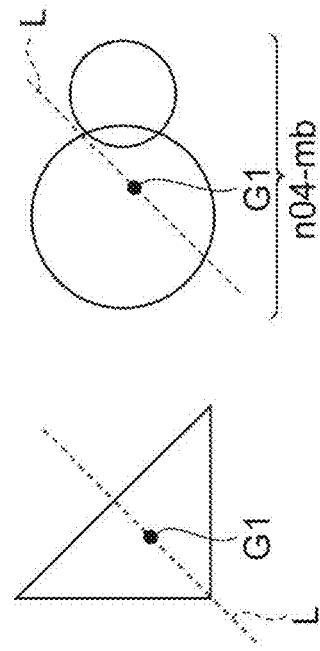
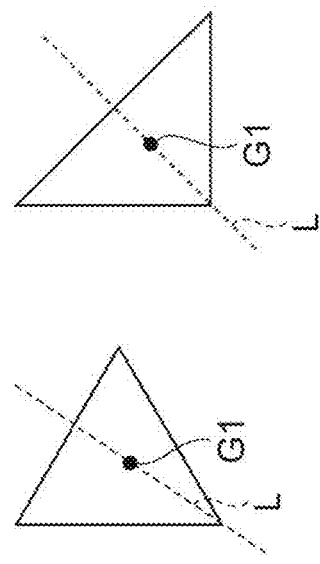
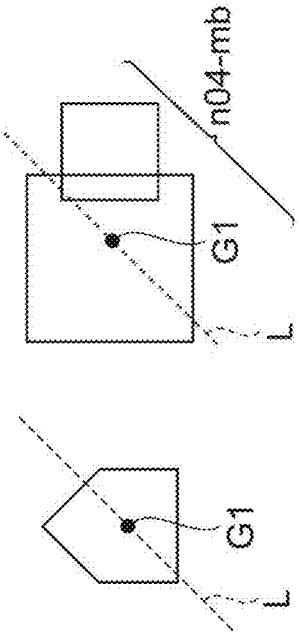
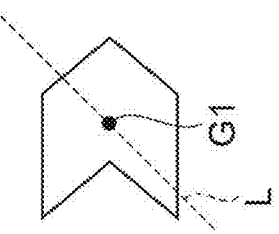
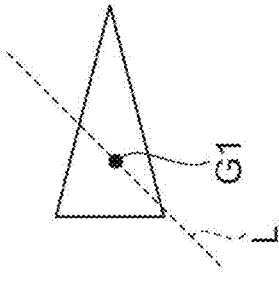
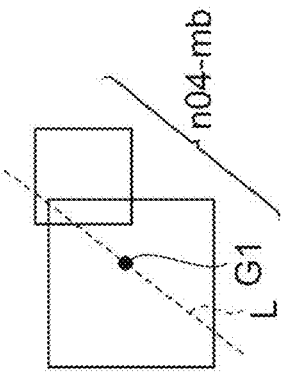

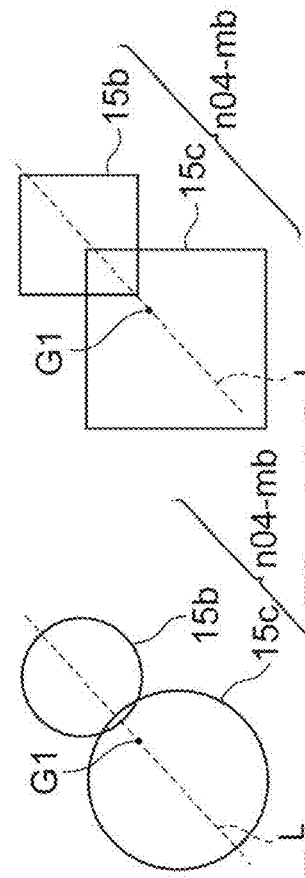
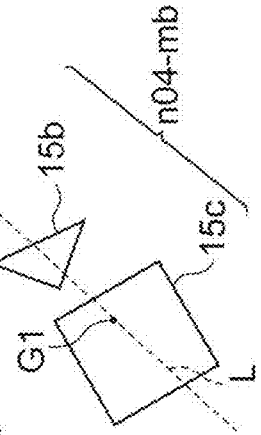
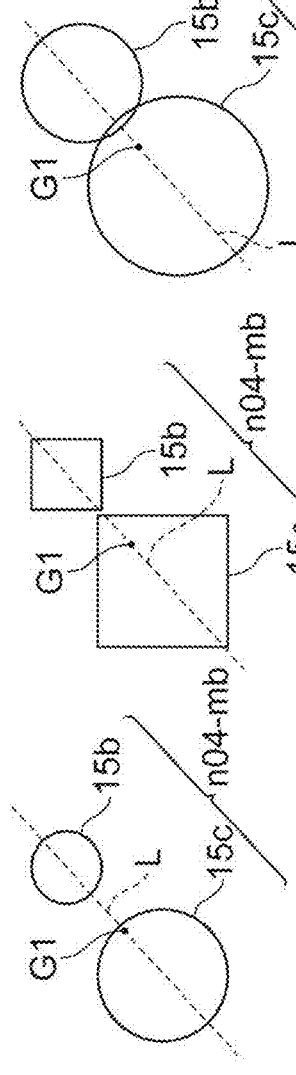
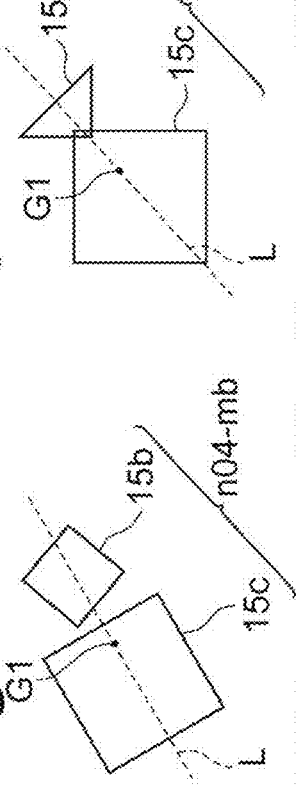
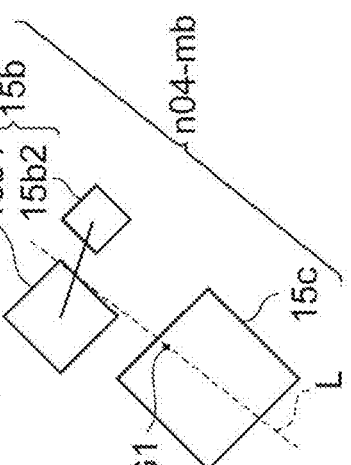
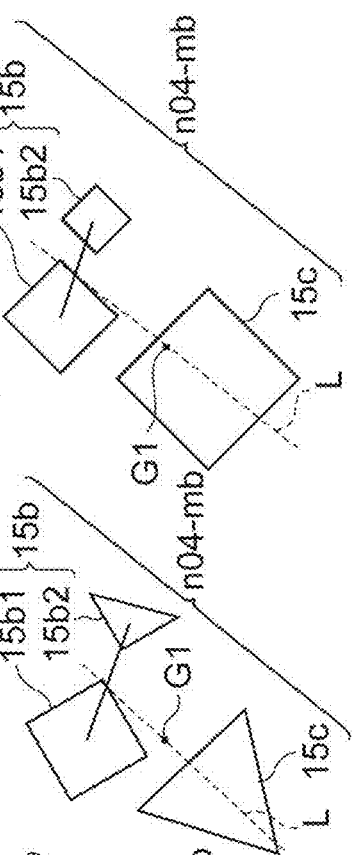
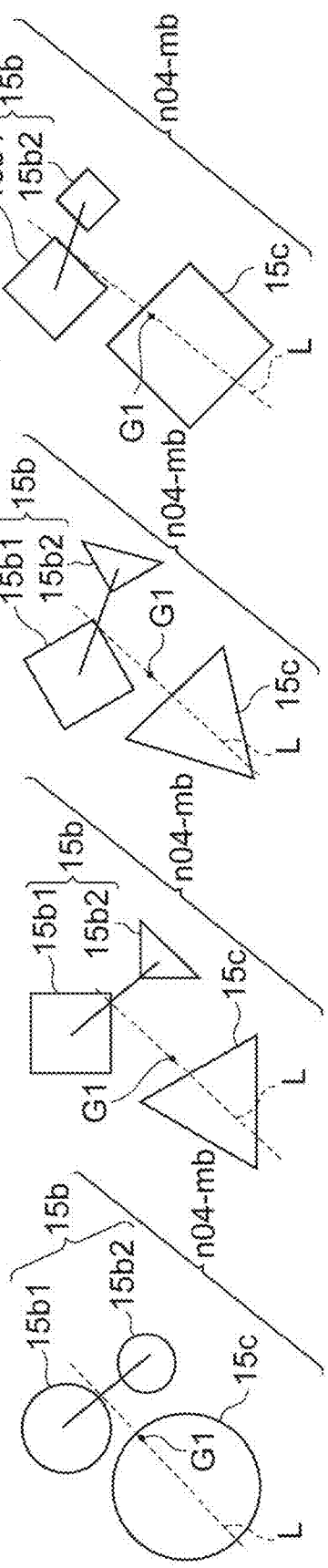

SEMICONDUCTOR LIGHT EMITTING ARRAY WITH PHASE MODULATION REGIONS FOR GENERATING BEAM PROJECTION PATTERNS

CROSS-REFERENCE TO RELATED APPLICATIONS

This application is a Continuation-In-Part application of PCT/JP2018/012188 claiming the benefit of priority of the Japanese Patent Application Nos. 2017-061582 filed on Mar. 27, 2017 and 2017-236198 filed on Dec. 8, 2017, and further claims the benefit of priority of the Japanese Patent Application No. 2018-110112 filed on Jun. 8, 2018, the entire contents of which are incorporated herein by reference.

TECHNICAL FIELD

The present invention relates to a semiconductor light-emitting element and a method for manufacturing the semiconductor light-emitting element.

BACKGROUND ART

A semiconductor light-emitting element described in Patent Document 1 includes an active layer and a phase modulation layer optically coupled to the active layer. The phase modulation layer has a base layer and a plurality of modified refractive index regions arranged in the base layer. The semiconductor light-emitting element described in Patent Document 1 emits light of a beam pattern (beam projection pattern) corresponding to an arrangement pattern of a plurality of modified refractive index regions. That is, the arrangement pattern of the plurality of modified refractive index regions is set in accordance with the target beam pattern. Patent Document 1 also describes an application example of such a semiconductor light-emitting element. In the above-described application example, a plurality of semiconductor light-emitting elements emitting different directions of laser beams, respectively, are one-dimensionally or two-dimensionally arrayed on a support board. Further, the above application example is configured such that an object is scanned by a laser beam by sequentially lighting the plurality of arrayed semiconductor light-emitting elements. The above application example is applied to measurement of a distance to an object, laser processing of the object, and the like by scanning the object with a laser beam.

CITATION LIST

Patent Literature

Patent Document 1: WO 2016/148075 A

Non Patent Literature

Non Patent Document 1: Y. Kurosaka et al., "Effects of non-lasing band in two-dimensional photonic-crystal lasers clarified using omnidirectional band structure," Opt. Express 20, 21773-21783 (2012).
Non Patent Document 2: K. Sakai et al., "Coupled-Wave Theory for Square-Lattice Photonic Crystal Lasers with TE Polarization," IEEE J. Q. E. 46, 788-795 (2010).
Non Patent Document 3: Peng, et al., "Coupled-wave analysis for photonic-crystal surface-emitting lasers on air holes with arbitrary sidewalls," Optics Express Vol. 19, No. 24, pp. 24672-24686 (2011).

SUMMARY OF INVENTION

Technical Problem

As a result of examining the conventional semiconductor light-emitting elements, the inventors have found out the following problems. That is, in the application example described in Patent Document 1, it is necessary to arrange the plurality of semiconductor light-emitting elements on the support board with high accuracy. This is not easy so that it is not easy to realize the irradiation of light of a desired beam projection pattern with respect to a desired beam projection region with high accuracy. In addition, there is even a risk that a manufacturing process becomes complicated because a step of arranging a plurality of semiconductor light-emitting elements on a support board is required.

The present invention has been made in view of such problems, and an object of the present invention is to provide a semiconductor light-emitting element, which does not require a step of arranging a plurality of semiconductor light-emitting elements on a support board and easily realizes irradiation of light of a target beam projection pattern with respect to a target beam projection region with high accuracy, and a method for manufacturing the semiconductor light-emitting element.

Solution to Problem

A semiconductor light-emitting element according to the present embodiment is a single semiconductor light-emitting element including a plurality of light-emitting portions in which crosstalk between adjacent light-emitting portions is reduced. The semiconductor light-emitting element includes a first surface and a second surface opposing the first surface, one of the first surface and the second surface functioning as a light emission surface that outputs light and the other functioning as a support surface (including a reflection surface). The semiconductor light-emitting element includes: an active layer; a phase modulation layer including a plurality of phase modulation regions; a first cladding layer; a second cladding layer; a first-surface-side electrode; a plurality of second-surface-side electrodes; and a common substrate layer. The active layer is positioned between the first surface and the second surface. Each of the plurality of phase modulation layers included in the phase modulation layer is optically coupled to the active layer. Each of the plurality of phase modulation regions is arranged such that generation of crosstalk between adjacent phase modulation regions is reduced, and forms a part of the independent light-emitting portion. In addition, each of the plurality of phase modulation regions includes a base region having a first refractive index and a plurality of modified refractive index regions each of which is provided within the base region and has a second refractive index different from the first refractive index. The first cladding layer is positioned on a side where the first surface is arranged with respect to a stacked structure including at least the active layer and the phase modulation layer. The second cladding layer is arranged on a side where the second surface is positioned with respect to the stacked structure. The first-surface-side electrode is arranged on a side where the first surface is positioned with respect to the first cladding layer. The plurality of second-surface-side electrodes correspond to the plurality of phase modulation regions, respectively, and are arranged on a side where the second surface is positioned with respect to the second cladding layer. The plurality of second-surface-side electrodes are arranged respectively in a plurality of regions overlapping the plurality of phase modulation regions as viewed along a stacking direction of the stacked structure. The common substrate layer is arranged between the first cladding layer and the first-surface-side electrode, and has a continuous surface that holds the plurality of phase modulation regions.

In particular, the plurality of modified refractive index regions in each of the plurality of phase modulation regions are arranged in the base region according to an arrangement pattern in which each gravity center is positioned at a place shifted by a predetermined distance from each lattice point in a virtual square lattice in the base region. Incidentally, the arrangement pattern (arrangement pattern of the plurality of modified refractive index regions) in each of the plurality of phase modulation regions is set such that a beam projection pattern of light outputted from the light emission surface and a beam projection region, which is a projection range of the beam projection pattern, coincide with a target beam projection pattern and a target beam projection region when a drive current is supplied from the second-surface-side electrode corresponding to the phase modulation region arranged on the support surface side.

In a method for manufacturing a semiconductor light-emitting element according to the present embodiment, a semiconductor light-emitting element having the above-described structure is manufactured. Specifically, the manufacturing method includes at least: a first step of forming the common substrate layer; a second step of forming an element body on the common substrate layer; and a third step of forming a separation region in the element body. In the second step, the element body foliated on the common substrate layer has a third surface and a fourth surface opposing the third surface and opposing the common substrate layer. In addition, the element body includes at least the active layer, the phase modulation layer, the first cladding layer, and the second cladding layer which are arranged between the third surface and the fourth surface. At the end of the second step, the base region in the phase modulation layer is formed of a single layer in which a plurality of portions that need to form the plurality of phase modulation regions (portions each including the plurality of modified refractive index regions) are arranged in the state of being separated from each other by a predetermined distance. In the third step, the separation region limited in the element body electrically separates at least the plurality of portions that need to form the plurality of phase modulation regions. In addition, the separation region is formed from the third surface to the fourth surface until reaching the common substrate layer.

Advantageous Effects of Invention

According to the present invention, it is possible to provide the semiconductor light-emitting element, which does not require the step of arranging the plurality of semiconductor light-emitting elements on the support board and easily realizes the irradiation of light of the target beam projection pattern with respect to the target beam projection region with high accuracy, and the method for manufacturing the semiconductor light-emitting element.

BRIEF DESCRIPTION OF DRAWINGS

FIG. 6 is a view for describing a relationship between a target beam projection pattern (optical image) of light outputted from the semiconductor light-emitting element and a rotation angle distribution in a phase modulation layer.

FIG. 8 is a block diagram illustrating a configuration of a light emission device including the semiconductor light-emitting element according to the first embodiment.

FIGS. 22A to 22J are views illustrating an example (in the rotation system) of a shape that does not have 180° rotational symmetry among shapes of a modified refractive index region in an X-Y plane.

FIGS. 25A to 25K are views illustrating an example (in the rotation system) of a combination of the modified refractive index region (displaced modified-refractive-index-region) and the lattice-point-located modified refractive index region in the case of providing the lattice-point-located modified refractive index region in addition to the modified refractive index region (displaced modified-refractive-index-region).

FIGS. 31A and 31B are views for describing points to be noted when a phase angle distribution is obtained from a result of inverse Fourier transform of a target beam projection pattern (optical image) to determine the arrangement of the modified refractive index region.

FIGS. 38A to 38K are views illustrating another example (in the on-axis shift system) of the plane shape of the modified refractive index region.

FIGS. 39A to 39K are views illustrating still another example (in the on-axis shift system) of the plane shape of the modified refractive index region.

DESCRIPTION OF EMBODIMENTS

Figure 1:
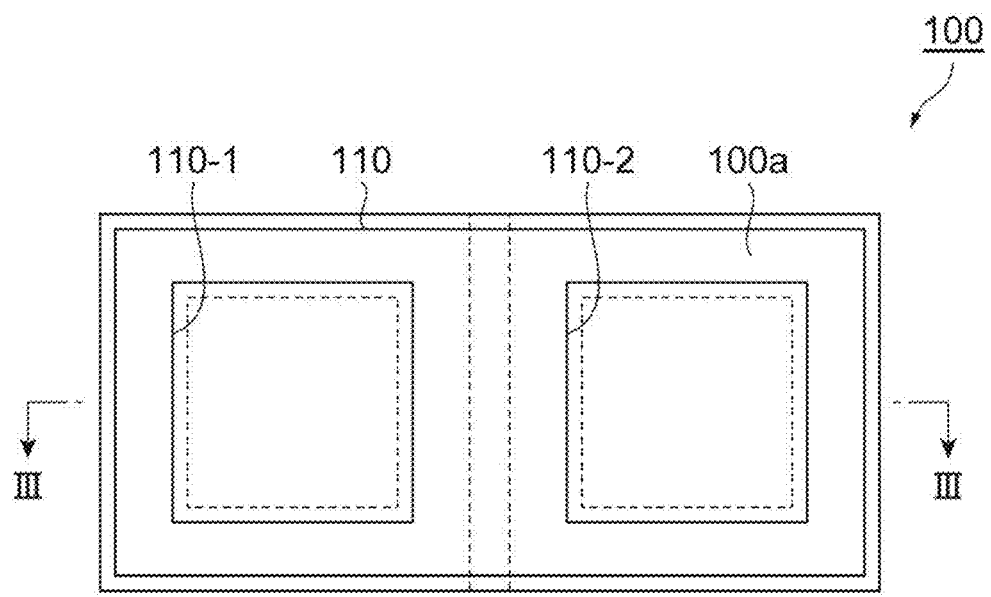
FIG. 1 is a view of a semiconductor light-emitting element according to a first embodiment as viewed from a first surface side.

Description of Embodiment of Invention of Present Application

First, the content of embodiments of the invention of the present application will be individually listed and described.

(1) As one aspect, a semiconductor light-emitting element according to the present embodiment is a single semiconductor light-emitting element including a plurality of light-emitting portions in which crosstalk between adjacent light-emitting portions is reduced. The semiconductor light-emitting element includes a first surface and a second surface opposing the first surface, one of the first surface and the second surface functioning as a light emission surface that outputs light and the other functioning as a support surface (including a reflection surface). The semiconductor light-emitting element includes: an active layer; a phase modulation layer including a plurality of phase modulation regions; a first cladding layer; a second cladding layer; a first-surface-side electrode; a plurality of second-surface-side electrodes; and a common substrate layer. The active layer is positioned between the first surface and the second surface. Each of the plurality of phase modulation layers included in the phase modulation layer is optically coupled to the active layer. Each of the plurality of phase modulation regions is arranged such that generation of crosstalk between adjacent phase modulation regions is reduced, and forms a part of the independent light-emitting portion. In addition, each of the plurality of phase modulation regions includes a base region having a first refractive index and a plurality of modified refractive index regions each of which is provided within the base region and has a second refractive index different from the first refractive index. The first cladding layer is positioned on a side where the first surface is arranged with respect to a stacked structure including at least the active layer and the phase modulation layer. The second cladding layer is arranged on a side where the second surface is positioned with respect to the stacked structure. The first-surface-side electrode is arranged on a side where the first surface is positioned with respect to the first cladding layer. The plurality of second-surface-side electrodes correspond to the plurality of phase modulation regions, respectively, and are arranged on a side where the second surface is positioned with respect to the second cladding layer. The plurality of second-surface-side electrodes are arranged respectively in a plurality of regions overlapping the plurality of phase modulation regions as viewed along a stacking direction of the stacked structure. The common substrate layer is arranged between the first cladding layer and the first-surface-side electrode, and has a continuous surface that holds the plurality of phase modulation regions.

Further, the plurality of modified refractive index regions in each of the plurality of phase modulation regions are arranged at predetermined positions in the base region according to an arrangement pattern configured to make a beam projection pattern of light outputted from the light emission surface and a beam projection region, which is a projection range of the beam projection pattern, coincide with a target beam projection pattern and a target beam projection region, respectively, when the drive current is supplied from the corresponding second-surface-side electrode among the plurality of second-surface-side electrodes.

Incidentally, as a first precondition, a virtual square lattice constituted by M1 (an integer of one or more)×N1 (an integer of one or more) unit configuration regions R each having a square shape is set on an X-Y plane in an XYZ orthogonal coordinate system defined by a Z-axis coinciding with the normal direction of a light emission surface and the X-Y plane including X and Y axes orthogonal to each other and coinciding with one surface of the phase modulation layer including the plurality of modified refractive index regions. At this time, the arrangement pattern is defined such that a gravity center G1 of the modified refractive index region positioned inside a unit configuration region R(x, y) is away from a lattice point O(x, y), which is the center of the unit configuration region R(x, y), by a distance r and a vector is directed in a specific direction toward the gravity center G1 from the lattice point O(x, y) in the unit configuration region R(x, y) on the X-Y plane specified by a coordinate component x (an integer of form 1 to M1) in an X-axis direction and a coordinate component y (an integer of from 1 to N1) in a Y-axis direction.

(2) As one aspect, in a method for manufacturing a semiconductor light-emitting element according to the present embodiment, a semiconductor light-emitting element having the above-described structure is manufactured. Specifically, the manufacturing method includes at least: a first step of forming the common substrate layer; a second step of forming an element body on the common substrate layer; and a third step of forming a separation region in the element body. In the second step, the element body formed on the common substrate layer has a third surface and a fourth surface opposing the third surface and opposing the common substrate layer. In addition, the element body includes at least the active layer, the phase modulation layer, the first cladding layer, and the second cladding layer which are arranged between the third surface and the fourth surface. At the end of the second step, the base region in the phase modulation layer is formed of a single layer in which a plurality of portions that need to form the plurality of phase modulation regions (portions each including the plurality of modified refractive index regions) are arranged in the state of being separated from each other by a predetermined distance. In the third step, the separation region formed in the element body electrically separates at least the plurality of portions that need to form the plurality of phase modulation regions. In addition, the separation region is formed from the third surface to the fourth surface until reaching the common substrate layer.

In the semiconductor light-emitting element according to the present embodiment, the arrangement pattern (arrangement pattern of the plurality of modified refractive index regions) in each of the plurality of phase modulation regions is set such that a beam projection pattern of light outputted from the light emission surface (the first surface or the second surface) and a beam projection region, which is a projection range of the beam projection pattern, coincide with a target beam projection pattern and a target beam projection region when a drive current is supplied from the second-surface-side electrode corresponding to the phase modulation region. Therefore, the arrangement pattern set in each of the plurality of phase modulation regions determines the beam projection region and the beam projection pattern of the light outputted from the light emission surface of the semiconductor light-emitting element. In the present embodiment, the single semiconductor light-emitting element includes the phase modulation layer having the plurality of phase modulation regions that determine the beam projection region and the beam projection pattern of light. With this configuration, in the manufacturing method according to the present embodiment, a step of arranging the plurality of semiconductor light-emitting elements on a support board is not required, which is different from a configuration in which a plurality of semiconductor light-emitting elements each including one phase modulation region (phase modulation layer) are arranged on a support board. As a result, irradiation of light of the target beam projection pattern with respect to the target beam projection region can be realized easily with high accuracy.

(3) As one aspect of the present embodiment, the semiconductor light-emitting element may further include a separation region that electrically separates each of the plurality of phase modulation regions and electrically separate a plurality of corresponding regions in each of the active layer, the first cladding layer, and the second cladding layer which overlap the plurality of phase modulation regions as viewed from a direction along the Z-axis (hereinafter referred to as a "Z-axis direction"). Further, as one aspect of the present embodiment, the separation region may optically separate the plurality of corresponding regions in each of the active layer, the phase modulation layer, the first cladding layer, and the second cladding layer together with the plurality of phase modulation regions. Since adjacent phase modulation regions are electrically separated by the separation region in this manner, generation of crosstalk between the adjacent phase modulation regions is suppressed. In addition, adjacent phase modulation regions are optically separated by the separation region, and thus, the generation of crosstalk between the adjacent phase modulation regions is further suppressed. As a result, irradiation of light of a desired beam projection pattern (target beam projection pattern) with respect to a desired beam projection region (target beam projection region) is realized with still higher accuracy.

(4) As one aspect of the present embodiment, the separation region extends from the second surface toward the common substrate layer surface until reaching the common substrate layer in a region between adjacent phase modulation regions among the plurality of phase modulation regions. In addition, a distance (shortest distance) between a distal end of the separation region and the first-surface-side electrode is preferably equal to or shorter than half the thickness of the common substrate layer along the Z-axis direction. Typically, the distance between the distal end of the separation region and the first-surface-side electrode is preferably 70 μm or shorter. In this case, the generation of crosstalk between adjacent phase modulation regions is sufficiently suppressed.

(5) As one aspect of the present embodiment, the separation region may be a semiconductor layer modified by an electric field caused by irradiation of high-intensity light. In this case, a semiconductor light-emitting element in which adjacent phase modulation regions are electrically separated so that generation of crosstalk between the adjacent phase modulation regions is sufficiently suppressed can be efficiently manufactured. In addition, the separation region may be any of a semiconductor layer insulated by impurity diffusion or ion implantation and an air gap (slit) formed by dry etching or wet etching. In this case, a semiconductor light-emitting element in which adjacent phase modulation regions are electrically and optically separated so that generation of crosstalk between the adjacent phase modulation regions is sufficiently suppressed can be efficiently manufactured.

(6) As one aspect of the present embodiment, an arrangement pattern in each of the phase modulation regions may be set such that beam projection regions become equal even if a drive current is supplied from any of the second-surface-side electrodes. In this case, various applications other than an application example of the semiconductor light-emitting element described in Patent Document 1 (the application example in which an object is scanned with a laser beam) can be implemented. For example, it is possible to implement an application to various display devices of a type in which a plurality of patterns are displayed in a switched manner in the same region of a screen, an application to various kinds of illumination of a type in which one place is continuously or intermittently irradiated with the same pattern of light, and an application to laser processing of a type in which one place is continuously irradiated with the same pattern of pulsed light to drill holes of a target pattern in an object, and the like.

(7) As one aspect of the present embodiment, an arrangement pattern in each of the phase modulation regions may be set such that beam projection patterns become equal even if a drive current is supplied from any of the plurality of second-surface-side electrodes. In this case, various applications other than the application example of the semiconductor light-emitting element described in Patent Document 1 (the application example in which the object is scanned with the laser beam) can be implemented, but also various applications other than the above application example can be implemented. As an application different from the application example illustrated in Patent Document 1, it is possible to implement an application to various kinds of illumination of a type in which one place is continuously or intermittently irradiated with the same pattern of light, and an application to laser processing of a type in which one place is continuously irradiated with the same pattern of pulsed light to drill holes of a target pattern in an object, and the like, and an application to illumination of a type that irradiates an arbitrary place at an appropriate timing can be also implemented in addition to the above-described applications.

In the semiconductor light-emitting element having the above-described structure, the phase modulation layer optically coupled to the active layer includes the base layer and the plurality of modified refractive index regions each of which is embedded in the base layer and has a refractive index different from the refractive index of the base layer. In addition, in the unit configuration region R(x, y) constituting the virtual square lattice, the gravity center G1 of the corresponding modified refractive index region is arranged to be away from the lattice point O(x, y). Further, the direction of the vector from the lattice point O to the gravity center G1 is individually set for each of the unit configuration regions R. In such a configuration, a phase of a beam changes depending on the direction of the vector from the lattice point O to the gravity center G1 of the corresponding modified refractive index region, that is, an angular position around a lattice point of the gravity center G1 of the modified refractive index region. In this manner, it is possible to control the phase of the beam outputted from each of the modified refractive index regions only by changing a position of the gravity center of the modified refractive index region and to control a beam projection pattern (a beam group forming an optical image) formed as a whole into a desired shape according to the present embodiment. At this time, the lattice point in the virtual square lattice may be positioned outside the modified refractive index region and the lattice point may be positioned inside the modified refractive index region.

(8) As one aspect of the present embodiment, when a lattice constant of the virtual square lattice (substantially corresponding to a lattice interval) is a, it is preferable that a distance r between the gravity center G1 of the modified refractive index region positioned inside the unit configuration region R(x, y) and the lattice point O(x, y) satisfy $0 \leq r \leq 0.3a$. In addition, an original image (an optical image before two-dimensional inverse Fourier transform) serving as the beam projection pattern of light emitted from the above semiconductor light-emitting element corresponding to the plurality of phase modulation regions preferably includes at least one of a spot, a spot group consisting of three or more spots, a straight line, a cross, a line drawing, a lattice pattern, a stripe pattern, a figure, a photograph, computer graphics, and a character, for example.

Figure 41:
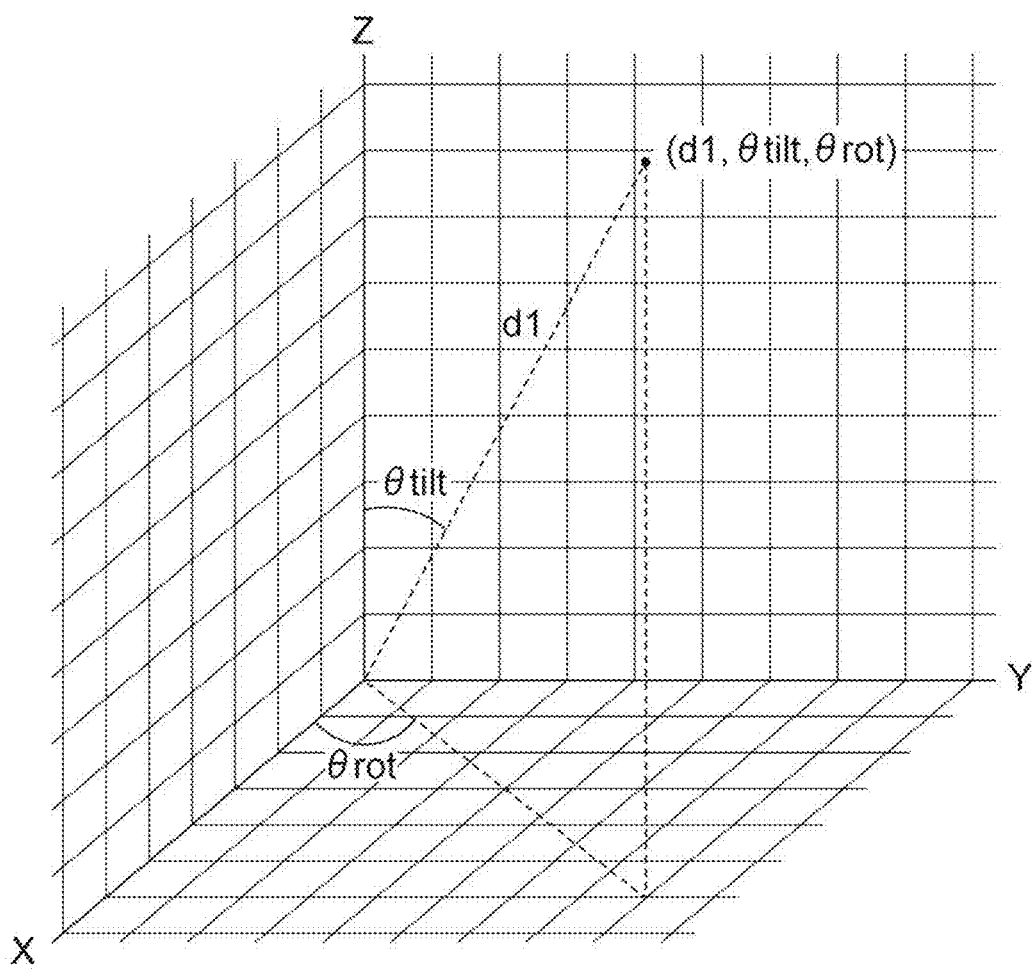
FIG. 41 is a graph for describing coordinate transformation from spherical coordinates ($d1$, $\theta_{tilt}$, $\theta_{rot}$) to coordinates (x, y, z) in an XYZ orthogonal coordinate system.

(9) In one aspect of the present embodiment, as a second precondition in addition to the first precondition, coordinates (x, y, z) in the XYZ orthogonal coordinate system are assumed to satisfy a relationship expressed by the following Formulas (1) to (3) with respect to spherical coordinates (d1, $\theta_{tilt}$, $\theta_{rot}$)) defined by a radius length d1, a tilt angle $\theta_{tilt}$ from the Z-axis, and a rotation angle $\theta_{rot}$ from the X-axis specified on the X-Y plane as illustrated in FIG. 41. Incidentally, FIG. 41 is a view for describing coordinate transformation from spherical coordinates (d1, $\theta_{tilt}$, $\theta_{rot}$) to coordinates (x, y, z) in the XYZ orthogonal coordinate system, and a designed optical image on a predetermined plane (target beam projection region) set in the XYZ orthogonal coordinate system, which is the real space, is expressed by the coordinates (x, y, z). When the target beam projection pattern corresponding to the optical image outputted from the semiconductor light-emitting element is a set of bright spots directed in directions defined by the angles $\theta_{tilt}$ and $\theta_{rot}$, the angles $\theta_{tilt}$ and $\theta_{rot}$ are converted to a coordinate value $k_x$, which is a not realized wave number defined by the following Formula (4), on a Kx-axis corresponding to the X-axis and a coordinate value $k_y$, which is a normalized wave number defined by the following Formula (5), on a Ky-axis corresponds to the Y-axis and orthogonal to the Kx-axis. The normalized wave number means a wave number normalized assuming that a wave number corresponding to the lattice interval of the virtual square lattice is 1.0. At this time, in the wave number space defined by the Kx-axis and the Ky-axis, a specific wave number range including the beam projection pattern corresponding to the optical image is constituted by M2 (an integer of one or more)×N2 (an integer of one or more) image regions FR each having a square shape. Incidentally, the integer M2 does not need to coincide with the integer M1. Likewise, the integer N2 does not need to coincide with the integer N1. In addition, Formula (4) and Formula (5) are disclosed by the above Non Patent Document 1, for example.

$$x = d1\sin\theta_{tilt}\cos\theta_{rot} \tag{1}$$

$$y = d1\sin\theta_{tilt}\sin\theta_{rot} \tag{2}$$

$$z = d1\cos\theta_{tilt} \tag{3}$$

$$k_x = \frac{a}{\lambda}\sin\theta_{tilt}\cos\theta_{rot} \tag{4}$$

$$k_y = \frac{a}{\lambda}\sin\theta_{tilt}\sin\theta_{rot} \tag{5}$$

a: Lattice constant of virtual square lattice
λ: Oscillation wavelength.

As a third precondition, in the wave number space, a complex amplitude F(x, y), which is obtained by two-dimensional inverse Fourier transform of each image region FR($k_x$, $k_y$), specified by the coordinate component $k_x$ (an integer of from 0 to M2-1) in the Kx-axis direction and the coordinate component $k_y$ (an integer of from 0 to N2-1) in the Ky-axis direction to the unit configuration region R(x, y) on the X-Y plane specified by the coordinate component x (an integer of from 1 to M1) in the X-axis direction and the coordinate component y (an integer of from 1 to N1) in the Y-axis direction, is given by the following Formula (6) with j as an imaginary unit. In addition, this complex amplitude F(x, y) is defined by the following Formula (7) when an amplitude term is A(x, y) and a phase term is P(x, y). Further, as a fourth precondition, the unit configuration region R(x, y) is defined by an s-axis and a t-axis which are parallel to the X-axis and the Y-axis, respectively, and orthogonal to each other in the lattice point O(x, y) that is the center of the unit configuration region R(x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \tag{6}$$

$$F(x, y) = A(x, y) \times \exp[jP(x, y)] \tag{7}$$

Under the first to fourth preconditions, the arrangement pattern of the modified refractive index regions in the phase modulation layer is determined by a rotation system or an on-axis shift system. Specifically, in the determination of the arrangement pattern by the rotation system, the corresponding modified refractive index region is arranged inside the unit configuration region R(x, y) so as to satisfy a relationship that an angle φ(x, y) formed by a line segment connecting the lattice point O(x, y) and the gravity center G1 of the corresponding modified refractive index region and the s-axis is φ(x,y)=C×P(x,y)+B (here, C is a proportional constant, for example, 180°/π, and
B is an arbitrary constant, for example, 0).

In the semiconductor light-emitting element having the above-described structure, the distance r between the center (lattice point) of each unit configuration region constituting the virtual square lattice and the gravity center G1 of the corresponding modified refractive index region is preferably a constant value over the entire phase modulation layer in the phase modulation layer (incidentally, a partial difference in the distance r is not excluded). As a result, when phase distribution (distribution of the phase term P(x, y) in the complex amplitude F(x, y) allocated to the unit configuration region R(x, y)) in the entire phase modulation layer is evenly distributed from zero to 2π (rad), the gravity center of the modified refractive index region coincides with the lattice point of the unit configuration region R in the square lattice on average. Therefore, a two-dimensional distributed Bragg diffraction effect in the above phase modulation layer approximates to a two-dimensional distribution Bragg diffraction effect in the case of arranging the modified refractive index region on each lattice point of the square lattice, and thus, it is easy to form a standing wave and it is possible to expect reduction in threshold current for oscillation.

(10) On the other hand, in the determination of the arrangement pattern by the on-axis shift system, the gravity center G1 of the modified refractive index region corresponding to a straight line, which passes the lattice point O(x, y) and is tilted from the s-axis, is arranged inside the unit configuration region R(x, y) under the first to fourth preconditions. At that time, the corresponding modified refractive index region is arranged inside the unit configuration region R(x, y) so as to satisfy a relationship that a line segment length r(x, y) from the lattice point O(x, y) to the gravity center G1 of the corresponding modified refractive index region is r(x,y)=C×(P(x,y)−$P_0$)

(C: a proportional constant,
$P_0$: an arbitrary constant, for example, zero).

Incidentally, the same effect as that of the above-described rotation system is achieved even when the arrangement pattern of the modified refractive index region in the phase modulation layer is determined by the on-axis shift system.

(11) As one aspect of the present embodiment, it is preferable that at least any of the shape defined on the X-Y plane, the area defined on the X-Y plane, and the distance r defined on the X-Y plane be coincident in all of the plurality of modified refractive index regions in at least one phase modulation region among the plurality of phase modulation regions. Here, the above-described "shape defined on the X-Y plane" also includes a combined shape of a plurality of elements constituting one modified refractive index region (see FIGS. 25H to 25K). Accordingly, it is possible to suppress generation of noise light and zero-order light causing noise in the beam projection region. Incidentally, the zero-order light is light that is outputted parallel to the Z-axis direction, and means light that is not phase-modulated in the phase modulation layer.

(12) As one aspect of the present embodiment, it is preferable that the shapes of the plurality of modified refractive index regions on the X-Y plane be any of a perfect circle, a square, a regular hexagon, a regular octagon, a regular hexadecagon, an equilateral triangle, a right-angled isosceles triangle, a rectangle, an ellipse, a shape in which two circles or ellipses partially overlap each other, an egg shape, a teardrop shape, an isosceles triangle, an arrow shape, a trapezoid, a pentagon, and a shape in which two rectangles partially overlap each other. Incidentally, the "egg shape" is a shape obtained by deforming an ellipse such that a dimension in a short-axis direction in the vicinity of one end portion along a long axis is smaller than a dimension in the short-axis direction in the vicinity of the other end portion as illustrated in FIGS. 22H and 38D. As illustrated in FIGS. 22D and 38E, the "teardrop shape" is a shape obtained by deforming one end portion of an ellipse along a long axis thereof into a sharp end portion protruding along a long-axis direction. The arrow shape is a shape in which one side of a rectangle forms a triangular notch and a side opposing the one side forms a triangular protrusion as illustrated in FIGS. 22E and 38G.

When the shapes of the plurality of modified refractive index regions on the X-Y plane are any of the perfect circle, the square, the regular hexagon, the regular octagon, the regular hexadecagon, the rectangle, and the ellipse, that is, when the shapes of the respective modified refractive index regions are mirror symmetric (linearly symmetric), it is possible to set the angle φ, formed between a direction from the lattice point O(x, y) of each of the plurality of unit configuration regions R forming the virtual square lattice toward the gravity center G1 of each corresponding modified refractive index region and the s-axis parallel to the X-axis, with high accuracy in the phase modulation layer. In addition, the shapes of the plurality of modified refractive index regions on the X-Y plane are any of the equilateral triangle, the right-angled isosceles triangle, the isosceles triangle, the shape in which two circles or ellipses partially overlap each other, the egg shape, the teardrop shape, the arrow shape, the trapezoid, the pentagon and the shape in which two rectangles partially overlap each other, that is, do not have the 180° rotational symmetry, it is possible to obtain a higher light output.

(13) As one aspect of the present embodiment, at least one phase modulation region among the plurality of phase modulation regions may have an inner region formed of M1×N1 unit configuration regions R and an outer region provided so as to surround an outer circumference of the inner region. Incidentally, the outer region includes a plurality of peripheral lattice-point-located modified-refractive-index-regions arranged to overlap, respectively, lattice points of an expanded square lattice, defined by setting the same lattice structure as the virtual square lattice on an outer circumference of the virtual square lattice. In this case, a leakage of light along the X-Y plane is suppressed, and an oscillation threshold current can be reduced.

(14) As one aspect of the present embodiment, at least one phase modulation region among the plurality of phase modulation regions may include a plurality of other modified refractive index regions different from the plurality of modified refractive index regions, that is, a plurality of lattice-point-located modified refractive index regions. The plurality of modified refractive index regions are arranged in each of the M1×N1 unit configuration regions R such that each gravity center G2 thereof coincides with the lattice point O of the corresponding unit configuration regions R. In this case, a shape of a combination formed by the modified refractive index region and the lattice-point-located modified refractive index region does not have the rotational symmetry of 180° as a whole. Thus, the higher light output can be obtained.

As described above, each aspect listed in [Description of Embodiment of Invention of Present Application] can be applied to each of all the remaining aspects or to all the combinations of these remaining aspects.

Details of Embodiment of Invention of Present Application

Hereinafter, specific structures of the semiconductor light-emitting element and the manufacturing method for the semiconductor light-emitting element according to the present embodiment will be described in detail with reference to the attached drawings.

Incidentally, the invention is not limited to these examples, but is illustrated by the claims, and equivalence of and any modification within the scope of the claims are intended to be included therein. In addition, the same elements in the description of the drawings will be denoted by the same reference signs, and redundant descriptions will be omitted.

First Embodiment

Figure 2:
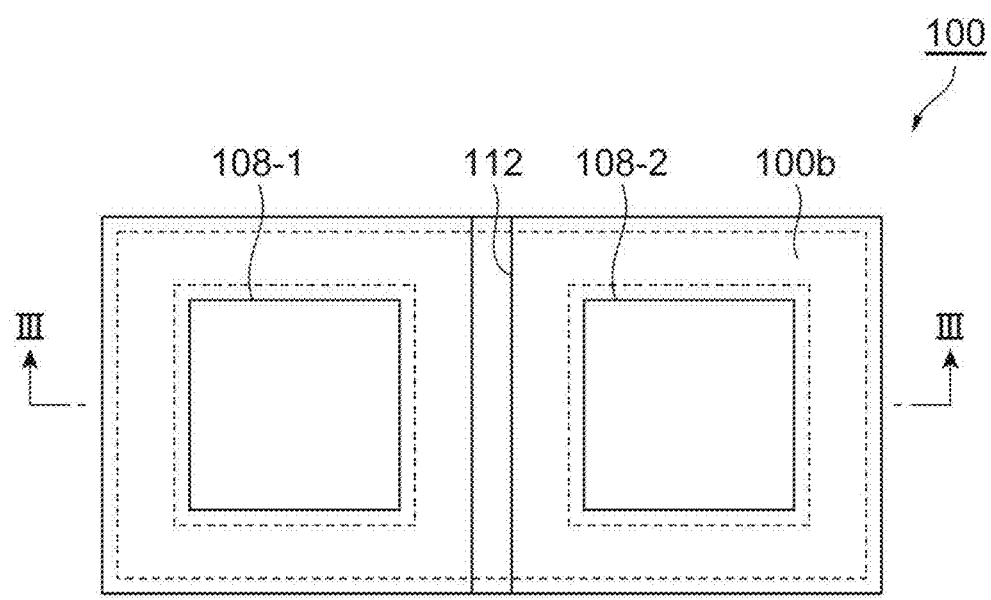
FIG. 2 is a view of the semiconductor light-emitting element according to the first embodiment as viewed from a second surface side.

A configuration of a semiconductor light-emitting element 100 according to a first embodiment will be described with reference to FIGS. 1 to 3. FIG. 1 is a view of the semiconductor light-emitting element 100 according to the first embodiment as viewed from a first surface side. FIG. 2 is a view of the semiconductor light-emitting element 100 as viewed from a second surface side, and FIG. 3 is a cross-sectional view taken along line in FIGS. 1 and 2.

Figure 3:
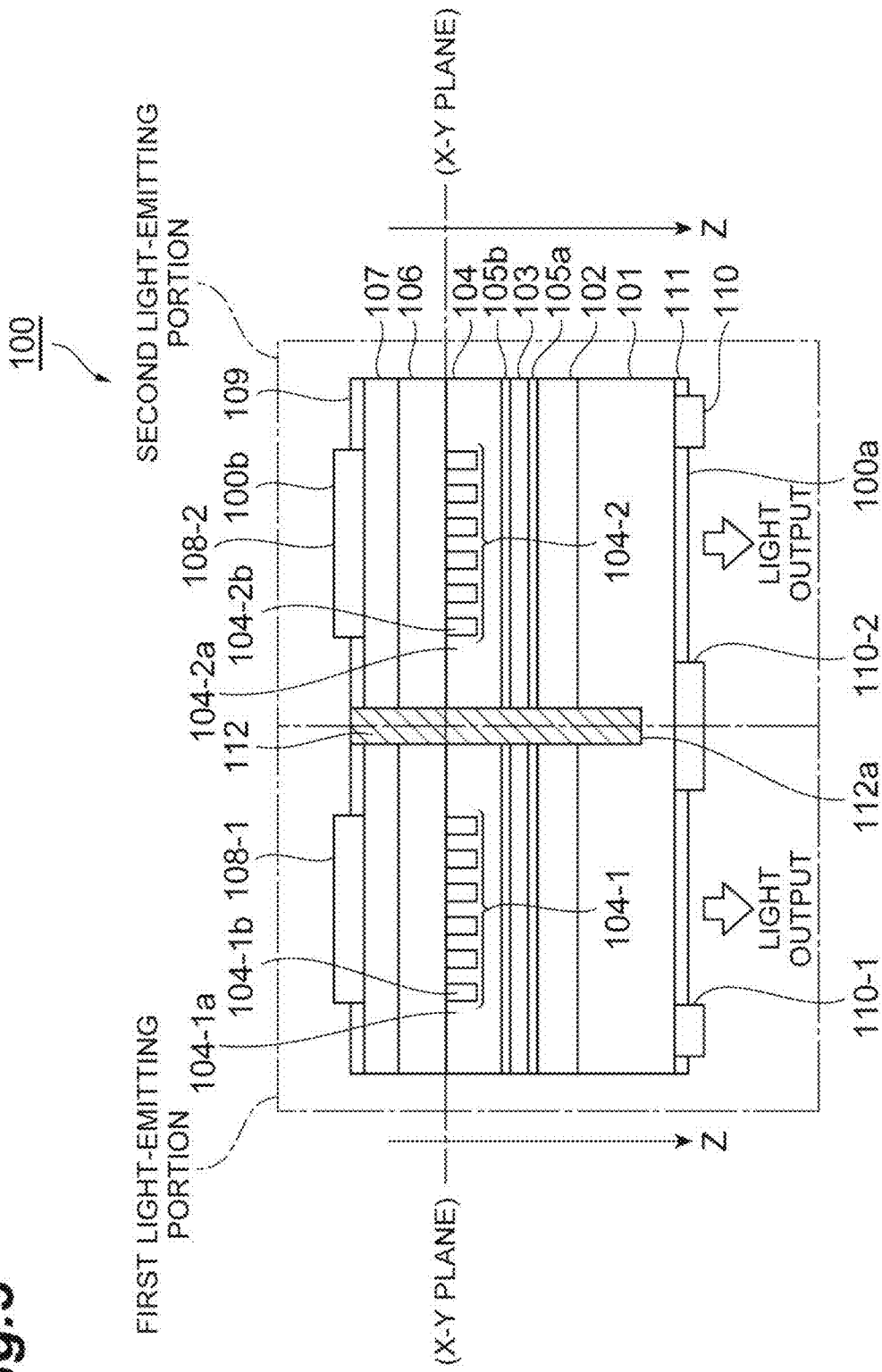
FIG. 3 is a cross-sectional view taken along line III-III of FIGS. 1 and 2.

As illustrated in FIGS. 1 to 3, the semiconductor light-emitting element 100 has a first surface 100a and a second surface 100b, and outputs light from the first surface 100a as a light emission surface. In the present embodiment, the second surface 100b functions as a support surface. The semiconductor light-emitting element 100 includes a common substrate layer 101, an active layer 103, and a phase modulation layer 104, a first cladding layer 102, a second cladding layer 106, a pair of second-surface-side electrodes 108-1 and 108-2, and a first-surface-side electrode 110. The phase modulation layer 104 includes a pair of phase modulation regions 104-1 and 104-2 optically coupled to the active layer 103. Incidentally, a stacked structure is configured using the phase modulation layer 104 including at least the active layer 103 and the pair of phase modulation regions 104-1 and 104-2. The configuration of the stacked structure is the same even in embodiments to be described later. The first cladding layer 102 is positioned on the first surface 100a side with respect to the stacked structure (including at least the active layer 103 and the phase modulation layer 104). The second cladding layer 106 is positioned on the second surface 100b side with respect to the stacked structure (including at least the active layer 103 and the phase modulation layer 104). The second-surface-side electrodes 108-1 and 108-2 are arranged on the side where the second surface 100b is arranged with respect to the second cladding layer 106 at positions corresponding to the respective phase modulation regions 104-1 and 104-2. The first-surface-side electrode 110 is positioned on the side where the first surface 100a is arranged with respect to the first cladding layer 102.

The phase modulation regions 104-1 and 104-2 include base regions 104-1a and 104-2a having a first refractive index and a plurality of modified refractive index regions 104-1b and 104-2b having a second refractive index different from the first refractive index, respectively. The plurality of modified refractive index regions 104-1b and 104-2b are arranged in the base regions 104-1a and 104-2a, respectively, according to an arrangement pattern in which each gravity center G1 is positioned at a place shifted by a predetermined distance r from each lattice point in a virtual square lattice in each of the base regions 104-1a and 104-2a. In each of the phase modulation regions 104-1 and 104-2, the arrangement pattern of the plurality of modified refractive index regions 104-1b is set such that a beam projection pattern expressed by light outputted from the first surface 100a and a beam projection region, which is a projection range of the beam projection pattern, coincide with a target beam projection pattern and a target beam projection region when a drive current is supplied from the second-surfaceside electrode 108-1 or 108-2 corresponding to the phase modulation region 104-1 or 104-2.

The beam projection region of light outputted when the drive current is supplied from the second-surface-side electrode 108-1 and the beam projection region of light outputted when the drive current is supplied from the second-surface-side electrode 108-2 may be the same or different. In addition, the beam projection pattern of light outputted when the drive current is supplied from the second-surface-side electrode 108-1 and the beam projection pattern of light outputted when the drive current is supplied from the second-surface-side electrode 108-2 may also be the same or different.

Incidentally, the "beam projection region" in the specification indicates a projection range of light outputted from the first surface or the second surface of a semiconductor light-emitting element when a drive current is supplied from one second-surface-side electrode, and the "beam projection pattern" indicates a projection pattern of light (a pattern of light intensity) within the projection range.

The active layer 103, the phase modulation layer 104, the first cladding layer 102, the second cladding layer 106, and the common substrate layer 101 are provided with a separation region 112 extending from the second surface 100*b* to the common substrate layer 101 until reaching the common substrate layer 101. The separation region 112 extends from the second surface 100*b* toward the common substrate layer 101 so as to electrically and optically separate the active layer 103, the first cladding layer 102, the second cladding layer 106, and corresponding regions in each of the first cladding layer 102 and the second cladding layers 106, which overlap the phase modulation regions 104-1 and 104-2 when viewed from the Z-axis direction (stacking direction). A thickness of a portion of the common substrate layer 101 positioned on the lower side of the separation region 112 (the shortest distance between an end surface 112*a* on the first-surface-side electrode 110 side of the separation region 112 and the first-surface-side electrode 110) is equal to or shorter than half of a thickness of the common substrate layer 101, and typically, 70 μm or shorter. As illustrated in FIG. 3, the respective portions of the semiconductor light-emitting element 100 divided at the positions of the separation region 112 can be considered as independent light-emitting portions (a first light-emitting portion and a second light-emitting portion).

As illustrated in FIGS. 1 and 3, the first-surface-side electrode 110 includes openings 110-1 and 110-2 at positions corresponding to the phase modulation regions 104-1 and 104-2 and the second-surface-side electrodes 108-1 and 108-2. The first-surface-side electrode 110 may be a transparent electrode instead of the electrode having the opening.

A vertical relationship between the active layer 103 and the phase modulation layer 104 may be opposite to a vertical relationship illustrated in FIG. 3. In addition, FIG. 3 also illustrates the common substrate layer 101, an upper light guide layer 105*b*, a lower light guide layer 105*a*, a contact layer 107, an insulating layer 109, and an anti-reflection layer 111, but the semiconductor light-emitting element 100 do not necessarily include these layers.

Although the respective layers, constituent materials, shapes, dimensions, manufacturing methods including main steps except for a step of manufacturing the separation region, and the like of the respective regions can be appropriately selected by those skilled in the art based on the contents described in Patent Document 1, some examples thereof will be illustrated hereinafter. That is, an example of the material or a structure of each layer illustrated in FIG. 3 is given as follows. The common substrate layer 101 is made of GaAs. The first cladding layer 102 is made of AlGaAs. The active layer 103 has a multiple quantum well structure MQW (a barrier layer: AlGaAs/a well layer: InGaAs). The phase modulation layer 104 includes the base regions 104-1*a* and 104-2*a* and the plurality of modified refractive index regions 104-1*b* and 104-2*b* embedded in the base regions 104-1*a* and 104-2*a*, respectively. The base regions 104-1*a* and 104-2*a* are made of GaAs. The plurality of modified refractive index regions 104-1*b* and 104-2*b* are made of AlGaAs. The upper light guide layer 105*b* and the lower light guide layer 105*a* are made of AlGaAs. The second cladding layer 106 is made of AlGaAs. The contact layer 107 is made of GaAs. The insulating layer 109 is made of $SiO_2$ or silicon nitride. The anti-reflection layer 111 is made of a dielectric single-layer film such as silicon nitride (SiN) and silicon dioxide $SiO_2$) or a dielectric multi-layer film.

In the manufacturing method according to the present embodiment, after forming the common substrate (a first step), an element body (including at least the active layer 103, the phase modulation layer 104, the first cladding layer 102, and the second cladding layer 106) is formed on the common substrate layer 101 as described above (a second step). With respect to the element body formed as described above, the separation region 112 extending from the second surface 100*b* to the common substrate layer 101 until reaching the common substrate layer 101 is formed (a third step). The separation region 112 is a semiconductor layer modified by high-intensity light (electric field), a semiconductor layer insulated by either impurity diffusion or ion implantation, or a slit (air gap) formed by either dry etching or wet etching. Here, examples of a specific method for modification with the high-intensity light (electric field) include processing with a nanosecond laser and processing with an ultrashort pulse laser. The plurality of modified refractive index regions 104-1*b* and 104-2*b* may be holes filled with argon, nitrogen, air, or the like. The separation region 112 extending from the second surface 100*b* to the common substrate layer 101 does not necessarily pass through the common substrate layer 101. However, the thickness of the portion of the common substrate layer 101 along the Z-axis direction in which the separation region 112 is formed (the shortest distance between the end surface 112*a* on the first-surface-side electrode 110 side of the separation region 112 and the first-surface-side electrode 110) is preferably equal to or shorter than half of the thickness of the common substrate layer 101 in order to reduce crosstalk between the light-emitting portions. Typically, a thickness of a portion where the separation region 112 is not formed is 70 μm or shorter. Incidentally, the manufacturing method according to the present embodiment is also applicable to manufacturing of semiconductor light-emitting elements according to second to fourth embodiments to be described later.

In one example, an N-type impurity is added to the common substrate layer 101 and the first cladding layer 102. A P-type impurity is added to the second cladding layer 106 and the contact layer 107. In addition, energy band gaps of the first cladding layer 102 and the second cladding layer 106 are larger than energy band gaps of the upper light guide layer 105*b* and the lower light guide layer 105*a*. The energy band gap of the upper light guide layer 105*b* and the lower light guide layer 105*a* are set to be larger than an energy band gap of the multiple quantum well structure MQW of the active layer 103.

Figure 4:
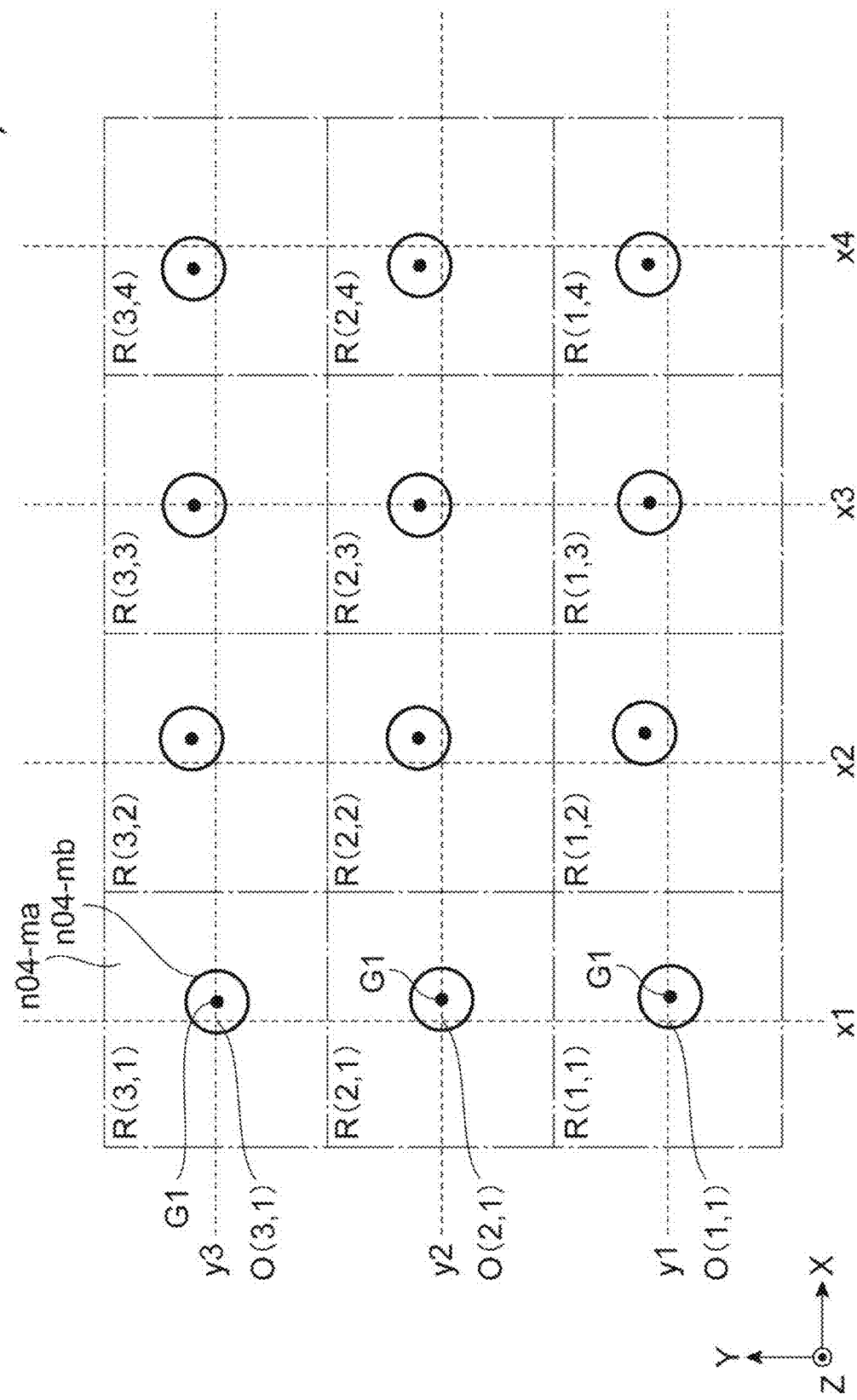
FIG. 4 is a schematic view for describing an arrangement pattern (rotation system) of a modified refractive index region in a phase modulation region.
Figure 5:
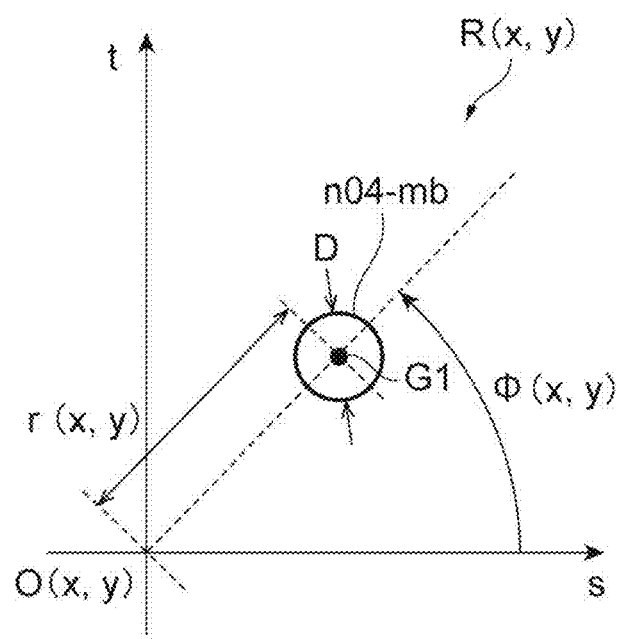
FIG. 5 is a graph for describing a positional relationship between a gravity center of the modified refractive index region and a lattice point in a virtual square lattice as an example of the arrangement pattern determined by the rotation system.

Next, the arrangement pattern of the plurality of modified refractive index regions in each of the phase modulation regions will be described with reference to FIGS. 4 and 5. FIG. 4 is a schematic view for describing the arrangement pattern of the modified refractive index region in the phase modulation region. FIG. 5 is a graph for describing a positional relationship between a gravity center G1 of the modified refractive index region and a lattice point O in a virtual square lattice. Although only twelve modified refractive index regions are illustrated in FIG. 4, in practice, a large number of modified refractive index regions are provided. In one example, 704×704 modified refractive index regions are provided. Incidentally, the arrangement pattern described herein is not an arrangement pattern peculiar to the first embodiment, and arrangement patterns of the second to fourth embodiments described later are configured in the same manner. Thus, signs representing the phase modulation region, the base region, and the plurality of modified refractive index regions, respectively, are commonized in FIG. 4 so that the phase modulation region, the base region, and the plurality of modified refractive index regions are represented by n04-m, n04-ma, and n04-mb, respectively. Incidentally, "n" is a number for distinguishment of the embodiments ("1" for the first embodiment, "2" for the second embodiment, and so on), "m" is a number for distinguishment of semiconductor light-emitting elements constituting one semiconductor light-emitting module, and both the "n" and "m" are represented by an integer of one or more.

As illustrated in FIG. 4, the phase modulation layer n04-m includes a base region n04-ma having a first refractive index, and a modified refractive index region n04-mb having a second refractive index different from the first refractive index, and the virtual square lattice defined on the X-Y plane is set in the phase modulation layer n04-m. FIG. 4 is a schematic view for describing the arrangement pattern (in the rotation system) of the modified refractive index region in the phase modulation layer. One side of the square lattice is parallel to the X-axis and the other side is parallel to the Y-axis. At this time, unit configuration regions R each of which has a square shape with a lattice point O of the square lattice as the center thereof can be set two-dimensionally over a plurality of columns along the X-axis and a plurality of rows along the Y-axis. A plurality of modified refractive index regions n04-mb is provided one by one in each of the unit configuration regions R. A planar shape of the modified refractive index region n04-mb is, for example, a circular shape. In each of the unit configuration regions R, a gravity center G1 of the modified refractive index region n04-mb is arranged away from a lattice point O closest to the gravity center G1. Specifically, the X-Y plane is a plane orthogonal to a thickness direction (Z-axis) of each of the semiconductor light-emitting elements 100-1 and 100-2 illustrated in FIG. 3, and coincides with one surface of the phase modulation layer n04-m including the modified refractive index region n04-mb. Each of the unit configuration regions R constituting the square lattice is specified by a coordinate component x (an integer of one or more) in an X-axis direction and a coordinate component y (an integer of one or more) in a Y-axis direction, and is expressed as a unit configuration region R(x, y). At this time, the center of the unit configuration region R(x, y), that is, a lattice point is represented by O(x, y). Incidentally, the lattice point O may be positioned outside the modified refractive index region n04-mb or may be included in the modified refractive index region n04-mb. Incidentally, a ratio of the area S of the modified refractive index region n04-mb occupying within one unit configuration region R is referred to as a filling factor (FF). When the lattice interval of the square lattice is a, the filling factor FF of the modified refractive index region n04-mb is given as $S/a^2$. Here, S is the area of the modified refractive index region n04-mb on the X-Y plane, and is given as $S=\pi \times (D/2)^2$ using a diameter D of a perfect circle when a shape of the modified refractive index region n04-mb is the perfect circular shape, for example. In addition, when the shape of the modified refractive index region n04-mb is a square, $S=LA^2$ is given using a length LA of one side of the square.

In FIG. 4, broken lines indicated by x1 to x4 represent central positions of the unit configuration region R in the X-axis direction, and broken lines indicated by y1 to y3 represent central positions of the unit configuration region R in the Y-axis direction. Therefore, intersections of the broken lines x1 to x4 and the broken lines y1 to y3 represent centers O(1,1) to O(3,4) of the unit configuration regions R(1,1) to R(3,4), that is, lattice points. A lattice constant of this virtual square lattice is a. Incidentally, the lattice constant a is adjusted in accordance with a light emission wavelength.

The arrangement pattern of the modified refractive index region n04-mb is determined by the method described in Patent Document 1 in accordance with the target beam projection region and the target beam projection pattern. That is, the arrangement pattern is determined by determining a direction in which the gravity center G1 of each of the modified refractive index regions n04-mb is shifted from each lattice point (each intersection between the broken lines x1 to x4 and the broken lines y1 to y3) in the virtual square lattice in the base region n04-ma depending on a phase obtained by inverse Fourier transforming the original pattern corresponding to the target beam projection region and the target beam projection pattern. As described in Patent Document 1, the distance r (see FIG. 5) shifted from each lattice point is desirably in the range of $0 < r \leq 0.3a$, where a is the lattice constant of the square lattice. Although the distance r shifted from each of the lattice points is usually the same over all the phase modulation regions and all the modified refractive index regions, the distance r in some phase modulation regions may be set to a value different from the distance r in the other phase modulation regions, or the distance r of some modified refractive index regions may be set to a value different from the distance r of the other modified refractive index regions. Incidentally, FIG. 5 is a graph for describing an example of the arrangement pattern (in the rotation system) determined by the rotation system. In FIG. 5, the configuration of the unit configuration region R(x, y) is illustrated, and the distance r from the lattice point to the modified refractive index region n04-mb is indicated by r(x, y).

As illustrated in FIG. 5, the unit configuration region R(x, y) constituting the square lattice is defined by an s-axis and a t axis orthogonal to each other at the lattice point O(x, y). Incidentally, the s-axis is an axis parallel to the X-axis, and corresponds to the broken lines x1 to x4 illustrated in FIG. 4. The t-axis is an axis parallel to the Y-axis and corresponds to the broken lines y1 to y3 illustrated in FIG. 4. In this manner, an angle formed between a direction from the lattice point O(x, y) to the gravity center G1 and the s-axis is given as $\varphi(x, y)$ in the s-t plane defining the unit configuration region R(x, y). When the rotation angle $\varphi(x, y)$ is 0°, a direction of a vector connecting the lattice point O(x, y) and the gravity center G1 coincides with a positive direction of the s-axis. In addition, a length (corresponding to the distance r) of the vector connecting the lattice point O(x, y) and the gravity center G1 is given as r(x, y).

As illustrated in FIG. 4, in the phase modulation layer n04-m, the rotation angle $\varphi(x, y)$ around the lattice point O(x, y) of the gravity center G1 of the modified refractive index region n04-mb is independently set for each of the unit configuration regions R in accordance with the target beam projection pattern (optical image). The rotation angle φ(x, y) has a specific value in the unit configuration region R(x, y), but is not necessarily expressed by a specific function. That is, the rotation angle φ(x, y) is determined based on a phase term of a complex amplitude obtained by converting the target beam projection pattern into a wave number space and performing two-dimensional inverse Fourier transform of a constant wave number range of the wave number space. Incidentally, reproducibility of the target beam projection pattern is improved by applying an iterative algorithm such as the Gerchberg-Saxton (GS) method which is generally used in hologram generation calculation at the time of obtaining complex amplitude distribution (complex amplitude of each of the unit configuration regions R) from the target beam projection pattern.

FIG. 6 is a view for describing a relationship between the target beam projection pattern (optical image) outputted from the semiconductor light-emitting element 100, and a distribution of the rotation angle φ(x,y) in the phase modulation layer n04-m. Specifically, a Kx-Ky plane, obtained by converting the target beam projection region (an installation plane of a designed optical image expressed by coordinates (x, y, z) in the XYZ orthogonal coordinate system), which is the projection range of the target beam projection pattern, onto the wave number space, is considered. A Kx-axis and a Ky-axis defining the Kx-Ky plane are orthogonal to each other, each of which is associated with an angle with respect to a normal direction when a projection direction of the target beam projection pattern is swung from the normal direction (the Z-axis direction) of the first surface 100a to the first surface 100a by the above Formulas (1) to (5). It is assumed that a specific region including the target beam projection pattern is constituted by M2 (an integer of one or more)×N2 (an integer of one or more) image regions FR each having a square shape on the Kx-Ky plane. In addition, it is assumed that the virtual square lattice set on the X-Y plane on the phase modulation layer n04-m is constituted by M1 (an integer of one or more)×N1 (an integer of one or more) unit configuration regions R. Incidentally, the integer M2 does not need to coincide with the integer M1. Likewise, the integer N2 does not need to coincide with the integer N1. At this time, a complex amplitude F(x, y) in the unit configuration region R(x, y), which is obtained by two-dimensional inverse Fourier transform of each image region FR(k$_x$, k$_y$) on the Kx-Ky plane, specified by the coordinate component k$_x$ (an integer of from 0 to M2-1) in the Kx-axis direction and the coordinate component k$_y$ (an integer of from 0 to N2-1) in the Ky-axis direction, to the unit configuration region R(x, y) specified by the coordinate component x (an integer of from 1 to M1) in the X-axis direction and the coordinate component y (an integer of from 1 to N1) in the Y-axis direction, is given by the following Formula (8) with j as an imaginary unit.

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (8)$$

In addition, when an amplitude term is A(x, y) and a phase term is P(x, y) in the unit configuration region R(x, y), the complex amplitude F(x, y) is defined by the following Formula (9).

$$F(x,y)=A(x,y)\times\exp[jP(x,y)] \quad (9)$$

As illustrated in FIG. 6, the distribution of the amplitude term A(x, y) at the complex amplitude F(x, y) of the unit configuration region R(x, y) corresponds to intensity distribution on the X-Y plane in a range of coordinate components of x=1 to M1 and y=1 to N1. In addition, the distribution of the phase term P(x, y) at the complex amplitude F(x, y) in the unit configuration region R(x, y) corresponds to phase distribution on the X-Y plane in the range of x=1 to M1 and y=1 to N1. The rotation angle φ(x, y) in the unit configuration region R(x, y) is obtained from P(x, y) as will be described later, and the distribution of the rotation angle φ(x, y) of the unit configuration region R(x, y) corresponds to rotation angle distribution on the X-Y plane in the range of coordinate components of x=1 to M1 and y=1 to N1.

Incidentally, a center Q of the beam projection pattern on the Kx-Ky plane is positioned on an axis perpendicular to the first surface 100a, and four quadrants with the center Q as the origin are illustrated in FIG. 6. Although a case where an optical image is obtained in the first quadrant and the third quadrant is illustrated in FIG. 6 as an example, it is also possible to obtain images in the second quadrant and the fourth quadrant, or in all the quadrants. In the present embodiment, a pattern point-symmetric with respect to the origin can be obtained as illustrated in FIG. 6. FIG. 6 illustrates a case where, for example, a character "A" in the third quadrant and a pattern obtained by rotating the character "A" by 180° in the first quadrant are obtained. Incidentally, rotationally-symmetric optical images (for example, a cross, a circle, a double circle, or the like) are observed as one optical image in an overlapping manner.

The beam projection pattern (optical image) outputted from the semiconductor light-emitting element 100 become optical images corresponding to the designed optical image (original image) expressed by at least one of a spot, a spot group consisting of three or more spots, a straight line, a cross, a line drawing, a lattice pattern, a photograph, a stripe pattern, computer graphics (CG), and a character. Here, the rotation angle φ(x, y) of the modified refractive index region n04-mb in the unit configuration region R(x, y) is determined by the following procedure in order to obtain the target beam projection pattern.

As described above, the gravity center G1 of the modified refractive index region n04-mb is arranged inside the unit configuration region R(x, y) in the state of being away from the lattice point O(x, y) by a value of the distance r(r(x, y). At this time, the modified refractive index region n04-mb is arranged inside the unit configuration region R(x, y) such that the rotation angle φ(x, y) satisfies the following relationship.

φ(x,y)=C×P(x,y)+B

C: a proportional constant, for example, 180°/π
B: an arbitrary constant, for example, 0

Incidentally, the proportional constant C and the arbitrary constant B are the same for all the unit configuration regions R.

That is, when it is desired to obtain the target beam projection pattern, the pattern formed on the Kx-Ky plane projected onto the wave number space may be subjected to two-dimensional inverse Fourier transform to the unit configuration region R(x, y) on the X-Y plane on the phase modulation layer n04-m and the rotation angle φ(x, y) corresponding to the phase term P(x, y) of the complex amplitude F(x, y) may be applied to the modified refractive index region n04-mb arranged inside the unit configuration region R(x, y). Incidentally, a far-field image after two-dimensional inverse Fourier transform of the laser beam can take various shapes such as a single spot shape or a plurality of spot shapes, an annular shape, a linear shape, a character shape, a double annular shape, and a Laguerre Gaussian beam shape. Incidentally, the target beam projection pattern is represented by wave number information in the wave number space (on the Kx-Ky plane), and thus, the two-dimensional inverse Fourier transform may be performed after being once converted the wave number information in the case of a bit map image or the like in which the target beam projection pattern is represented by two-dimensional position information As a method for obtaining the intensity distribution and the phase distribution from the complex amplitude distribution on the X-Y plane obtained by the two-dimensional inverse Fourier transform, for example, the intensity distribution (distribution of the amplitude term A(x, y) on the X-Y plane) can be calculated by using the abs function of numerical analysis software "MATLAB" of MathWorks, Inc., and the phase distribution (distribution of the phase terms P(x, y) on the X-Y plane) can be calculated by using the angle function of MATLAB.

As described above, if the arrangement pattern of the modified refractive index region n04-mb is determined, the light of the target beam projection region and the target beam projection pattern can be outputted from the first surface 100a of the semiconductor light-emitting element 100 to the beam projection region. The target beam projection pattern can be arbitrarily determined by a designer, and can be a spot, a spot group consisting of three or more spots, a straight line, a line drawing, a cross, a figure, a photograph, computer graphics (CG), a character, or the like. In the X-Y plane of each phase modulation region, all the modified refractive index regions n04-mb have the same figure, the same area, and/or the same distance r. In addition, the plurality of modified refractive index regions n04-mb may be formed so as to be capable of overlapping each other by a translational operation or a combination of the translational operation and a rotational operation. In this case, it is possible to suppress generation of noise light and zero-order light causing noise in the beam projection region. Here, the zero-order light is light that is outputted parallel to the Z-axis direction, and is light that is not phase-modulated in the phase modulation layer n04-m.

Figure 7B:
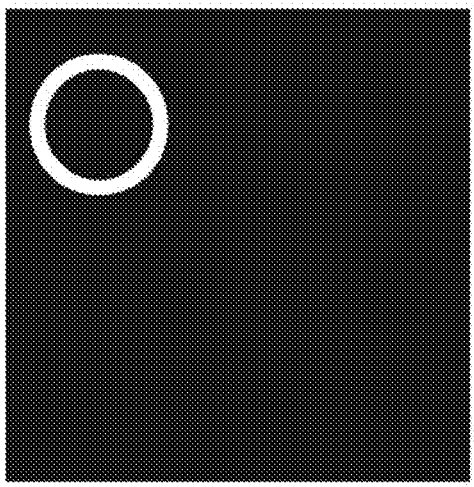
FIGS. 7A to 7D are views illustrating an example of the target beam projection pattern in the semiconductor light-emitting element according to the first embodiment and a phase distribution out of a complex amplitude distribution obtained by inverse Fourier transforming an original pattern corresponding thereto.
Figure 7A:
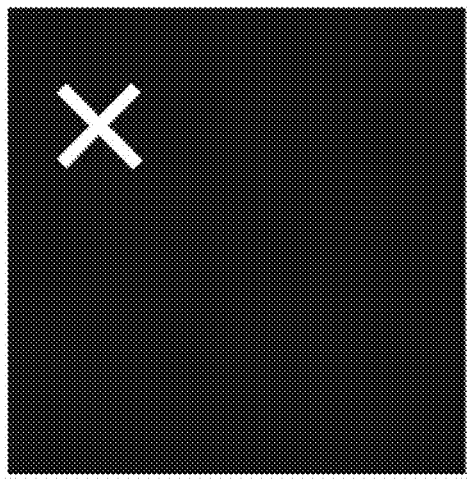
Figure 7D:
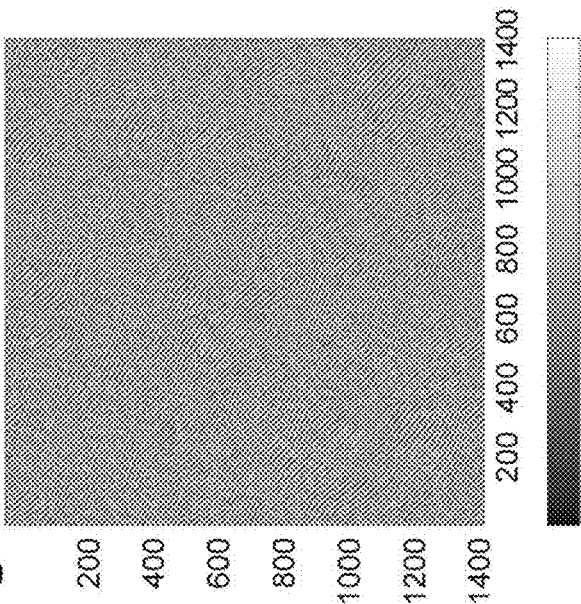
Figure 7C:
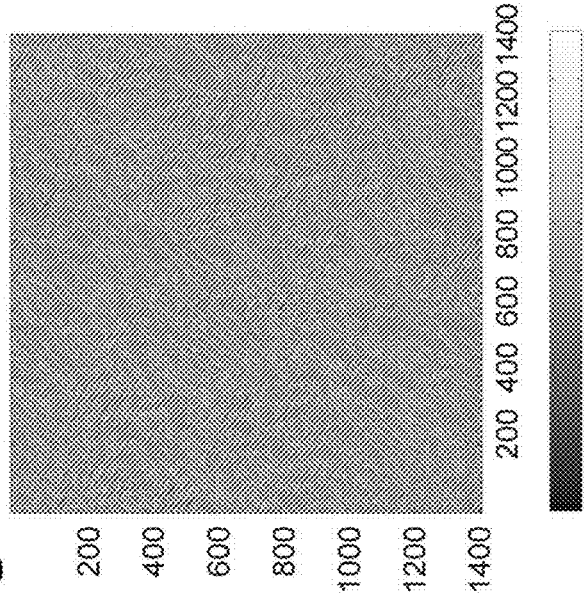

Here, FIGS. 7A to 7D illustrate an example of the target beam projection pattern and a phase distribution out of a complex amplitude distributions obtained by inverse Fourier transforming the original pattern corresponding thereto. FIG. 7A illustrates an example of the target beam projection pattern obtained when the drive current is supplied from the second-surface-side electrode 108-1, and FIG. 7B illustrates an example of the target beam projection pattern obtained when the drive current is supplied from the second-surface-side electrode 108-2. FIGS. 7C and 7D illustrate the phase distributions out of the complex amplitude distributions obtained by inverse Fourier transforming the original patterns corresponding to the respective beam projection patterns in FIGS. 7A and 7B, respectively. Each of FIGS. 7C and 7D is constituted by 704×704 elements, and a distribution of angles of 0 to $2\pi$ is represented by light and shade of color. A black part represents the angle of zero.

Next, a light emission device including the semiconductor light-emitting element 100 will be described with reference to FIG. 8. FIG. 8 is a block diagram illustrating a configuration of the light emission device including the semiconductor light-emitting element 100. As illustrated in FIG. 8, a light emission device 140 includes the semiconductor light-emitting element 100, a power supply circuit 141, a control signal input circuit 142, and a drive circuit 143. The power supply circuit 141 supplies power to the drive circuit 143 and the semiconductor light-emitting element 100. The control signal input circuit 142 transmits a control signal supplied from the outside of the light emission device 140 to the drive circuit 143. The drive circuit 143 supplies a drive current to the semiconductor light-emitting element 100. The drive circuit 143 and the semiconductor light-emitting element 100 are connected via two common drive lines 144-1 and 144-2 for supplying a drive current and one common potential line 145. The drive lines 144-1 and 144-2 are connected to the second-surface-side electrodes 108-1 and 108-2, respectively. The common potential line 145 is connected to the first-surface-side electrode 110. Incidentally, in FIG. 8, the semiconductor light-emitting element 100 illustrated above the drive circuit 143 and the semiconductor light-emitting element 100 illustrated below the drive circuit 143 represent the first surface and the second surface of the single semiconductor light-emitting element 100, respectively.

The drive lines 144-1 and 144-2 may be driven alternatively or simultaneously in accordance with an application. In addition, the drive circuit 143 may be configured separately from the semiconductor light-emitting element 100, or may be integrally formed on the common substrate layer 101 of the semiconductor light-emitting element 100.

The light emission device 140 including the semiconductor light-emitting element 100 configured as described above operates as follows. That is, a drive current is supplied from the drive circuit 143 between any of the drive lines 144-1 and 144-2 and the common potential line 145. In the light-emitting portion corresponding to the second-surface-side electrode connected to the drive line to which the drive current has been supplied, electrons and holes are recombined in the active layer 103 so that the active layer 103 in the light-emitting portion emits light. The light obtained by such light emission is efficiently confined by the first cladding layer 102 and the second cladding layer 106. The light emitted from the active layer 103 enters the inside of the corresponding phase modulation region, and a predetermined mode is formed due to a confinement effect by two-dimensional feedback by the phase modulation region. When sufficient electrons and holes are injected into the active layer, light incident on the phase modulation region oscillates in a predetermined mode. The light forming the predetermined oscillation mode is subjected to phase modulation in accordance with the arrangement pattern of the modified refractive index regions, and the light subjected to the phase modulation is emitted from the side of the first-surface-side electrode to the outside (beam projection region) as light representing the beam projection pattern in accordance with the arrangement pattern.

In the present embodiment, the semiconductor light-emitting element 100 is a single element provided with the phase modulation layer 104 including the pair of phase modulation regions 104-1 and 104-2. Thus, a process in which a plurality of semiconductor light-emitting elements are arranged on a support board is not required, which is different from a configuration in which a plurality of semiconductor light-emitting elements each including one phase modulation region (phase modulation layer) are arranged on a support board Therefore, irradiation of light of the target beam projection pattern with respect to the target beam projection region is easily realized with high accuracy according to the present embodiment.

In addition, in the present embodiment, the active layer 103, the phase modulation layer 104, the first cladding layer 102, the second cladding layer 106, and the common substrate layer 101 are provided with the separation region 112 that electrically and optically separates the corresponding regions, which overlap the phase modulation regions 104-1 and 104-2 as viewed from the Z-axis direction, from each other.

Since the adjacent phase modulation regions 104-1 and 104-2 are electrically and optically separated by the separation region 112, generation of crosstalk between the adjacent phase modulation regions 104-1 and 104-2 is suppressed. As a result, the irradiation of light of the desired beam projection pattern with respect to the desired beam projection region is realized with still higher accuracy.

In the present embodiment, the arrangement pattern in each of the phase modulation regions 104-1 and 104-2 may be set such that beam projection regions become equal even if a drive current is supplied from any of the second-surface-side electrodes 108-1 and 108-2 (however, the beam projection pattern is arbitrary). In the above configuration, various applications other than an application example of the semiconductor light-emitting element described in Patent Document 1 (the application example in which an object is scanned with a laser beam) can be implemented. For example, according to the present embodiment, it is possible to implement (a) an application to various display devices of a type in which two patterns are displayed in a switched manner in the same region of a screen, (b) an application to various kinds of illumination of a type in which one place is continuously or intermittently irradiated with the same pattern of light, and (c) an application to laser processing of a type in which one place is continuously irradiated with the same pattern of pulsed light to drill holes of a target pattern in an object.

As an example of the application (a) in the first embodiment, there is an application in which a pattern of × as illustrated in FIG. 7A and a pattern of ○ as illustrated in FIG. 7B are displayed at the same position on a screen in a switched manner according to an instruction of a user or an appropriate timing.

As an example of the application (b) in the first embodiment, both the arrangement pattern in the first phase modulation region 104-1 and the arrangement pattern in the second phase modulation region 104-2 are set such that the same beam projection region and the same beam projection pattern can be obtained. Incidentally, the beam projection pattern is set to a beam projection pattern that has uniform brightness over the whole or a part of the beam projection region, for example. There is an application in which a drive current is supplied from both the second-surface-side electrodes 108-1 and 108-2 when bright illumination is required and a drive current is supplied only from any one of the second-surface-side electrodes 108-1 and 108-2 when it is sufficient with dark illumination.

As an example of the application (c) in the first embodiment, both the arrangement pattern in the first phase modulation region 104-1 and the arrangement pattern in the second phase modulation region 104-2 are set such that the same beam projection region and the same beam projection pattern can be obtained. Incidentally, the beam projection region is aligned at a position where a hole of a workpiece is desirably drilled, and the beam projection pattern is set to a pattern of a shape of the hole shape that is desirably drilled. There is an application in which a pulsed current is alternately supplied from both the second-surface-side electrodes 108-1 and 108-2. In this case, a pulse interval of each of the light-emitting portions can be lengthened. Thus, it is possible to obtain a higher peak outputted from each of the light-emitting portions, and to obtain a larger output.

In addition, in the present embodiment, the arrangement pattern in each of the phase modulation regions 104-1 and 104-2 may be set such that beam projection patterns become equal even if a drive current is supplied from any of the second-surface-side electrodes 108-1 and 108-2 (however, the beam projection region is arbitrary). Even in the case of the above configuration, various applications other than an application example of the semiconductor light-emitting element described in Patent Document 1 (the application example in which an object is scanned with a laser beam) can be implemented. For example, an application to illumination of a type in which two places are irradiated at an appropriate timing can be also implemented in addition to the applications (a) to (c) described above.

Second Embodiment

The second embodiment is an embodiment in which three or more pairs of phase modulation regions and second-surface-side electrodes each of which is provided in two (a pair) in the first embodiment, are one-dimensionally arranged. In other words, the second embodiment is an embodiment in which the number of light-emitting portions, which is two in the first embodiment, is increased to three or more, and the light-emitting portions are arranged one-dimensionally, and configurations other than such a changed point are the same as those of the first embodiment.

Figure 9:
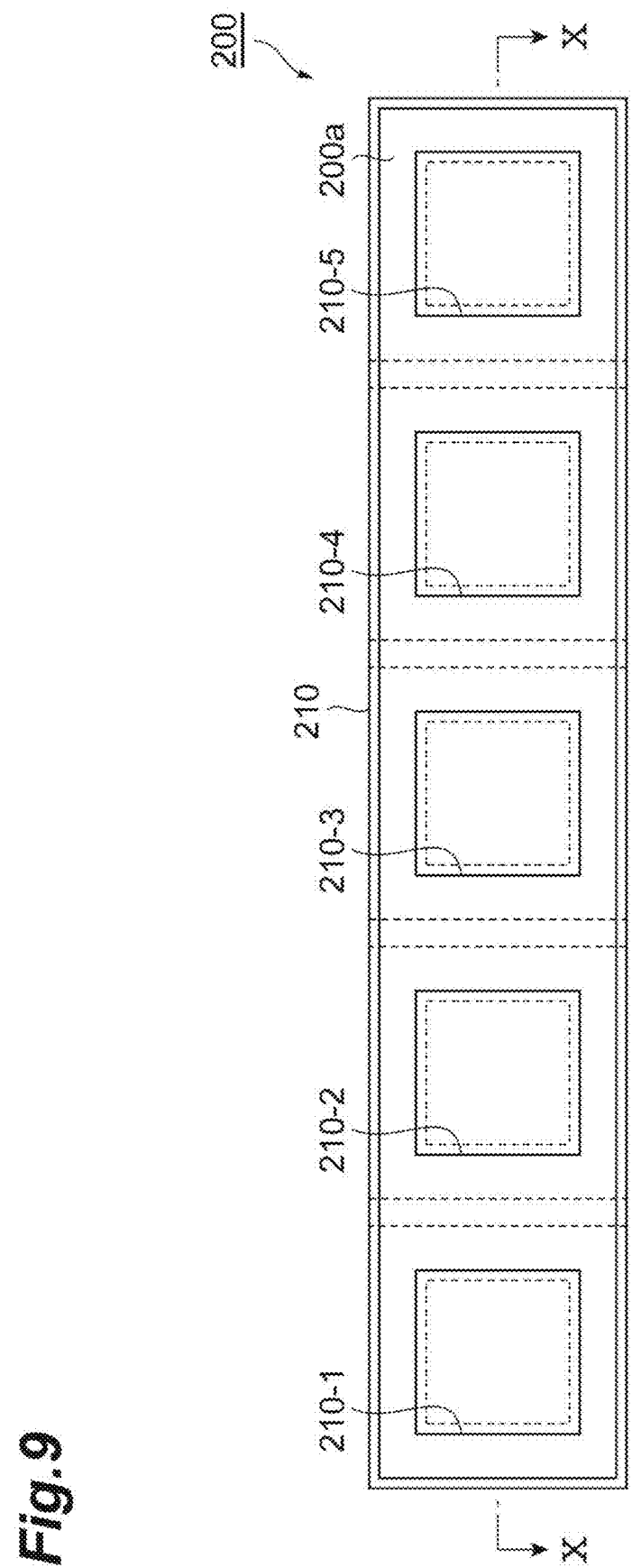
FIG. 9 is a view of the semiconductor light-emitting element according to a second embodiment as viewed from a first surface side.
Figure 10:
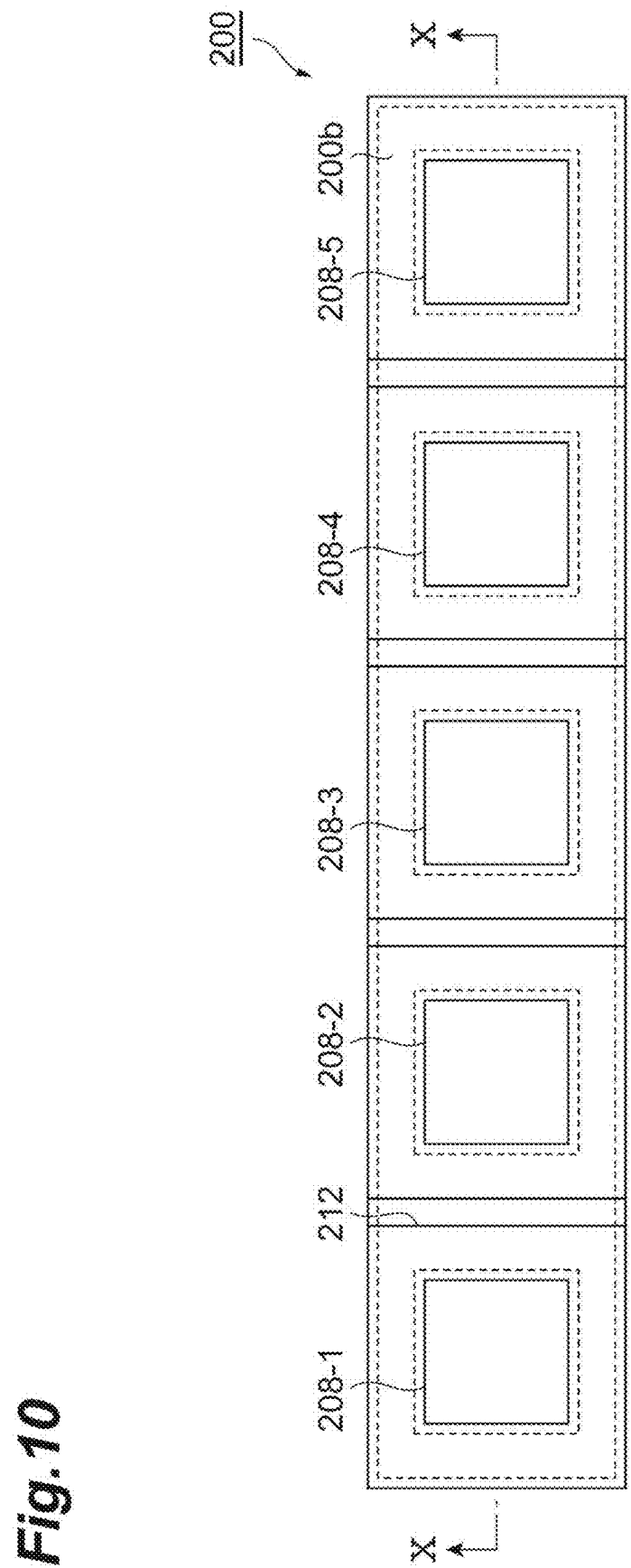
FIG. 10 is a view of the semiconductor light-emitting element according to the second embodiment as viewed from a second surface side.
Figure 11:
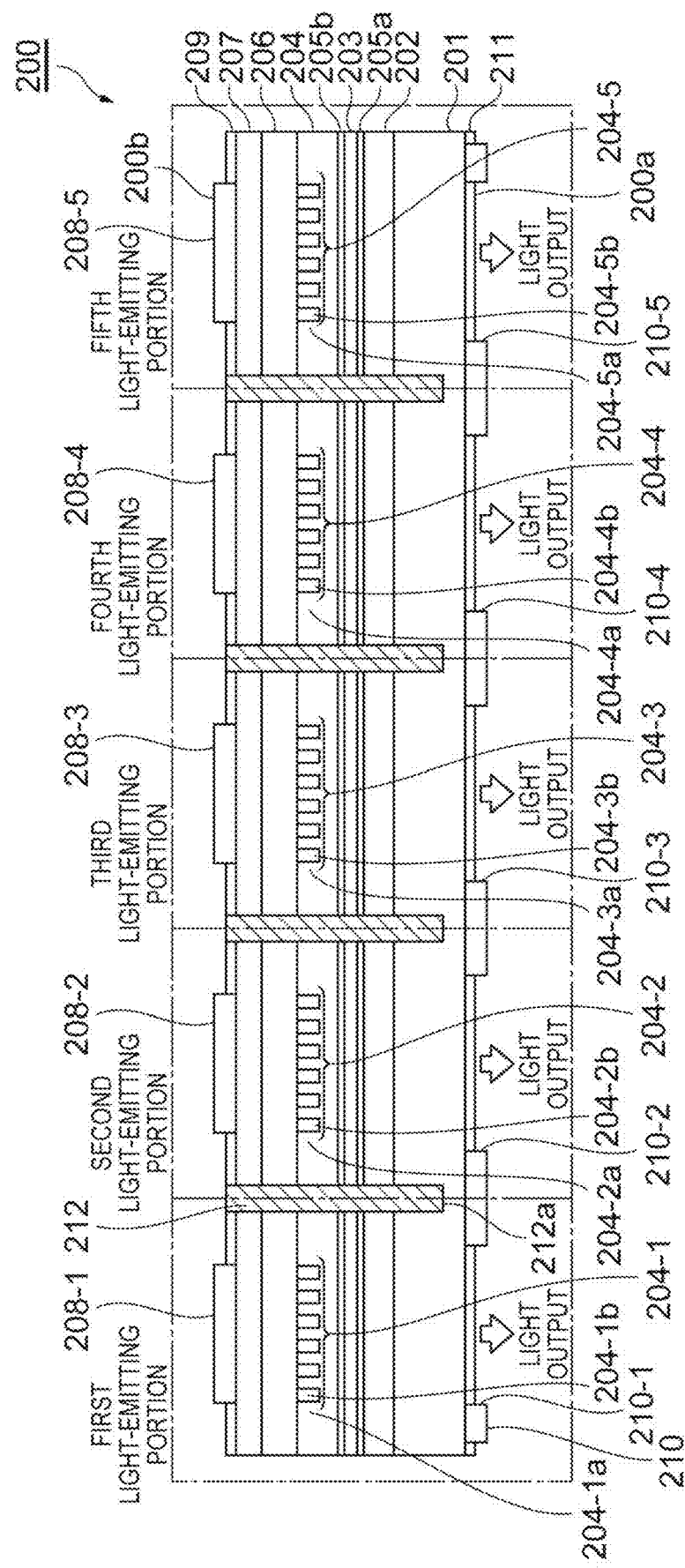
FIG. 11 is a cross-sectional view taken along line X-X in FIGS. 9 and 10.

A configuration of a semiconductor light-emitting element 200 according to the second embodiment will be described with reference to FIGS. 9 to 11. FIG. 9 is a view of the semiconductor light-emitting element 200 according to the second embodiment as viewed from a first surface side. FIG. 10 is a view of the semiconductor light-emitting element 200 as viewed from a second surface side. FIG. 11 is a cross-sectional view taken along line XX in FIGS. 9 and 10. Although FIGS. 9 to 11 illustrate an example in which five light-emitting portions (first to fifth light-emitting portions) are arranged on a straight line, the number of the light-emitting portions may be other than five, and such a one-dimensional arrangement may be performed on a curve.

As illustrated in FIGS. 9 to 11, the semiconductor light-emitting element 200 has a first surface 200a and a second surface 200b, and outputs light from the first surface 200a as a light emission surface. In the present embodiment, the second surface 200b functions as a support surface. The semiconductor light-emitting element 200 includes a common substrate layer 201, an active layer 203, a phase modulation layer 204, a first cladding layer 202, a second cladding layer 206, a plurality of second-surface-side electrodes 208-1 to 208-5, and a first-surface-side electrode 210. The phase modulation layer 204 includes a plurality of phase modulation regions 204-1 to 204-5 optically coupled to the active layer 203. Incidentally, a stacked structure is configured using the phase modulation layer 204 including at least the active layer 203 and the plurality of phase modulation regions 204-1 to 204-5. The first cladding layer 202 is positioned on the side where the first surface 200a is arranged with respect to the stacked structure (including at least the active layer 203 and the phase modulation layer 204). The second cladding layer 206 is positioned on the side where the second surface 200b is arranged with respect to the stacked structure (including at least the active layer 203 and the phase modulation layer 204). The second-surface-side electrodes 208-1 to 208-5 are arranged on the side where the second surface 200b is arranged with respect to the second cladding layer 206 at positions corresponding to the respective phase modulation regions 204-1 to 204-5. The first-surface-side electrode 210 is positioned on the side where the first surface 200a is arranged with respect to the first cladding layer 202.

The phase modulation regions 204-1 to 204-5 include base regions 204-1a to 204-5a having a first refractive index and a plurality of modified refractive index regions 204-1b to 204-5b having a second refractive index different from the first refractive index, respectively. The plurality of modified refractive index regions 204-1b to 204-5b are arranged in the base regions 204-1a to 204-5a, respectively, according to an arrangement pattern in which each gravity center G1 is positioned at a place shifted by a predetermined distance r from each lattice point O in a virtual square lattice in each of the base regions 204-1a to 204-5a. An arrangement pattern of the modified refractive index regions 204-1b to 204-5b in each of the phase modulation regions 204-1 to 204-5 is set such that a beam projection pattern expressed by light outputted from the first surface 200a and a beam projection region, which is a projection range of the beam projection pattern, become a target beam projection pattern and a target beam projection region when a drive current is supplied from each of the second-surface-side electrodes 208-1 to 208-5 corresponding to each of the phase modulation regions 204-1 to 204-5.

The beam projection regions of light outputted when the drive current is supplied from the second-surface-side electrodes 208-1 to 208-5 may be all the same, or at least some thereof may be different from the others. In addition, the beam projection patterns of light outputted when the drive current is supplied from the second-surface-side electrodes 208-1 to 208-5 may be also all the same, or at least some thereof may be different from the others.

The active layer 203, the phase modulation layer 204, the first cladding layer 202, the second cladding layer 206, and the common substrate layer 201 are provided with a separation region 212 extending from the second surface 200b to the common substrate layer 201 until reaching the common substrate layer 201. The separation region 212 extends from the second surface 200b toward the common substrate layer 201 so as to electrically and optically separate the active layer 203, the first cladding layer 202, the second cladding layer 206, and corresponding regions in each of the first cladding layer 202 and the second cladding layers 206, which overlap the phase modulation regions 204-1 to 204-5 when viewed from the Z-axis direction (stacking direction). A thickness of a portion of the common substrate layer 201 positioned in the lower part of the separation region 212 (the shortest distance between an end surface 212a on the first-surface-side electrode 210 side of the separation region 212 and the first-surface-side electrode 210) is equal to or shorter than half of a thickness of the common substrate layer 201 along the Z-axis direction, and typically, 70 μm or shorter. As illustrated in FIG. 11, the respective portions of the semiconductor light-emitting element 200 divided at the positions of the separation region 212 can be considered as independent light-emitting portions (the first light-emitting portion to the fifth light-emitting portion). In addition, a step of manufacturing the separation region 212 is the same as that of the first embodiment.

As illustrated in FIGS. 9 and 11, the first-surface-side electrode 210 includes openings 210-1 to 210-5 at positions corresponding to the phase modulation regions 204-1 to 204-5 and the second-surface-side electrodes 208-1 to 208-5. The first-surface-side electrode 210 may be a transparent electrode instead of the electrode having the opening.

A vertical relationship between the active layer 203 and the phase modulation layer 204 may be opposite to a vertical relationship illustrated in FIG. 11. In addition, FIG. 11 also illustrates the common substrate layer 201, an upper light guide layer 205b, a lower light guide layer 205a, a contact layer 207, an insulating layer 209, and an anti-reflection layer 211, but the semiconductor light-emitting element 200 do not necessarily include these layers.

Although the respective layers, constituent materials, shapes, dimensions, manufacturing methods including main steps except for a step of manufacturing the separation region, and the like of the respective regions can be appropriately selected by those skilled in the art based on the contents described in Patent Document 1 similarly to the first embodiment, some examples thereof will be illustrated hereinafter. That is, an example of the material or a structure of each layer illustrated in FIG. 11 is given as follows. The common substrate layer 201 is made of GaAs. The first cladding layer 202 is made of AlGaAs. The active layer 203 has a multiple quantum well structure MQW (a barrier layer: AlGaAs/a well layer: InGaAs). The phase modulation layer 204 includes the base regions 204-1a to 204-5a and the plurality of modified refractive index regions 204-1b to 204-5b embedded in the base regions 204-1a to 204-5a, respectively. The base regions 204-1a to 204-5a are made of GaAs. The plurality of modified refractive index regions 204-1b to 204-5b are made of AlGaAs. The upper light guide layer 205b and the lower light guide layer 205a are made of AlGaAs. The second cladding layer 206 is made of AlGaAs. The contact layer 207 is made of GaAs. The insulating layer 209 is made of $SiO_2$ or silicon nitride. The anti-reflection layer 211 is made of a dielectric single-layer film such as silicon nitride (SiN) and silicon dioxide $SiO_2$) or a dielectric multi-layer film. The separation region 212 is a semiconductor layer modified by high-intensity light (electric field), a semiconductor layer insulated by either impurity diffusion or ion implantation, or a slit (air gap) formed by either dry etching or wet etching. Here, examples of a specific method for modification with the high-intensity light (electric field) include processing with a nanosecond laser and processing with an ultrashort pulse laser. The plurality of modified refractive index regions 204-1b to 204-5b may be holes filled with argon, nitrogen, air, or the like.

In one example, an N-type impurity is added to the common substrate layer 201 and the first cladding layer 202. A P-type impurity is added to the second cladding layer 206 and the contact layer 207. In addition, energy band gaps of the first cladding layer 202 and the second cladding layer 206 are larger than energy band gaps of the upper light guide layer 205b and the lower light guide layer 205a. The energy band gap of the upper light guide layer 205b and the lower light guide layer 205a are set to be larger than an energy band gap of the multiple quantum well structure MQW of the active layer 203.

Figure 12A:
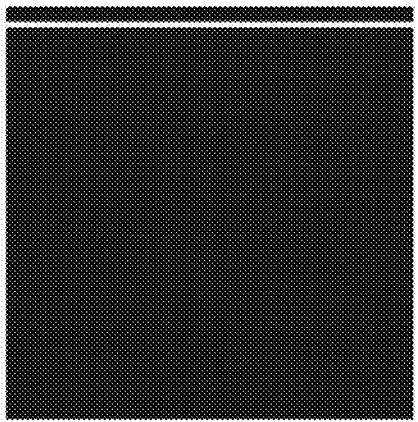
FIGS. 12A to 12F are views illustrating an example of a target beam projection pattern in the semiconductor light-emitting elements according to the second embodiment and a third embodiment and a phase distribution out of a complex amplitude distribution obtained by inverse Fourier transforming an original pattern corresponding thereto.
Figure 12B:
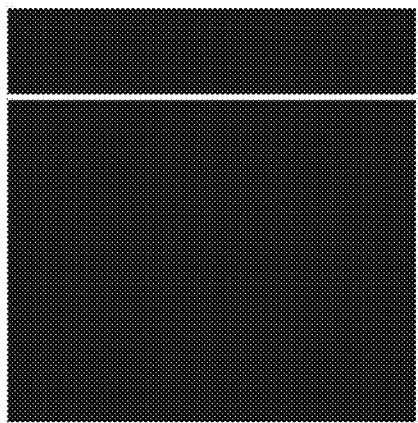
Figure 12C:
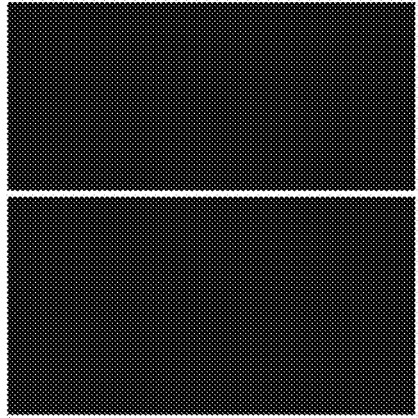
Figure 12D:
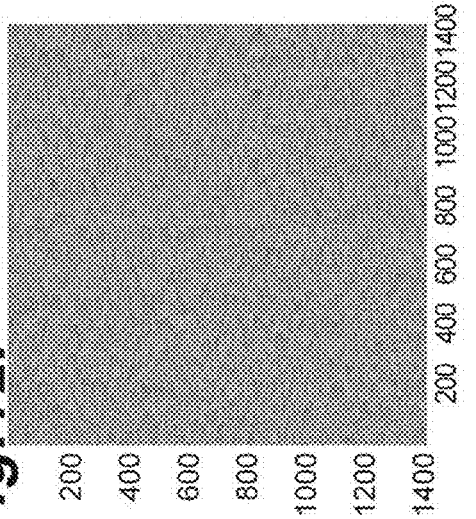
Figure 12E:
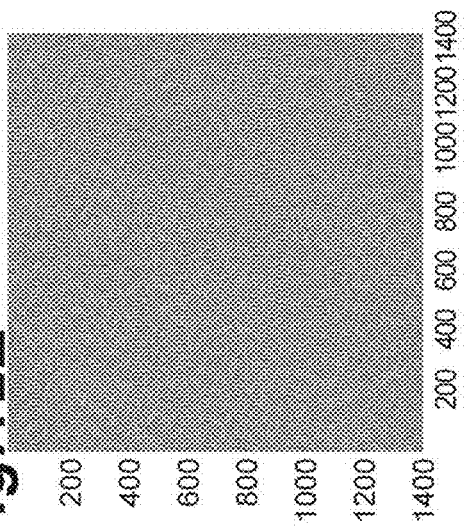
Figure 12F:
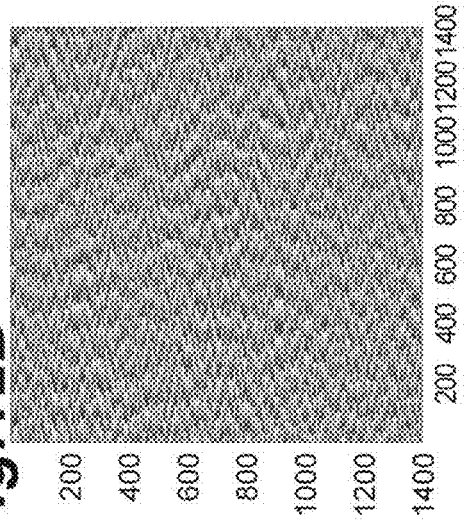
Figure 13A:
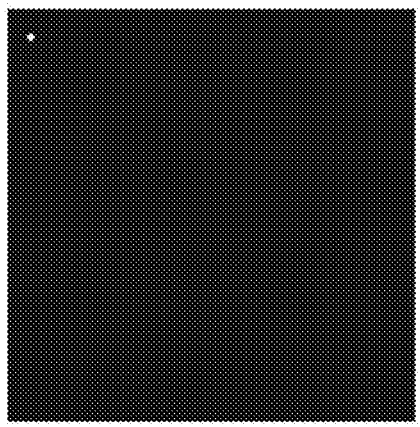
FIGS. 13A to 13F are views illustrating an example of the target beam projection pattern in the semiconductor light-emitting element according to the second and third embodiments, different from that of FIGS. 12A to 12F, and a phase distribution out of a complex amplitude distribution obtained by inverse Fourier transforming an original pattern corresponding thereto.
Figure 13B:
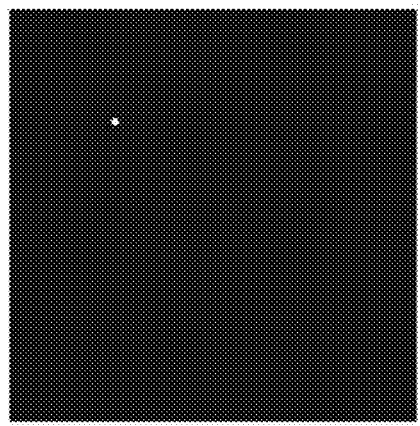
Figure 13C:
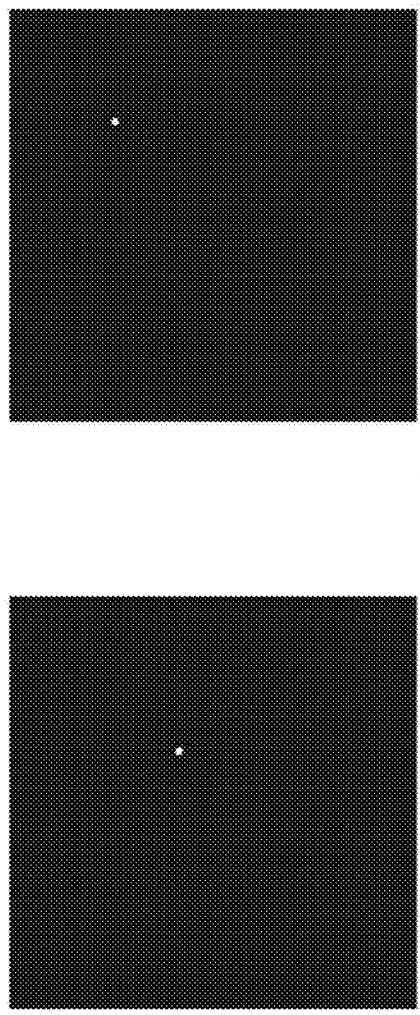
Figure 13D:
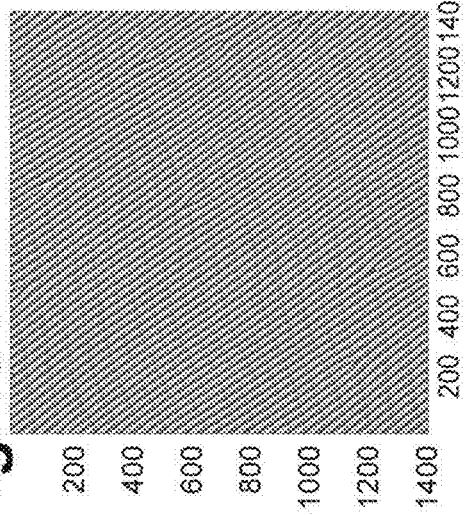
Figure 13E:
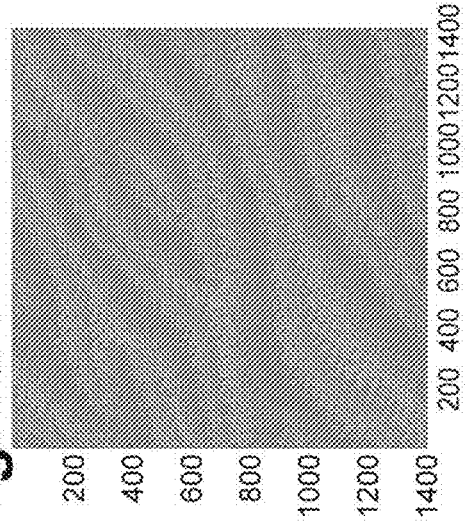
Figure 13F:
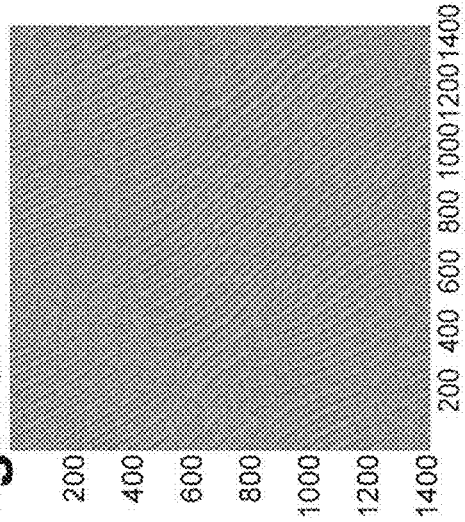

Here, in FIGS. 12A to 12F and 13A to 13F illustrate examples of the target beam projection pattern and a phase distribution out of a complex amplitude distributions obtained by inverse Fourier transforming the original pattern corresponding thereto according to the present embodiment and a third embodiment to be described later. FIGS. 12A to 12C illustrate examples of the target beam projection patterns obtained when a drive current is supplied from the second-surface-side electrodes of the first light-emitting portion, the third light-emitting portion, and the fifth light-emitting portion, respectively. FIGS. 12D to 12F illustrate the phase distributions out of the complex amplitude distributions obtained by inverse Fourier transforming the original patterns corresponding to the respective beam projection patterns in FIGS. 12A to 12C, respectively. FIGS. 13A to 13C illustrate other examples of the target beam projection patterns obtained when a drive current is supplied from the second-surface-side electrodes of the first light-emitting portion, the third light-emitting portion, and the fifth light-emitting portion, respectively. FIGS. 13D to 13F illustrate the phase distributions out of the complex amplitude distributions obtained by inverse Fourier transforming the original patterns corresponding to the respective beam projection patterns in FIGS. 13A to 13C, respectively. Each of FIGS. 12D to 12F and FIGS. 13D to 13F is constituted by 704×704 elements, and a distribution of angles of 0 to $2\pi$ is represented by light and shade of color. A black part represents the angle of zero.

Figure 14:
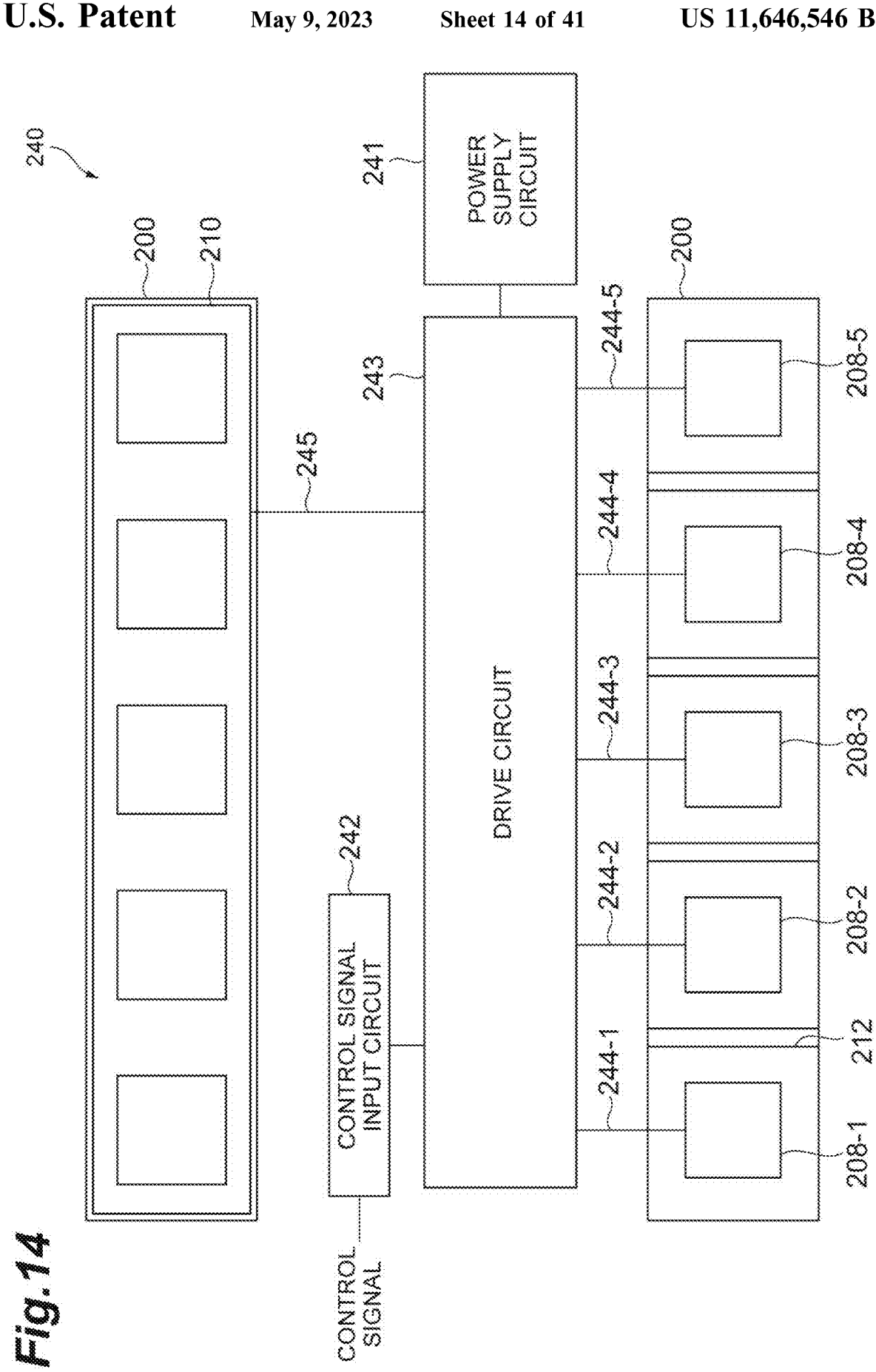
FIG. 14 is a block diagram illustrating a configuration of a light emission device including the semiconductor light-emitting element according to the second embodiment.

Next, a configuration of a light emission device including the semiconductor light-emitting element 200 will be described with reference to FIG. 14. FIG. 14 is a block diagram illustrating a configuration of the light emission device including the semiconductor light-emitting element 200. As illustrated in FIG. 14, a light emission device 240 includes the semiconductor light-emitting element 200, a power supply circuit 241, a control signal input circuit 242, and a drive circuit 243. The power supply circuit 241 supplies power to the drive circuit 243 and the semiconductor light-emitting element 200. The control signal input circuit 242 transmits a control signal supplied from the outside of the light emission device 240 to the drive circuit 243. The drive circuit 243 supplies a drive current to the semiconductor light-emitting element 200. The drive circuit 243 and the semiconductor light-emitting element 200 are connected via a plurality of drive lines 244-1 to 244-5 for supplying a drive current and a single common potential line 245. The drive lines 244-1 to 244-5 are connected to the second-surface-side electrodes 208-1 to 208-5, respectively. The common potential line 245 is connected to the first-surface-side electrode 210. Incidentally, in FIG. 14, the semiconductor light-emitting element 200 illustrated above the drive circuit 243 and the semiconductor light-emitting element 200 illustrated below the drive circuit 243 represent the first surface and the second surface of the single semiconductor light-emitting element 200, respectively.

The drive lines 244-1 to 244-5 may be alternatively driven in accordance with an application, or at least two thereof may be simultaneously driven. In addition, the drive circuit 243 may be configured separately from the semiconductor light-emitting element 200, or may be integrally formed on the common substrate layer 201 of the semiconductor light-emitting element 200.

The light emission device 240 including the semiconductor light-emitting element 200 configured as described above operates as follows. That is, a drive current is supplied from the drive circuit 243 between any one of the drive lines 244-1 to 244-5 and the common potential line 245. In the light-emitting portion corresponding to the second-surface-side electrode connected to the drive line to which the drive current has been supplied, electrons and holes are recombined in the active layer 203 so that the active layer 203 in the light-emitting portion emits light. The light obtained by such light emission is efficiently confined by the first cladding layer 202 and the second cladding layer 206. The light emitted from the active layer 203 enters the inside of the corresponding phase modulation region, and a predetermined mode is formed due to a confinement effect by two-dimensional feedback by the phase modulation region. When sufficient electrons and holes are injected into the active layer, light incident on the phase modulation region oscillates in a predetermined mode. The light forming the predetermined oscillation mode is subjected to phase modulation in accordance with the arrangement pattern of the modified refractive index regions, and the light subjected to the phase modulation is emitted from the side of the first-surface-side electrode to the outside (beam projection region) as light representing the beam projection pattern in accordance with the arrangement pattern.

Even in the present embodiment, the semiconductor light-emitting element 200 is a single element provided with the phase modulation layer 204 including the plurality of phase modulation regions 204-1 to 204-5. Thus, a process in which a plurality of semiconductor light-emitting elements are arranged on a support board is not required, which is different from a configuration in which a plurality of semiconductor light-emitting elements each including one phase modulation region (phase modulation layer) are arranged on a support board Thus, the irradiation of light of the target beam projection pattern with respect to the target beam projection region is realized easily with high accuracy.

In addition, the active layer 203, the phase modulation layer 204, the first cladding layer 202, the second cladding layer 206, and the common substrate layer 201 are also provided with the separation region 212 extending from the second surface 200b to the common substrate layer 201 until reaching the common substrate layer 201 in the present embodiment. Since the phase modulation regions 204-1 to 204-5 adjacent to each other are electrically and optically separated by the separation region 212, generation of crosstalk between the phase modulation regions 204-1 to 204-5 adjacent to each other is suppressed. As a result, the irradiation of light of the desired beam projection pattern with respect to the desired beam projection region is realized with still higher accuracy.

In addition, the arrangement pattern in each of the phase modulation regions 204-1 to 204-5 may be also set such that beam projection regions become equal even if a drive current is supplied from any of the second-surface-side electrodes 208-1 to 208-5 in the present embodiment (however, the beam projection pattern is arbitrary). In the case of the above configuration, various applications other than an application example of the semiconductor light-emitting element described in Patent Document 1 (the application example in which an object is scanned with a laser beam) can be implemented. For example, according to the present embodiment, it is possible to implement (a) an application to various display devices of a type in which three or more patterns are displayed in a switched manner in the same region of a screen, (b) an application to various kinds of illumination of a type in which one place is continuously or intermittently irradiated with the same pattern of light, and (c) an application to laser processing of a type in which one place is continuously irradiated with the same pattern of pulsed light to drill holes of a target pattern in an object.

Examples of the application (a) in the second embodiment include an application in which not only the pattern of × as illustrated in FIG. 7A and the pattern of ○ as illustrated in FIG. 7B but also other patterns such as ρ and □ are displayed at the same position on a screen in a switched manner according to an instruction of a user or an appropriate timing, an application in which slightly different patterns as illustrated in FIGS. 12A to 12F and 13A to 13F are continuously displayed in a switched manner to display an animation in one region, and the like.

As an example of the application (b) in the second embodiment, there is an application in which the illumination illustrated as the application (b) in the first embodiment is changed to be switchable in multiple steps.

As an example of the application (c) in the third embodiment, there is an application in which the laser processing illustrated as the application (c) in the first embodiment is changed to sequential pulse-driving of a plurality of second-surface-side electrodes. In this case, a pulse interval of each light-emitting portion can be extended, and thus, it is possible to obtain higher peak outputted from each light-emitting portion, and it is possible to obtain a larger output.

In addition, the arrangement pattern in each of the phase modulation regions 204-1 to 204-5 may be also set such that beam projection patterns become equal even if a drive current is supplied from any of the second-surface-side electrodes 208-1 to 208-5 in the present embodiment (however, the beam projection region is arbitrary). In the case of the above configuration, various applications other than the application example of the semiconductor light-emitting element described in Patent Document 1 (the application example in which the object is scanned with the laser beam) can be implemented, but also various applications other than the above application example can be implemented. The applications different from the application example illustrated in Patent Document 1 can also include an application to illumination of a type in which an arbitrary place is irradiated at a desired timing in addition to the application (a) to application (c) described above.

Third Embodiment

The third embodiment is an embodiment in which the one-dimensional arrangement of the phase modulation regions and the second-surface-side electrodes in the second embodiment is changed to a two-dimensional arrangement. In other words, this third embodiment is the embodiment in which the one-dimensional arrangement of the plurality of light-emitting portions as in the second embodiment is changed to the two-dimensional arrangement, and configurations other than such a changed point are the same as those of the second embodiment.

Figure 15:
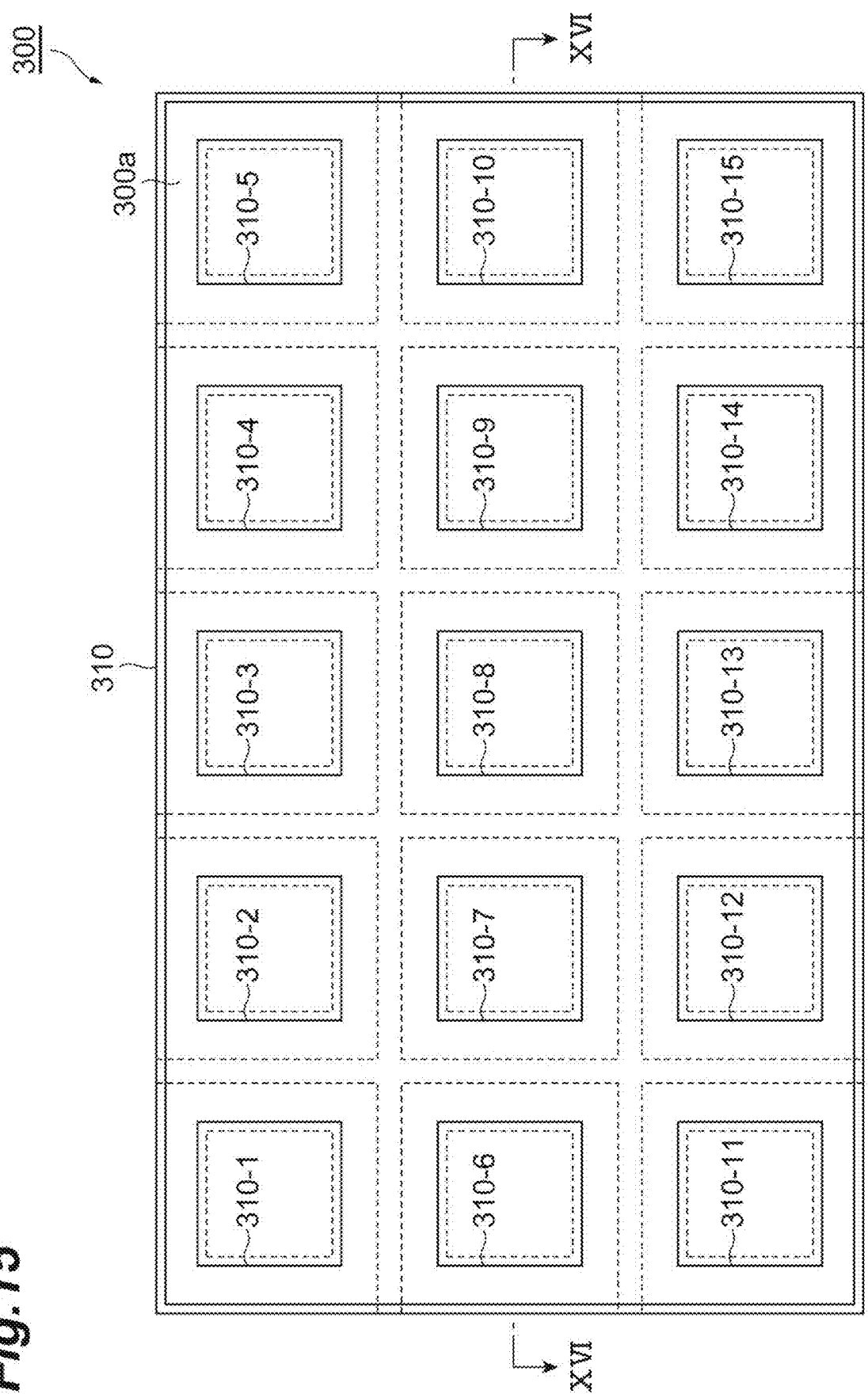
FIG. 15 is a view of the semiconductor light-emitting element according to the third embodiment as viewed from a first surface side.
Figure 16:
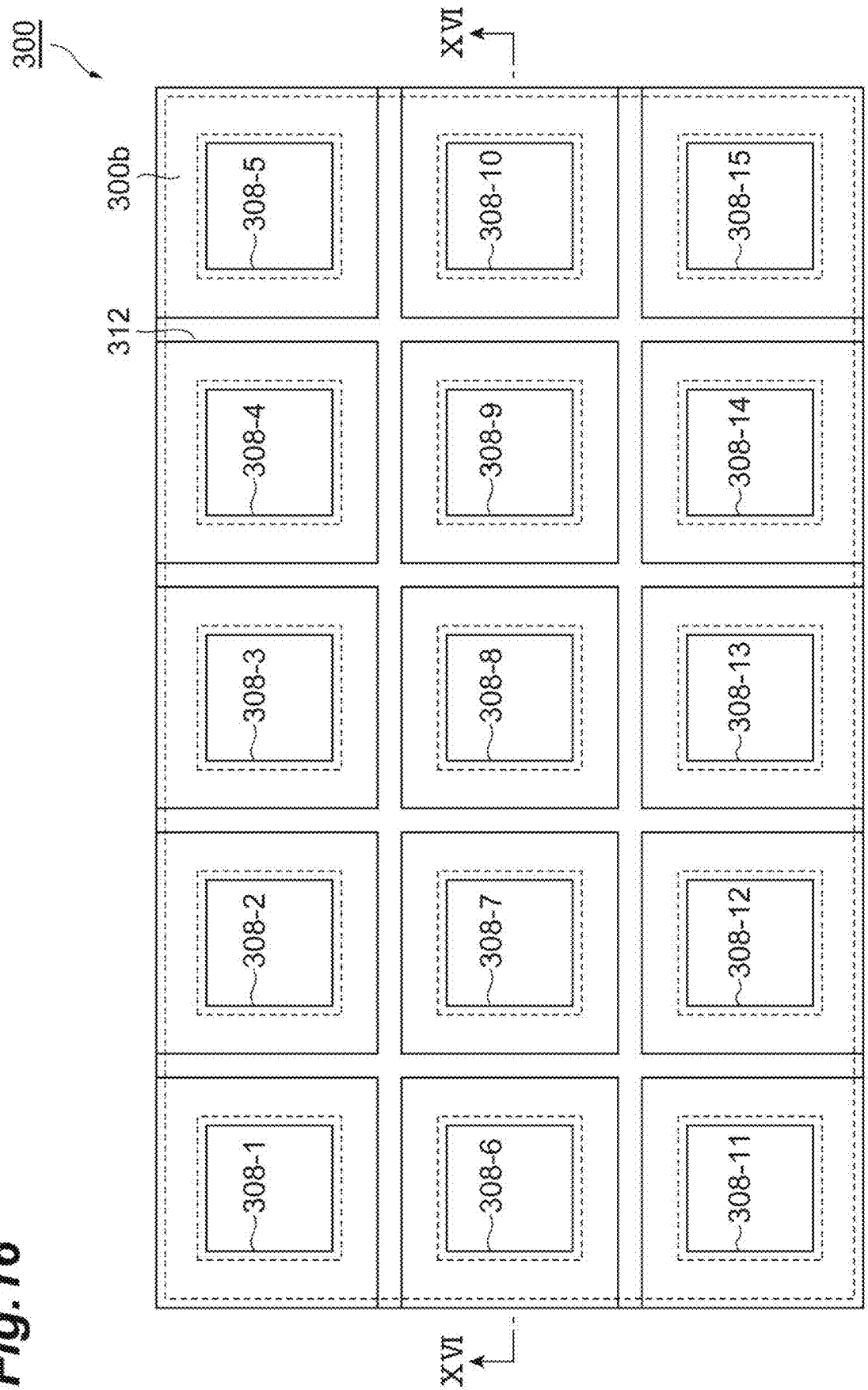
FIG. 16 is a view of the semiconductor light-emitting element according to the third embodiment as viewed from a second surface side.
Figure 17:
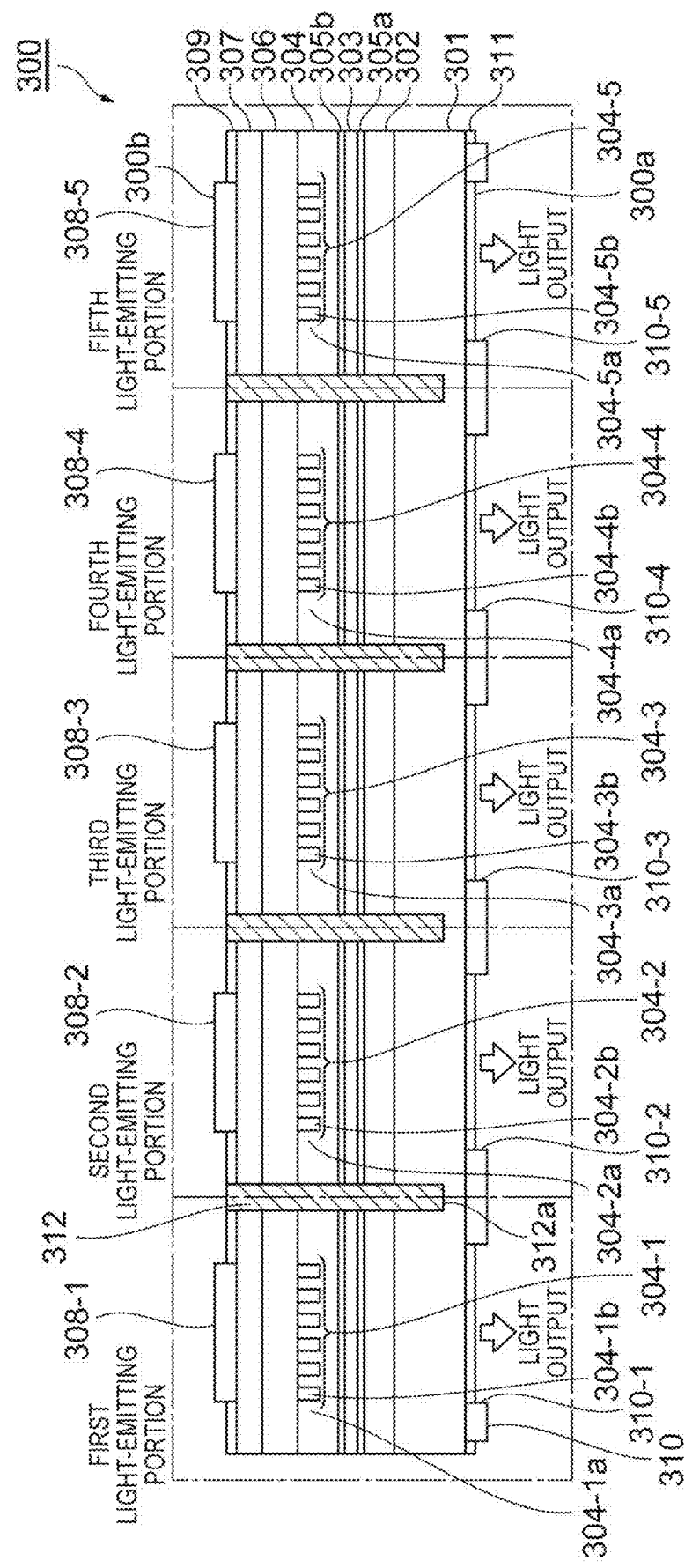
FIG. 17 is a cross-sectional view taken along line XVI-XVI in FIGS. 15 and 16.

A configuration of a semiconductor light-emitting element 300 according to the third embodiment will be described with reference to FIGS. 15 to 17. FIG. 15 is a view of the semiconductor light-emitting element 300 according to the third embodiment as viewed from a first surface side, FIG. 16 is a view of the semiconductor light-emitting element 300 as viewed from a second surface side, and FIG. 17 is a cross-sectional view taken along line XVI-XVI in FIGS. 15 and 16. Although FIGS. 15 to 17 illustrate an example in which fifteen light-emitting portions (first to fifteenth light-emitting portions) are arranged in three rows and five columns, the number of the light-emitting portions may be other than fifteen, and such a two-dimensional arrangement may be arbitrary.

As illustrated in FIGS. 15 to 17, the semiconductor light-emitting element 300 has a first surface 300a and a second surface 300b, and outputs light from the first surface 300a as a light emission surface. In the present embodiment, the second surface 300b functions as a support surface. The semiconductor light-emitting element 300 includes a common substrate layer 301, an active layer 303, a phase modulation layer 304, a first cladding layer 302, a second cladding layer 306, a plurality of second-surface-side electrodes 308-1 to 308-15, and a first-surface-side electrode 310. The phase modulation layer 304 includes a plurality of phase modulation regions 304-1 to 304-15 optically coupled to the active layer 303. Incidentally, a stacked structure is configured using the phase modulation layer 304 including at least the active layer 303 and the plurality of phase modulation regions 304-1 to 304-15. The first cladding layer 302 is positioned on the side where the first surface 300a is arranged with respect to the stacked structure (including at least the active layer 303 and the phase modulation layer 304). The second cladding layer 306 is positioned on the side where the second surface 300b to the stacked structure (including at least the active layer 303 and the phase modulation layer 304) is arranged. The second-surface-side electrodes 308-1 to 308-15 are arranged on the side where the second surface 300b is arranged with respect to the second cladding layer 306 at positions corresponding to the respective phase modulation regions 304-1 to 304-15. The first-surface-side electrode 310 is positioned on the side where the first surface 300a is arranged with respect to the first cladding layer 302.

The phase modulation regions 304-1 to 304-15 include base regions 304-1a to 304-15a having a first refractive index and a plurality of modified refractive index regions 304-1b to 304-15b having a second refractive index different from the first refractive index, respectively. The plurality of modified refractive index regions 304-1b to 304-15b are arranged in the base regions 304-1a to 304-15a, respectively, according to an arrangement pattern in which each gravity center G1 is positioned at a place shifted by a predetermined distance r from each lattice point O in a virtual square lattice in each of the base regions 304-1a to 304-15a. An arrangement pattern of the modified refractive index regions 304-1b to 304-15b in each of the phase modulation regions 304-1 to 304-15 is set such that a beam projection pattern expressed by light outputted from the first surface 300a and a beam projection region, which is a projection range of the beam projection pattern, coincide with a target beam projection pattern and a target beam projection region when a drive current is supplied from each of the second-surface-side electrodes 308-1 to 308-15 corresponding to each of the phase modulation regions 304-1 to 304-15.

The beam projection regions of light outputted when the drive current is supplied from the second-surface-side electrodes 308-1 to 308-15 may be all the same, or at least some thereof may be different from the others. In addition, the beam projection patterns of light outputted when the drive current is supplied from the second-surface-side electrodes 308-1 to 308-15 may be also all the same, or at least some thereof may be different from the others.

The active layer 303, the phase modulation layer 304, the first cladding layer 302, the second cladding layer 306, and the common substrate layer 301 are provided with a separation region 312 extending from the second surface 300b to the common substrate layer 301 until reaching the common substrate layer 301. The separation region 312 extends from the second surface 300b toward the common substrate layer 301 so as to electrically and optically separate the active layer 303, the first cladding layer 302, the second cladding layer 306, and corresponding regions in each of the first cladding layer 302 and the second cladding layers 306, which overlap the phase modulation regions 304-1 to 304-15 when viewed from the Z-axis direction (stacking direction). A thickness of a portion of the common substrate layer 301 positioned in the lower part of the separation region 312 (the shortest distance between an end surface 312a on the first-surface-side electrode 310 side of the separation region 312 and the first-surface-side electrode 310) is equal to or shorter than half of a thickness of the common substrate layer 301 along the Z-axis direction, and typically, 70 μm or shorter. As illustrated in FIG. 17, the respective portions of the semiconductor light-emitting element 300 divided at the positions of the separation region 312 can be considered as independent light-emitting portions (the first light-emitting portion to the fifteenth light-emitting portion). In addition, a step of manufacturing the separation region 312 is the same as that of the first embodiment.

As illustrated in FIGS. 15 and 17, the first-surface-side electrode 310 includes openings 310-1 to 310-15 at positions corresponding to the phase modulation regions 304-1 to 304-15 and the second-surface-side electrodes 308-1 to 308-15. The first-surface-side electrode 310 may be a transparent electrode instead of the electrode having the opening.

A vertical relationship between the active layer 303 and the phase modulation layer 304 may be opposite to a vertical relationship illustrated in FIG. 17. In addition, FIG. 17 also illustrates the common substrate layer 301, an upper light guide layer 305b, a lower light guide layer 305a, a contact layer 307, an insulating layer 309, and an anti-reflection layer 311, but the semiconductor light-emitting element 300 do not necessarily include these layers.

Although the respective layers, constituent materials, shapes, dimensions, manufacturing methods including main steps except for a step of manufacturing the separation region, and the like of the respective regions can be appropriately selected by those skilled in the art based on the contents described in Patent Document 1 similarly to the first embodiment and the second embodiment, some examples thereof will be illustrated hereinafter. That is, an example of the material or a structure of each layer illustrated in FIG. 17 is given as follows. The common substrate layer 301 is made of GaAs. The first cladding layer 302 is made of AlGaAs. The active layer 303 has a multiple quantum well structure MQW (a barrier layer: AlGaAs/a well layer: InGaAs). The phase modulation layer 304 includes the base regions 304-1a to 304-15a and the plurality of modified refractive index regions 304-1b to 304-15 embedded in the base regions 304-1a to 304-15a. The base regions 304-1a to 304-15a are made of GaAs. The plurality of modified refractive index regions 304-1b to 304-15b are made of AlGaAs. The upper light guide layer 305b and the lower light guide layer 305a are made of AlGaAs. The second cladding layer 306 is made of AlGaAs. The contact layer 307 is made of GaAs. The insulating layer 309 is made of $SiO_2$ or silicon nitride. The anti-reflection layer 311 is made of a dielectric single-layer film such as silicon nitride (SiN) and silicon dioxide $SiO_2$) or a dielectric multi-layer film. The separation region 312 is a semiconductor layer modified by high-intensity light (electric field), a semiconductor layer insulated by either impurity diffusion or ion implantation, or a slit (air gap) formed by either dry etching or wet etching. Here, examples of a specific method for modification with the high-intensity light (electric field) include processing with a nanosecond laser and processing with an ultrashort pulse laser. The plurality of modified refractive index regions 304-1b to 304-15b may be vacancies filled with argon, nitrogen, air, or the like.

In one example, an N-type impurity is added to the common substrate layer 301 and the first cladding layer 302. A P-type impurity is added to the second cladding layer 306 and the contact layer 307. In addition, energy band gaps of the first cladding layer 302 and the second cladding layer 306 are larger than energy band gaps of the upper light guide layer 305b and the lower light guide layer 305a. The energy band gap of the upper light guide layer 305b and the lower light guide layer 305a are set to be larger than an energy band gap of the multiple quantum well structure MQW of the active layer 303.

Figure 18:
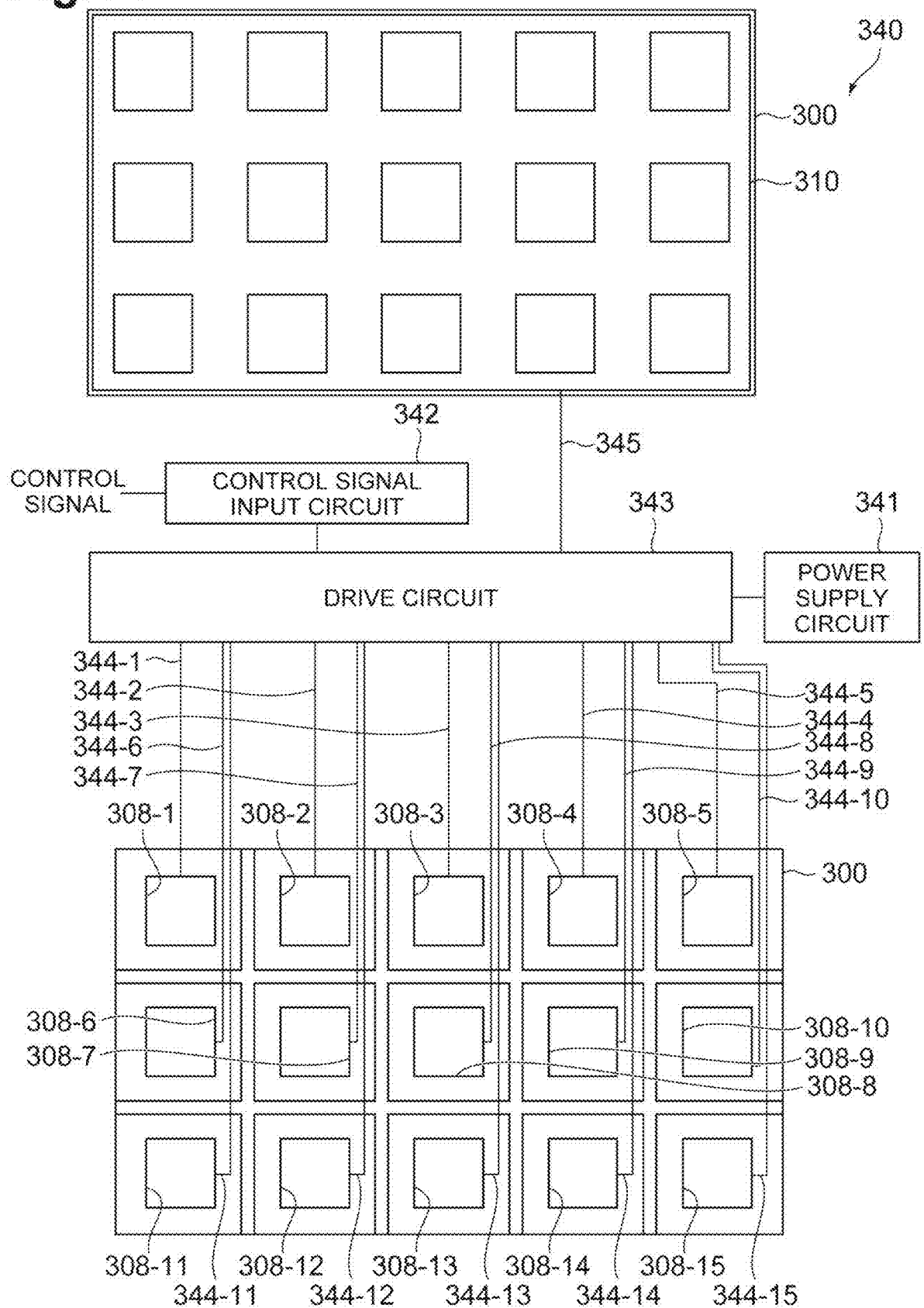
FIG. 18 is a block diagram illustrating a configuration of a light emission device including the semiconductor light-emitting element according to the third embodiment.

Next, a configuration of a light emission device including the semiconductor light-emitting element 300 will be described with reference to FIG. 18. FIG. 18 is a block diagram illustrating a configuration of the light emission device including the semiconductor light-emitting element 300.

As illustrated in FIG. 18, a light emission device 340 includes the semiconductor light-emitting element 300, a power supply circuit 341, a control signal input circuit 342, and a drive circuit 343. The power supply circuit 341 supplies power to the drive circuit 343 and the semiconductor light-emitting element 300. The control signal input circuit 342 transmits a control signal supplied from the outside of the light emission device 340 to the drive circuit 343. The drive circuit 343 supplies a drive current to the semiconductor light-emitting element 300. The drive circuit 343 and the semiconductor light-emitting element 300 are connected via a plurality of drive lines 344-1 to 344-15 for supplying a drive current and a single common potential line 345. The drive lines 344-1 to 344-15 are connected to the second-surface-side electrodes 308-1 to 308-15, respectively, and the common potential line 345 is connected to the first-surface-side electrode 310.

Incidentally, in FIG. 18, the semiconductor light-emitting element 300 illustrated above the drive circuit 343 and the semiconductor light-emitting element 300 illustrated below the drive circuit 343 represent the first surface and the second surface of the single semiconductor light-emitting element 300, respectively.

The drive lines 344-1 to 344-15 may be alternatively driven in accordance with an application, or at least two thereof may be simultaneously driven. In addition, the drive circuit 343 may be configured separately from the semiconductor light-emitting element 300, or may be integrally formed on the common substrate layer 301 of the semiconductor light-emitting element 300.

The light emission device 340 including the semiconductor light-emitting element 300 configured as described above operates as follows. That is, a drive current is supplied from the drive circuit 343 between any of the drive lines 344-1 to 344-15 and the common potential line 345. In the light-emitting portion corresponding to the second-surface-side electrode connected to the drive line to which the drive current has been supplied, electrons and holes are recombined in the active layer 303 so that the active layer 303 in the light-emitting portion emits light. The light obtained by such light emission is efficiently confined by the first cladding layer 302 and the second cladding layer 306. The light emitted from the active layer 303 enters the inside of the corresponding phase modulation region, and a predetermined mode is fox med due to a confinement effect by two-dimensional feedback by the phase modulation region. When sufficient electrons and holes are injected into the active layer, light incident on the phase modulation region oscillates in a predetermined mode. The light forming the predetermined oscillation mode is subjected to phase modulation in accordance with the arrangement pattern of the modified refractive index regions, and the light subjected to the phase modulation is emitted from the side of the first-surface-side electrode to the outside as light having the beam projection region and the beam projection pattern in accordance with the arrangement pattern.

Even in the present embodiment, the semiconductor light-emitting element 300 is a single element provided with the phase modulation layer 304 including the plurality of phase modulation regions 304-1 to 304-15. Thus, a process in which a plurality of semiconductor light-emitting elements are arranged on a support board is not required, which is different from a configuration in which a plurality of semiconductor light-emitting elements each including one phase modulation region (phase modulation layer) are arranged on a support board Thus, the irradiation of light of the target beam projection pattern with respect to the target beam projection region is realized easily with high accuracy.

The active layer 303, the phase modulation layer 304, the first cladding layer 302, the second cladding layer 306, and the common substrate layer 301 are also provided with the separation region 312 extending from the second surface 300b to the common substrate layer 301 until reaching the common substrate layer 301 in the present embodiment. Since the phase modulation regions 304-1 to 304-15 adjacent to each other are electrically and optically separated by the above separation region 312, generation of crosstalk between the phase modulation regions 304-1 to 304-15 adjacent to each other is suppressed. As a result, the irradiation of light of the desired beam projection pattern with respect to the desired beam projection region is realized with still higher accuracy.

The arrangement pattern in each of the phase modulation regions 304-1 to 304-15 may be also set such that beam projection regions become equal even if a drive current is supplied from any of the second-surface-side electrodes 308-1 to 308-15 in the present embodiment. In the case of the above configuration, various applications other than an application example of the semiconductor light-emitting element described in Patent Document 1 (the application example in which an object is scanned with a laser beam) can be implemented. Possible applications are the same as those in the second embodiment.

In addition, the arrangement pattern in each of the phase modulation regions 304-1 to 304-15 may be also set such that beam projection patterns become equal even if a drive current is supplied from any of the second-surface-side electrodes 308-1 to 308-15 in the present embodiment. In the case of the above configuration, various applications other than the application example of the semiconductor light-emitting element described in Patent Document 1 (the application example in which the object is scanned with the laser beam) can be implemented, but also various applications other than the above application example can be implemented. Possible applications in this case are also the same as those in the second embodiment.

Fourth Embodiment

The fourth embodiment is an embodiment in which the light output taken from the first surface side in the first embodiment is changed to be taken from the second surface side. Accordingly, the light output does not pass through the common substrate layer, and thus, it is possible to eliminate absorption of the output light by the common substrate layer and to prevent attenuation of the output light and heat generation of the common substrate layer. The fourth embodiment is the same as the first embodiment except for such a change.

Figure 19:
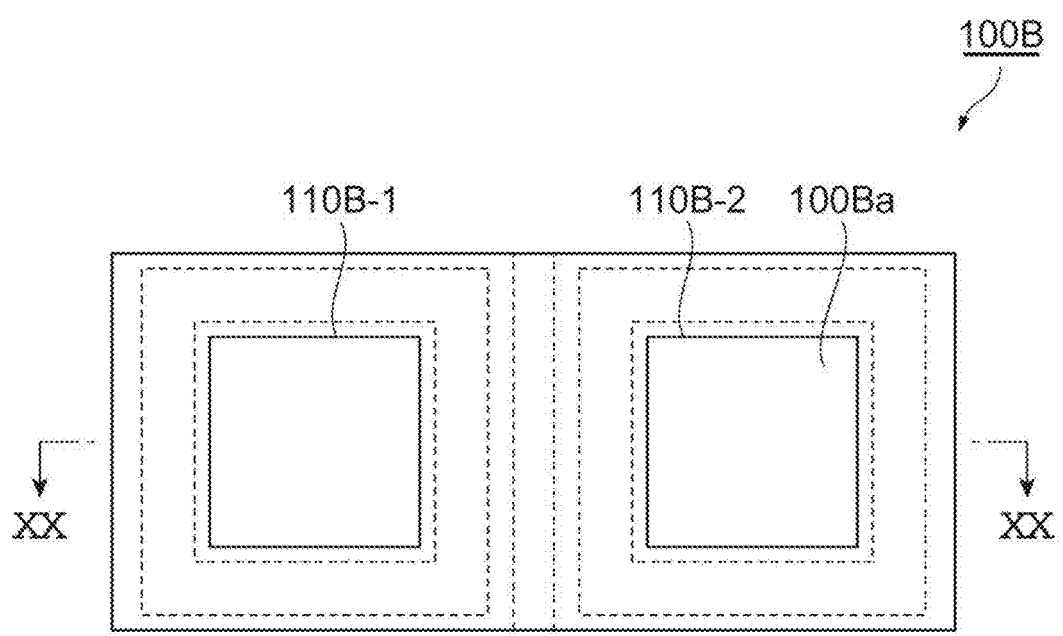
FIG. 19 is a view of a semiconductor light-emitting element according to a fourth embodiment as viewed from a first surface side.
Figure 20:
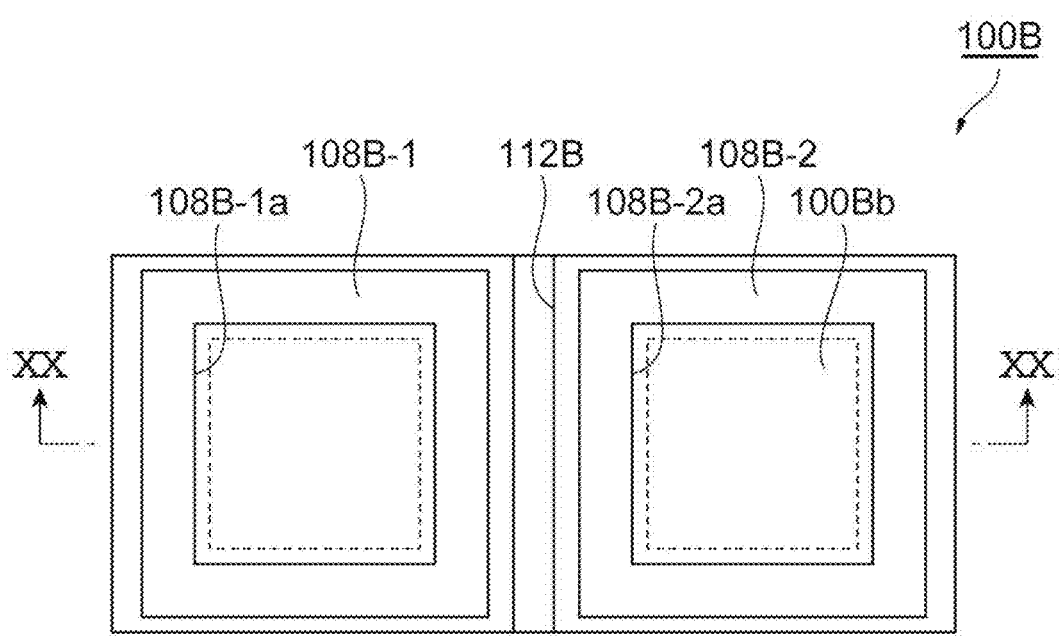
FIG. 20 is a view of the semiconductor light-emitting element according to the fourth embodiment as viewed from a second surface side.
Figure 21:
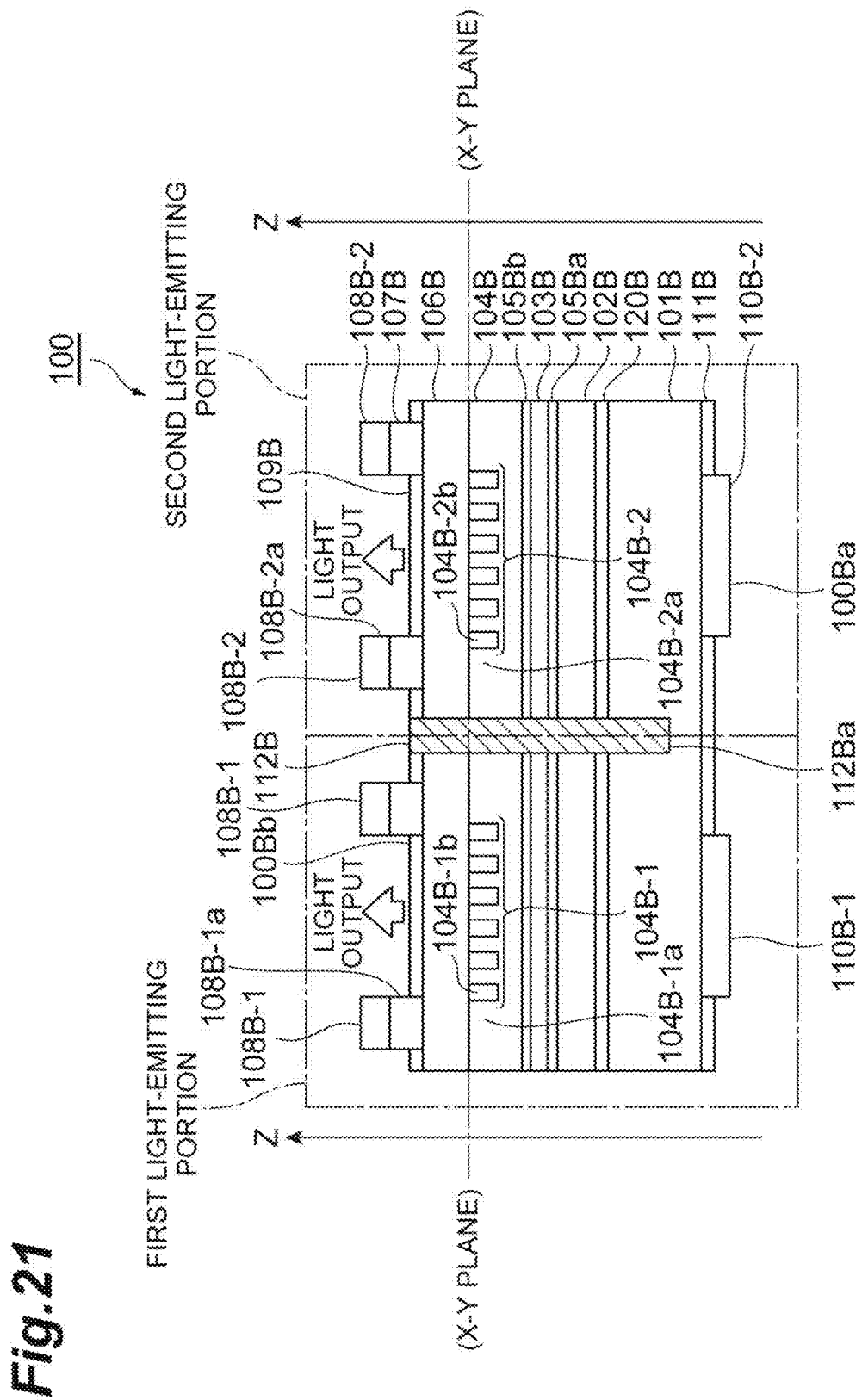
FIG. 21 is a cross-sectional view taken along line XX-XX in FIGS. 19 and 20.

A configuration of a semiconductor light-emitting element 100B according to the fourth embodiment will be described with reference to FIGS. 19 to 21. FIG. 19 is a view of the semiconductor light-emitting element 100B according to the fourth embodiment as viewed from a first surface side. FIG. 20 is a view of the semiconductor light-emitting element 100B as viewed from a second surface side. FIG. 21 is a cross-sectional view taken along line XX-XX in FIGS. 19 and 20.

As illustrated in FIGS. 19 to 21, the semiconductor light-emitting element 100B has a first surface 100Ba and a second surface 100Bb, and outputs light from the second surface 100Bb as a light emission surface differently from the first to third embodiments. In the present embodiment, the first surface 100Ba functions as a support surface. The semiconductor light-emitting element 100B includes a common substrate layer 101B, an active layer 103B, a phase modulation layer 104B, a first cladding layer 102B, a second cladding layer 106B, a pair of second-surface-side electrodes 108B-1 and 108B-2, and a pair of first-surface-side electrodes 110B-1 and 110B-2. The phase modulation layer 104B includes a pair of phase modulation regions 104B-1 and 104B-2 optically coupled to the active layer 103B. Incidentally, a stacked structure is configured using the phase modulation layer 104B including at least the active layer 103B and the pair of phase modulation regions 104B-1 and 104B-2. The first cladding layer 102B is positioned on the side where the first surface 100Ba is arranged with respect to the stacked structure (including at least the active layer 103B and the phase modulation layer 104B). The second cladding layer 106B is positioned on the side where the second surface 100Bb is arranged with respect to the stacked structure (including at least the active layer 103B and the phase modulation layer 104B). The second-surface-side electrodes 108B-1 and 108B-2 are arranged on the side where the second surface 100Bb is arranged with respect to the second cladding layer 106B at positions corresponding to the respective phase modulation regions 104B-1 and 104B-2. The first-surface-side electrodes 110B-1 and 110B-2 are positioned on the side where the first surface 100Ba is arranged with respect to the first cladding layer 102.

The phase modulation regions 104B-1 and 104B-2 include base regions 104B-1a and 104B-1b having a first refractive index and a plurality of modified refractive index regions 104B-2a and 104B-2b having a second refractive index different from the first refractive index, respectively. The plurality of modified refractive index regions 104B-1b and 104B-2b are arranged in the base regions 104B-1a and 104B-2a, respectively, according to an arrangement pattern in which each gravity center G1 is positioned at a place shifted by a predetermined distance r from each lattice point O in a virtual square lattice in each of the base regions 104B-1a and 104B-2a. The arrangement pattern of the plurality of modified refractive index regions 104B-1b and 104B-2b in each of the phase modulation regions 104B-1 and 104B-2 is set such that a beam projection pattern expressed by light outputted from the second surface 100Bb and a beam projection region, which is a projection range of the beam projection pattern, coincide with a target beam projection pattern and a target beam projection region when a drive current is supplied from the second-surface-side electrode 108B-1 or 108B-2 corresponding to the phase modulation region 104B-1 or 104B-2.

The beam projection region of light outputted when the drive current is supplied from the second-surface-side electrode 108B-1 and the beam projection region of light outputted when the drive current is supplied from the second-surface-side electrode 108B-2 may be the same or different. In addition, the beam projection pattern of light outputted when the drive current is supplied from the second-surface-side electrode 108B-1 and the beam projection pattern of light outputted when the drive current is supplied from the second-surface-side electrode 108B-2 may also be the same or different.

The active layer 103B, the phase modulation layer 104B, the first cladding layer 102B, the second cladding layer 106B, and the common substrate layer 101B are provided with a separation region 112B extending from the second surface 100Bb to the common substrate layer 101B until reaching the common substrate layer 101B. The separation region 112B extends from the second surface 100Bb toward the common substrate layer 101B so as to electrically and optically separate the active layer 103B, the first cladding layer 102B, the second cladding layer 106B, and corresponding regions in each of the first cladding layer 102B and the second cladding layers 106B, which overlap the phase modulation regions 104B-1 and 104B-2 when viewed from the Z-axis direction (stacking direction). A thickness of a portion of the common substrate layer 101B positioned in the lower part of the separation region 112B (a distance between an end surface 112Ba of the separation region 112B on the first-surface-side electrode 110B-1 or 110B-2 side and the first-surface-side electrode 110B-1 or 110B-2) is equal to or shorter than half of a thickness of the common substrate layer 101B along the Z-axis direction (stacking direction), and typically, 70 µm or shorter. Incidentally, the first-surface-side electrode is divided into two in the fourth embodiment, but these two first-surface-side electrodes 110B-1 and 110B-2 are collectively referred to as the "first-surface-side electrode". Therefore, the "distance between the end surface 112Ba of the separation region 112B on the first-surface-side electrode 110B-1 or 110B-2 side and the first-surface-side electrode 110B-1 or 110B-2" (a thickness of a portion where the separation region is not formed in the common substrate layer 101B) refers to a distance between one plane, which includes surfaces of both the first-surface-side electrode 110B-1 and the first-surface-side electrode 110B-2 on the side where the common substrate layer 101B is arranged, and the end surface 112Ba. The distance (minimum interval) from the end surface 112Ba of the separation region 112B to the first-surface-side electrode 110B-1 or 110B-2 defined in this manner is equal to or shorter than half of the thickness of the common substrate layer 101B along the Z-axis direction (stacking direction). In addition, a thickness of a portion where such a separation region is not formed is typically 70 µm or shorter. As illustrated in FIG. 21, the respective portions of the semiconductor light-emitting element 100B divided at the positions of the separation region 112B can be considered as independent light-emitting portions (a first light-emitting portion and a second light-emitting portion). In addition, a step of manufacturing the separation region 112B is the same as that of the first embodiment.

As illustrated in FIGS. 20 and 21, the second-surface-side electrodes 108B-1 and 108B-2 include openings 108B-1a and 108B-2a at positions corresponding to the phase modulation regions 104B-1 and 104B-2 and the first-surface-side electrodes 110B-1 and 110B-2. The second-surface-side electrodes 108B-1 and 108B-2 may be transparent electrodes instead of the electrodes having the openings.

A vertical relationship between the active layer 103B and the phase modulation layer 104B may be opposite to a vertical relationship illustrated in FIG. 21. In addition, a DBR layer 120B may be provided between the common substrate layer 101B and the first cladding layer 102B in order to reduce light absorption in the common substrate layer 101B. The DBR layer 120B may be provided at other places as long as the DBR layer is provided between the phase modulation layer 104B and the common substrate layer 101B. In addition, FIG. 21 also illustrates the common substrate layer 101B, an upper light guide layer 105Bb, a lower light guide layer 105Ba, a contact layer 107B, an insulating layer 109B, and an anti-reflection layer 111B, but the semiconductor light-emitting element 100B do not necessarily include these layers.

Although the respective layers, constituent materials, shapes, dimensions, manufacturing methods including main steps except for a step of manufacturing the separation region, and the like of the respective regions can be appropriately selected by those skilled in the art based on the contents described in Patent Document 1, some examples thereof will be illustrated hereinafter. That is, an example of the material or a structure of each layer illustrated in FIG. 21 is given as follows. The common substrate layer 101B is made of GaAs. The first cladding layer 102B is made of AlGaAs. The active layer 103E has a multiple quantum well structure MQW (a barrier layer: AlGaAs/a well layer: InGaAs). The phase modulation layer 104B includes the base regions 104B-1a and 104B-2a and the plurality of modified refractive index regions 104B-1b and 104B-2b embedded in the base regions 104B-1a and 104B-2a. The base regions 104B-1a and 104B-2a are made of GaAs. The plurality of modified refractive index regions 104B-1b and 104B-2b are made of AlGaAs. The upper light guide layer 105Bb and the lower light guide layer 105Ba are made of AlGaAs. The second cladding layer 106B is made of AlGaAs. The contact layer 107B is made of GaAs. The insulating layer 109B is made of $SiO_2$ or silicon nitride. The anti-reflection layer 111B is made of a dielectric single-layer film such as silicon nitride (SiN) and silicon dioxide $SiO_2$) or a dielectric multi-layer film. The separation region 112B is a semiconductor layer modified by high-intensity light (electric field), a semiconductor layer insulated by either impurity diffusion or ion implantation, or a slit (air gap) formed by either dry etching or wet etching. Here, examples of a specific method for modification with the high-intensity light (electric field) include processing with a nanosecond laser and processing with an ultrashort pulse laser. The plurality of modified refractive index regions 104B-1b and 104B-2b may be holes filled with argon, nitrogen, air, or the like.

In one example, an N-type impurity is added to the common substrate layer 101B and the first cladding layer 102B. A P-type impurity is added to the second cladding layer 106B and the contact layer 107B. In addition, energy band gaps of the first cladding layer 102B and the second cladding layer 106B are larger than energy band gaps of the upper light guide layer 105Bb and the lower light guide layer 105Ba. The energy band gap of the upper light guide layer 105Bb and the lower light guide layer 105Ba are set to be larger than an energy band gap of the multiple quantum well structure MQW of the active layer 103B.

Although the first to fourth embodiments of the present invention have been described as above, the present invention is not limited to the first to fourth embodiments described above.

For example, the separation regions 112, 212, 312, and 112B are provided in the first to fourth embodiments, respectively, but the separation region may be omitted when crosstalk does not cause a problem, for example, when an interval between adjacent phase modulation regions can be widened.

For example, the example in which the modified refractive index region is the circle (perfect circle) has been described in FIGS. 4 and 5, but the modified refractive index region may have a shape other than the circle. For example, when the shapes of the plurality of modified refractive index regions on the X-Y plane are any of the perfect circle, a square, a regular hexagon, a regular octagon, a regular hexadecagon, a rectangle, and an ellipse, that is, when the shapes of the respective modified refractive index regions are mirror-image symmetric (line symmetric), it is possible to set the angle φ, formed between the direction from the lattice point O(x, y) of each of the plurality of unit configuration regions R forming the virtual square lattice toward the gravity center G1 of each corresponding modified refractive index region and the s-axis parallel to the X-axis, with high accuracy in the phase modulation layer. In addition, the shapes of the plurality of modified refractive index regions on the X-Y plane may be shapes that do not have the 180° rotational symmetry as illustrated in FIGS. 22A to 22J. Examples of the shapes that do not have the 180° rotational symmetry include an equilateral triangle illustrated in FIG. 22B, a right-angled isosceles triangle illustrated in FIG. 22A, an isosceles triangle illustrated in FIG. 22C, a shape illustrated in FIG. 22I in which two circles or ellipses partially overlap each other, an egg shape illustrated in FIG. 22H, a teardrop shape illustrated in FIG. 22D, an arrow shape illustrated in FIG. 22E, a trapezoid illustrated in FIG. 22F, a pentagon illustrated in FIG. 22G, and a shape illustrated in FIG. 22J in which two rectangles partially overlap each other. In this case, it is possible to obtain a higher light output. Incidentally, the "egg shape" is a shape obtained by deforming an ellipse such that a dimension in a short-axis direction in the vicinity of one end portion along a long axis is smaller than a dimension in the short-axis direction in the vicinity of the other end portion as illustrated in FIG. 22H. As illustrated in FIG. 22D, the "teardrop shape" is a shape obtained by deforming one end portion of an ellipse along a long axis thereof into a sharp end portion protruding along a long-axis direction. The arrow shape is a shape in which one side of a rectangle forms a triangular notch and a side opposing the one side forms a triangular protrusion as illustrated in FIG. 22E.

In addition, all the first to third embodiments relate to the semiconductor light-emitting element in which light is outputted from the first surface, but the second-surface-side electrode may be configured as the electrode having the opening or the transparent electrode to form the semiconductor light-emitting element in which light is outputted from the second surface side as in the fourth embodiment. Although each number of the phase modulation regions, the second-surface-side electrodes, and the first-surface-side electrodes is two (a pair) in the fourth embodiment, the number may be set to three or more, and the arrangement may be performed one-dimensionally or two-dimensionally as in the second or third embodiment. In the case of the semiconductor light-emitting element in which light is outputted from the second surface side, the light output does not pass through the common substrate layer, and thus, it is possible to eliminate absorption of the output light by the common substrate layer and to prevent attenuation of the output light and heat generation of the common substrate layer.

Figure 23:
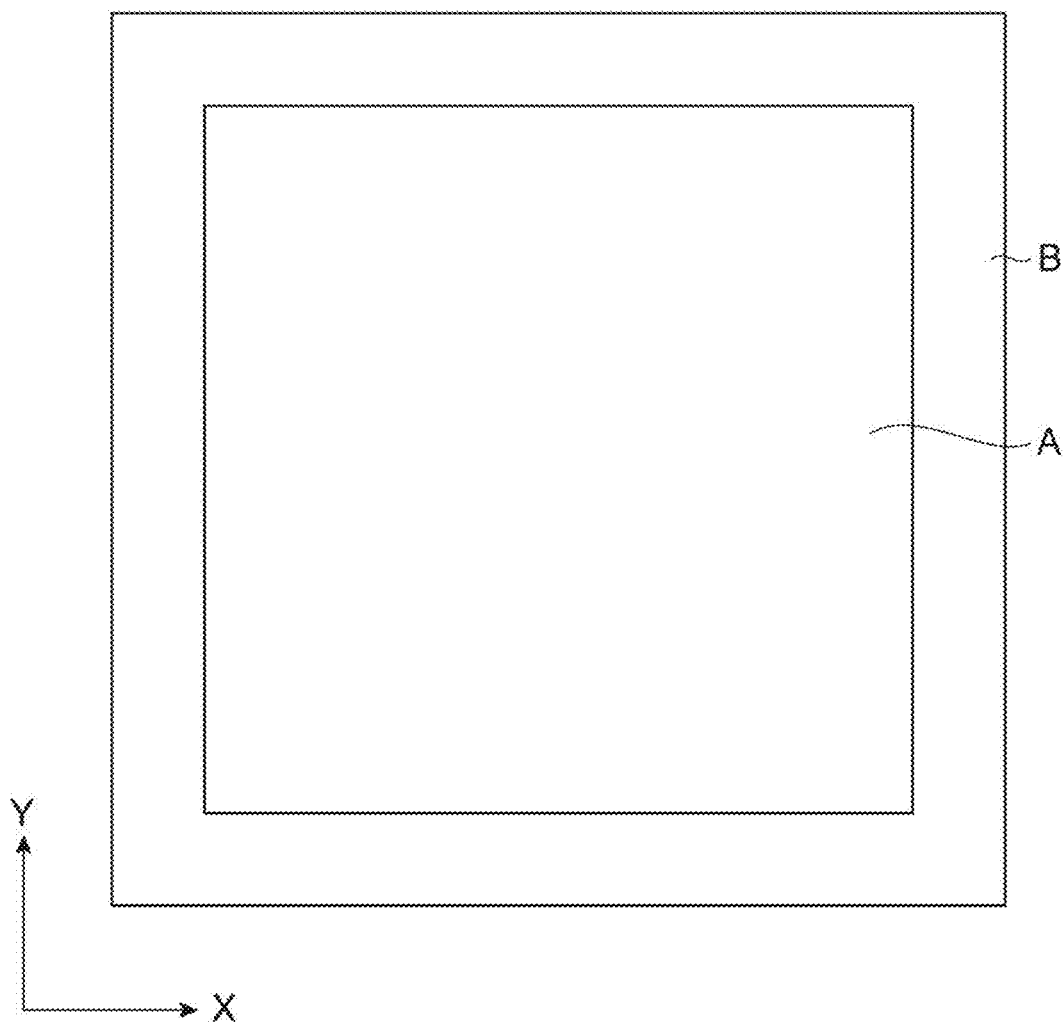
FIG. 23 is a view illustrating a first modified example of the phase modulation region illustrated in FIG. 4.

The phase modulation layer may be provided with an inner region A including a plurality of modified refractive index regions configured to generate a beam projection region and a beam projection pattern and an outer region B surrounding an outer circumference of the inner region A as in a first modified example illustrated in FIG. 23. The inner region A is substantially a region constituted by the unit configuration regions R in which the corresponding modified refractive index regions are arranged, respectively. The outer region B is provided with a plurality of peripheral lattice-point-located modified-refractive-index-regions. As an example, gravity centers of the plurality of peripheral lattice-point-located modified-refractive-index-regions are preferably coincident with lattice points in an expanded square lattice defined by setting the same lattice structure as a virtual square lattice on an outer circumference of the virtual square lattice. Incidentally, FIG. 23 illustrates an aspect in which the modified example of the phase modulation layer is viewed in a layer thickness direction (Z-axis direction). In FIG. 23, an outer contour (the outer region B) represents a part of the phase modulation region. The inner region A surrounded by the outer region B is a phase modulation region including a plurality of modified refractive index regions configured to generate a beam projection region and a beam projection pattern (a region substantially constituted of the plurality of unit configuration regions R), which is similar to the first to fourth embodiments. Therefore, the phase modulation region of the phase modulation layer is constituted by the inner region A and the outer region B in the example of FIG. 23. As described above, the outer region B is the region including the plurality of peripheral lattice-point-located modified-refractive-index-regions each having the gravity center at the lattice point position in the virtual square lattice, and an example thereof is illustrated as follows. That is, a lattice constant of the virtual square lattice in the outer region B may be equal to a lattice constant of the virtual square lattice in the inner region A, and a shape and a size of each peripheral lattice-point-located modified-refractive-index-region in the outer region B may be equal to a shape and a size of the modified refractive index region in the inner region A. According to this modified example, a leakage of light in an in-plane direction is suppressed, and an oscillation threshold current can be reduced.

Further, FIGS. 4 and 5 illustrate the example in which the modified refractive index regions (hereinafter referred to as "displaced modified-refractive-index-regions") having the gravity centers G1 at the places shifted by the predetermined distance from the respective lattice points in the virtual square lattice in the base region are provided one by one in the respective unit configuration region. However, the displaced modified-refractive-index-region may be divided into a plurality of portions so that all the gravity centers are positioned at the places shifted by the predetermined distance from the respective lattice points. In addition, lattice-point-located modified refractive index regions may be provided on the respective lattice points in addition to the displaced modified-refractive-index-regions. The lattice-point-located modified refractive index region is a region having a refractive index different from the refractive index (first refractive index) of the base region similarly to the displaced modified-refractive-index-region, but may be made of the same material (a material having the same refractive index) as the displaced modified-refractive-index-region, or a part thereof may overlap a portion of the displaced modified-refractive-index-region.

Figure 24:
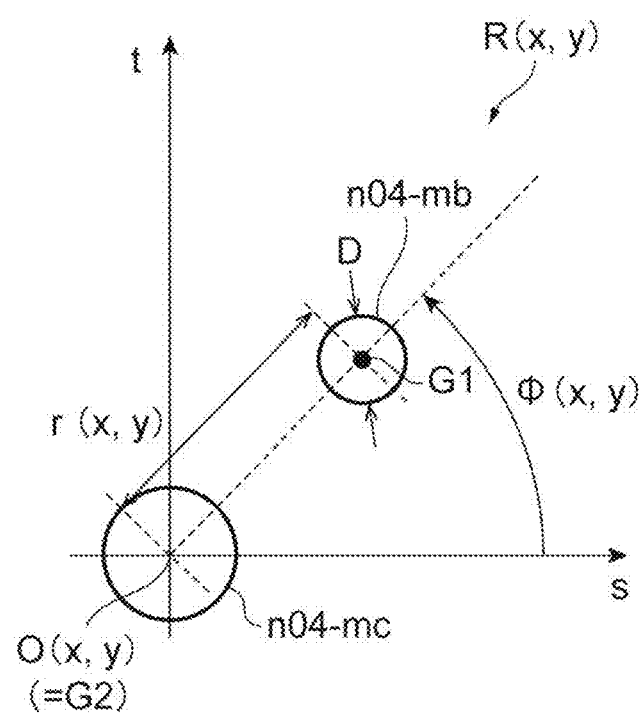
FIG. 24 is a graph for describing a positional relationship between a gravity center of a modified refractive index region (displaced modified-refractive-index-region) and a lattice-point-located modified refractive index region in the case of providing the lattice-point-located modified refractive index region in addition to the modified refractive index region (displaced modified-refractive-index-region) as another example of the arrangement pattern determined by the rotation system.
Figure 26:
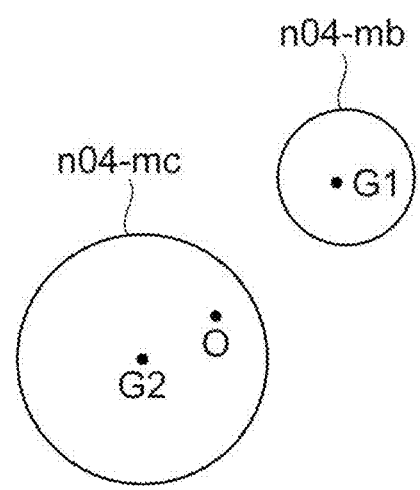
FIG. 26 is a view illustrating a modified example (in the rotation system) of the case of providing the lattice-point-located refractive index region in addition to the modified refractive index region (displaced modified-refractive-index-region).

Here, an example in the case of providing the lattice-point-located modified refractive index region in addition to the displaced modified-refractive-index-region will be described with reference to FIGS. 24, 25A to 25K, and 26. FIG. 24 is a graph for describing a positional relationship between the gravity center of the displaced modified-refractive-index-region and the lattice-point-located modified refractive index region in the case of providing the lattice-point-located modified refractive index region in addition to the displaced modified-refractive-index-region. FIGS. 25A to 25K are views illustrating an example (in the rotation system) of a combination of the displaced modified-refractive-index-region and the lattice-point-located modified refractive index region in the case of providing the lattice-point-located modified refractive index region in addition to the displaced modified-refractive-index-region. FIG. 26 is a view illustrating a modified example (in the rotation system) of the case of providing the lattice-point-located modified refractive index region in addition to the displaced modified-refractive-index-region.

In these drawings, O represents the lattice point, G1 represents the gravity center of the displaced modified-refractive-index-region, and G2 represents a gravity center of the lattice-point-located modified refractive index region. Although the positional relationship between the gravity center G1 of the displaced modified-refractive-index-region n04-mb and the lattice point O as illustrated in FIG. 24 is the same as that of FIG. 5, a lattice-point-located modified refractive index region n04-mc is additionally provided in FIG. 24. Although the gravity center G2 of the lattice-point-located modified refractive index region n04-mc overlaps the lattice point O in FIG. 24, the gravity center G2 is not necessarily set on the lattice point O as illustrated in FIG. 26. Although both the displaced modified-refractive-index-region n04-mb and the lattice-point-located modified refractive index region n04-mc are circles and the both do not overlap each other in FIG. 24, a combination of both the regions is not limited thereto.

As illustrated in FIGS. 25A to 25K, various combinations are conceivable as the combination of the displaced modified-refractive-index-region n04-mb and the lattice-point-located modified refractive index region n04-mc. FIG. 25A is the combination of FIG. 24. FIG. 25B is a combination in which both the displaced modified-refractive-index-region n04-mb and the lattice-point-located modified refractive index region n04-mc are squares. FIG. 25C is a combination in which both the displaced modified-refractive-index-region n04-mb and the lattice-point-located modified refractive index region n04-mc are circles and the both partially overlap each other. FIG. 25D is a combination in which both the displaced modified-refractive-index-region n04-mb and the lattice-point-located modified refractive index region n04-mc are squares, and the both partially overlap each other. FIG. 25E is a combination in which the displaced modified-refractive-index-region n04-mb and the lattice-point-located modified refractive index region n04-mc of FIG. 25D are arbitrarily rotated about the respective gravity centers G1 and G2 (the lattice point O) such that the both do not overlap each other. FIG. 25F is a combination in which the displaced modified-refractive-index-region n04-mb is a triangle and the lattice-point-located modified refractive index region n04-mc is a square. FIG. 25G is a combination in which the displaced modified-refractive-index-region n04-mb and the lattice-point-located modified refractive index region n04-mc of FIG. 25F are arbitrarily rotated about the respective gravity centers G1 and G2 (the lattice point O) such that the both do not overlap each other. FIG. 25H illustrates a combination in which the displaced modified-refractive-index-region n04-mb of FIG. 25A is divided into two circular regions. FIG. 25I is a combination in which the displaced modified-refractive-index-region n04-mb is divided into a square and a triangle, and the lattice-point-located modified refractive index region n04-mc is a triangle. FIG. 25J is a combination in which the displaced modified-refractive-index-region n04-mb and the lattice-point-located modified refractive index region n04-mc of FIG. 25I are arbitrarily rotated about the respective gravity centers G1 and G2 (the lattice point O). FIG. 25K is a combination in which both the displaced modified-refractive-index-region n04-mb and the lattice-point-located modified refractive index region n04-mc are squares, the displaced modified-refractive-index-region n04-mb is divided into two squares, and directions of sides of the respective squares are directed in the same directions, respectively. When the lattice-point-located modified refractive index region is provided in addition to the displaced modified-refractive-index-region, the modified refractive index region combining both the regions does not have the 180° rotational symmetry as a whole, and thus, it is possible to obtain a higher light output.

When the shape of the modified refractive index region (including the peripheral lattice-point-located modified-refractive-index-region and the lattice-point-located modified refractive index region) is forming as a shape having a linear side, it is desirable to align a direction of the side to a specific plane orientation of crystals forming the common substrate layer. Then, when the modified refractive index region is a hole filled with argon, nitrogen, or air, it becomes easy to control a shape of the hole, and it is possible to suppress a defect in a crystal layer grown on the hole.

Figure 27:
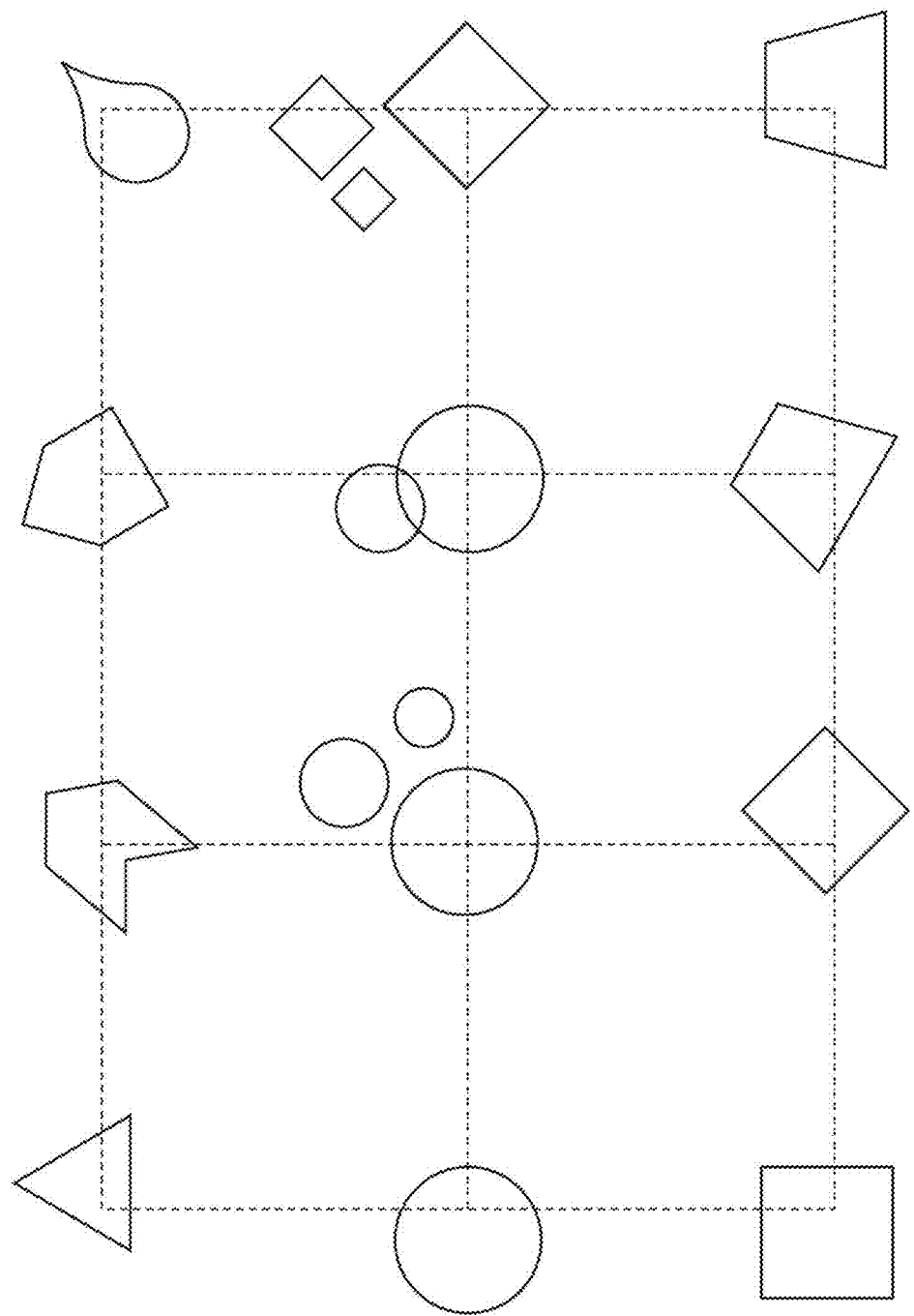
FIG. 27 is a view illustrating a second modified example of the phase modulation region illustrated in FIG. 4.

Incidentally, the shapes or the number of modified refractive index regions (including the peripheral lattice-point-located modified-refractive-index-region and the lattice-point-located modified refractive index region) provided so as to correspond to the respective lattice points are not necessarily the same within one phase modulation region. As illustrated in FIG. 27 (a second modified example of the phase modulation layer n04-m illustrated in FIG. 4), the shapes and the number of modified refractive index regions may be different for each lattice point.

Next, a case of determining an arrangement pattern of the modified refractive index region n04-mb in the phase modulation layer n04-m by an on-axis shift system will be described. Incidentally, as a method of determining the arrangement pattern of the modified refractive index region n04-mb in the phase modulation layer n04-m, the obtained phase modulation layer is applied to the semiconductor light-emitting modules according to the various embodiments described above even if the on-axis shift system is applied instead of the above-described rotation system.

Figure 28:
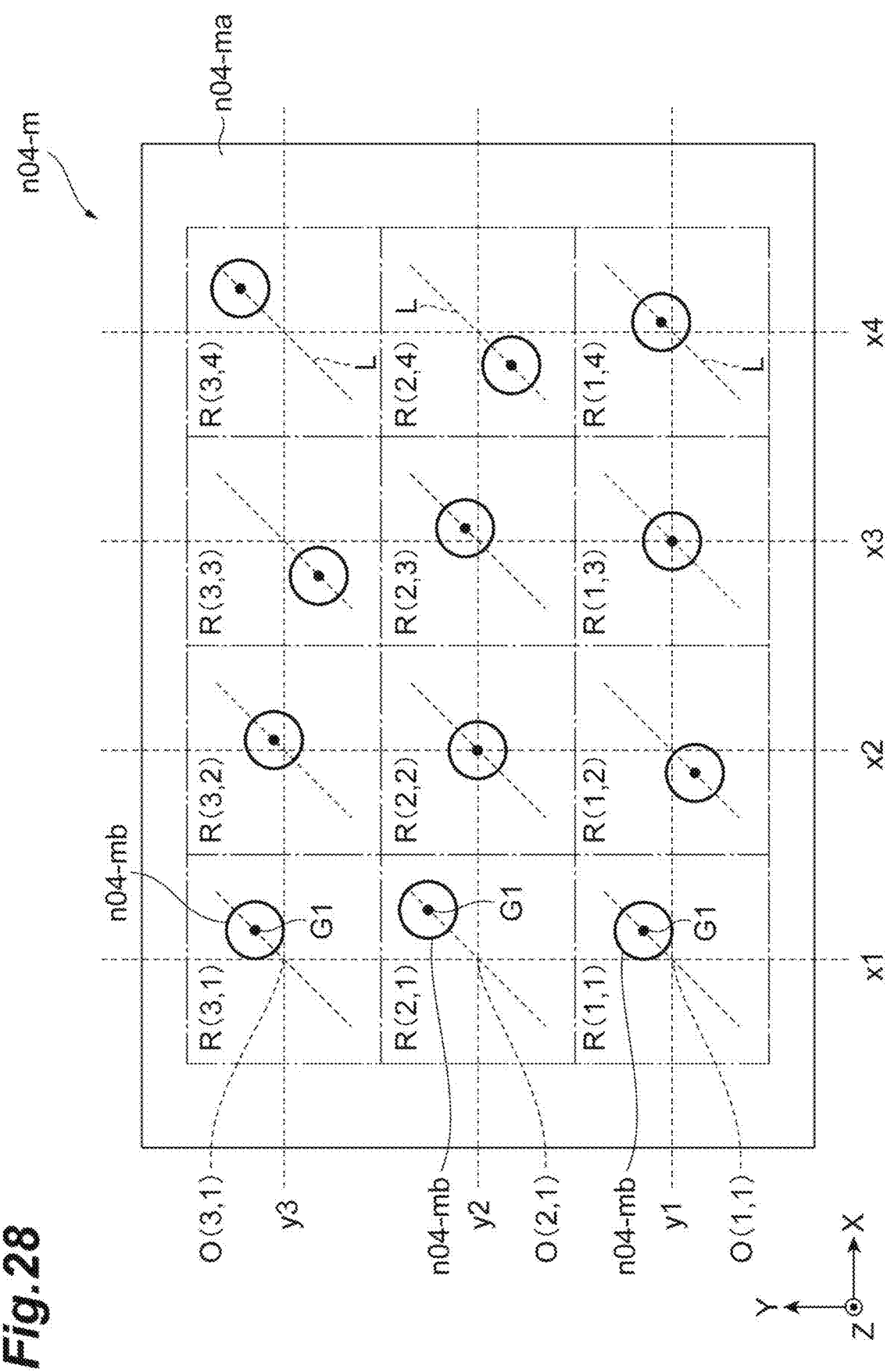
FIG. 28 is a schematic view for describing an arrangement pattern (in the on-axis shift system) of a modified refractive index region in a phase modulation layer.

FIG. 28 is a schematic view for describing the arrangement pattern (in the on-axis shift system) of the modified refractive index region n04-mb in the phase modulation layer n04-m. The phase modulation layer n04-m includes the base region n04-ma having a first refractive index and the modified refractive index region n04-mb having a second refractive index different from the first refractive index. Here, a virtual square lattice defined on an X-Y plane is set in the phase modulation layer n04-m in the same manner as in the example of FIG. 4. One side of the square lattice is parallel to the X-axis and the other side is parallel to the Y-axis. At this time, unit configuration regions R each of which has a square shape with a lattice point O of the square lattice as the center thereof are set two-dimensionally over a plurality of columns (x1 to x4) along the X-axis and a plurality of rows (y1 to y3) along the Y-axis. Assuming that coordinates of the respective unit configuration regions R are given with gravity center positions of the respective unit configuration regions R, the gravity center positions coincide with the lattice points O of virtual square lattices. A plurality of modified refractive index regions n04-mb is provided one by one in each of the unit configuration regions R. A planar shape of the modified refractive index region n04-mb is, for example, a circular shape. The lattice point O may be positioned outside the modified refractive index region n04-mb or may be included in the modified refractive index region n04-mb.

Incidentally, a ratio of the area S of the modified refractive index region n04-mb occupying within one unit configuration region R is referred to as a filling factor (FF). When the lattice interval of the square lattice is a, the filling factor FF of the modified refractive index region n04-mb is given as $S/a^2$. Here, S is the area of the modified refractive index region n04-mb on the X-Y plane, and is given as $S=\pi \times (D/2)^2$ using a diameter D of a perfect circle when a shape of the modified refractive index region n04-mb is the perfect circular shape, for example. In addition, when the shape of the modified refractive index region n04-mb is a square, $S=LA^2$ is given using a length LA of one side of the square.

Figure 29:
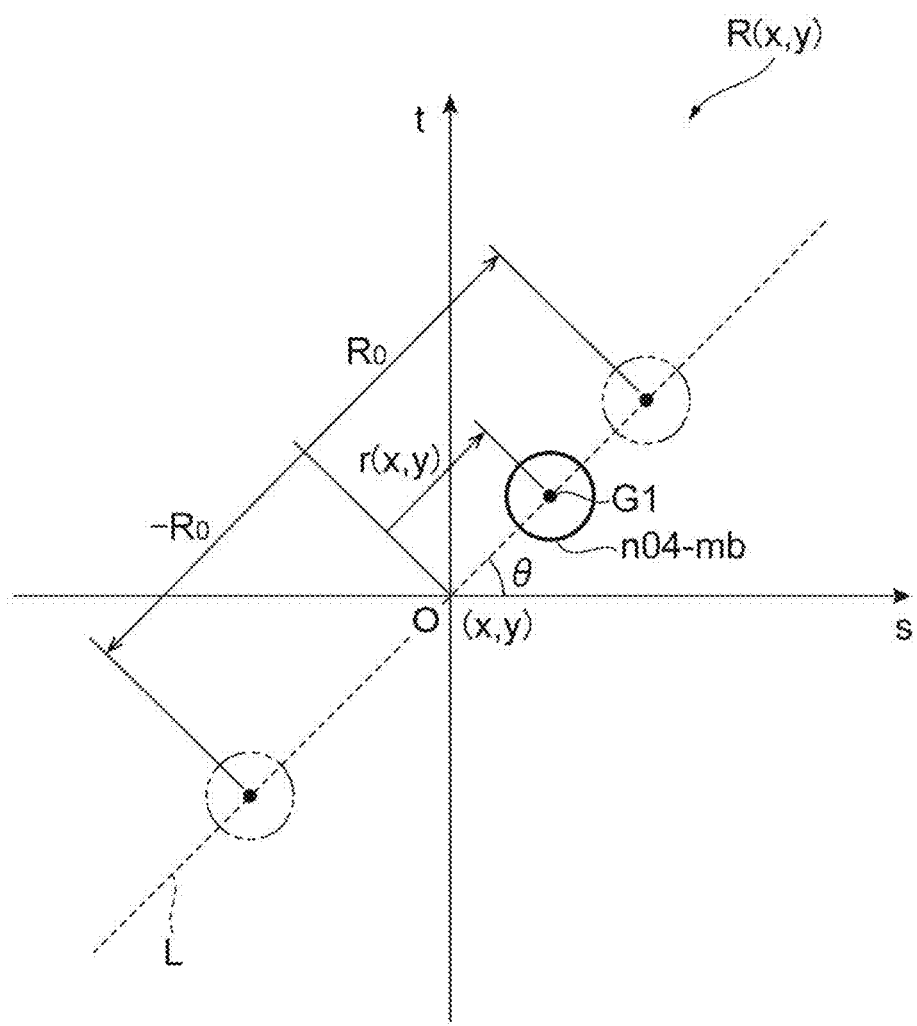
FIG. 29 is a graph for describing a positional relationship between a gravity center G1 of the modified refractive index region and a lattice point O in a virtual square lattice as an example of the arrangement pattern determined by the on-axis shift system.

FIG. 29 is a graph for describing a positional relationship between the gravity center G1 of the modified refractive index region n04-mb and the lattice point O(x,y) in the virtual square lattice as an example of the arrangement pattern determined by the on-axis shift system. As illustrated in FIG. 29, the gravity center G1 of each of the modified refractive index regions n04-mb is arranged on the straight line L. The straight line L is a straight line which passes through the corresponding lattice point O(x, y) of the unit configuration region R(x, y) and is tilted with respect to each side of the square lattice. In other words, the straight line L is a straight line that is tilted with respect to both the s-axis and the t-axis defining each of the unit configuration regions R(x, y). A tilt angle of the straight line L with respect to the s-axis is θ. The tilt angle θ is constant within the phase modulation layer n04-m. The tilt angle θ satisfies 0°<θ<90°, and θ=45° in one example. Alternatively, the tilt angle θ satisfies 180°<θ<270°, and θ=225° in one example. When the tilt angle θ satisfies 0°<θ<90° or 180°<θ<270°, the straight line L extends from the first quadrant to the third quadrant of the coordinate plane defined by the s-axis and t-axis. Alternatively, the tilt angle θ satisfies 90°<θ<180°, and θ=135° in one example. Alternatively, the tilt angle θ satisfies 270°<θ<360', and θ=315° in one example. When the tilt angle θ satisfies 90°<θ<180° or 270°<θ<360°, the straight line L extends from the second quadrant to the fourth quadrant of the coordinate plane defined by the s-axis and t-axis. In this manner, the tilt angle θ is an angle excluding 0°, 90°, 180°, and 270°. Here, a distance between the lattice point O(x, y) and the gravity center G1 is assumed as r(x, y). Here, x indicates a position of the x-th lattice point on the X-axis, and y indicates a position of the y-th lattice point on the Y-axis. When the distance r(x, y) is a positive value, the gravity center G1 is positioned in the first quadrant (or the second quadrant). When the distance r(x, y) is a negative value, the gravity center G1 is positioned in the third quadrant (or the fourth quadrant). When the distance r(x, y) is zero, the lattice point O and the gravity center G1 coincide with each other.

The distance r(x, y) between the gravity center G1 of each of the modified refractive index regions n04-mb and the corresponding lattice point O(x, y) of the unit configuration region R(x, y) illustrated in FIG. 28 is individually set for each of the modified refractive index regions n04-mb according to a target beam projection pattern (optical image). A distribution of the distance r(x, y) has a specific value at each position determined by values of x (x1 to x4 in the example of FIG. 28) and y (y1 to y3 in the example of FIG. 28), but is not necessarily represented by a specific function. The distribution of the distance r(x, y) is determined from a phase distribution extracted from a complex amplitude distribution obtained by inverse Fourier transforming a target beam projection pattern. That is, the distance r(x, y) is set to zero when the phase P(x, y) in the unit configuration region R(x, y) illustrated in FIG. 29 is $P_0$, the distance r(x, y) is set to a maximum value $R_0$ when the phase P(x, y) is $\pi+P_0$, and the distance r(x, y) is set to a minimum value $-R_0$ when the phase P(x, y) is $-\pi+P_0$. Further, the distance r(x, y) is set such that $r(x, y)=\{P(x, y)-P_0\} \times R_0/\pi$ for an intermediate phase P(x, y) thereof. Here, an initial phase $P_0$ can be arbitrarily set. Assuming that a lattice interval of the square lattice is a, the maximum value $R_0$ of r(x, y) is, for example, within a range of the following Formula (10).

$$0 \le R_0 \le \frac{a}{\sqrt{2}} \quad (10)$$

Incidentally, reproducibility of the beam projection pattern is improved by applying an iterative algorithm such as the Gerchberg-Saxton (GS) method which is generally used in hologram generation calculation at the time of obtaining complex amplitude distribution from the target beam projection pattern.

Figure 30:
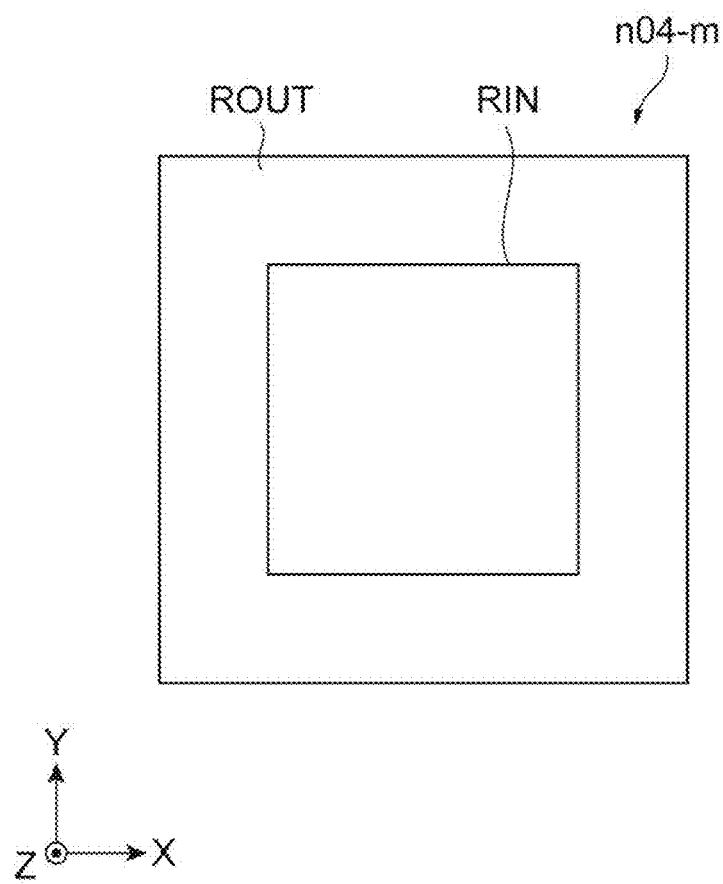
FIG. 30 is a plan view illustrating an example in which a refractive index substantially periodic structure is applied only within a specific region of a phase modulation layer as a first modified example of the phase modulation layer of FIG. 28.

FIG. 30 is a plan view illustrating an example in which a refractive index substantially periodic structure is applied only within a specific region of a phase modulation layer as a first modified example of the phase modulation layer of FIG. 28. In the example illustrated in FIG. 30, a substantially periodic structure (for example, the structure of FIG. 28) configured to emit a target beam projection pattern is formed inside the square inner region RIN, which is similar to the example illustrated in FIG. 23. On the other hand, a modified refractive index region formed in a perfect circle and whose gravity center position coincides with a lattice point position of the square lattice is arranged in an outer region ROUT surrounding the inner region RIN. The lattice interval of the square lattice that is virtually set is the same (=a) in the inner region RIN and the outer region ROUT. In this structure, light is distributed also in the outer region ROUT so that it is possible to suppress the occurrence of high-frequency noise (so-called window function noise) caused by an abrupt change in light intensity in the peripheral portion of the inner region RIN. In addition, light leakage in an in-plane direction can be suppressed, and reduction in threshold current can be expected.

Incidentally, the relationship between the optical image, obtained as the beam projection pattern outputted from each of the plurality of semiconductor light-emitting elements in the semiconductor light-emitting modules according to the various embodiments described above, and the phase distribution P(x, y) in the phase modulation layer n04-m is the same as that in the case of the above-described rotation system (FIG. 5). Accordingly, the phase modulation layer n04-m is configured to satisfy the following conditions under the above-described first precondition defining the square lattice, the above-described second precondition defined by the above Formulas (1) to (3), the above-described third precondition defined by the above Formulas (4) and (5), and the above-described fourth precondition defined by the above Formulas (6) and (7). That is, the corresponding modified refractive index region n04-mb is arranged inside the unit configuration region R(x, y) so as to satisfy the relationship that the distance r(x, y) from the lattice point O(x, y) to the gravity center G of the corresponding modified refractive index region n04-mb is $r(x, y)=C \times (P(x, y)-P_0)$ (C: a proportional constant, for example, $R_0/\pi$, $P_0$: an arbitrary constant, for example, zero). That is, the distance r(x, y) is set to zero when the phase P(x, y) in the unit configuration region R(x, y) is $P_O$, is set to the maximum value $R_O$ when the phase P(x, y) is $\pi+P_O$, and is set to the minimum value $-R_O$ when the phase P(x, y) is $-\pi+P_O$. When it is desired to obtain a target beam projection pattern, it is preferable to inverse Fourier transforming the target beam projection pattern and apply the distribution of the distance r(x, y) according to the phase P(x, y) of the complex amplitude thereof to the plurality of modified refractive index regions n04-mb. The phase P(x, y) and the distance r(x, y) may be proportional to each other.

Incidentally, a far-field image after Fourier transform of the laser beam can take various shapes such as a single spot shape or a plurality of spot shapes, an annular shape, a linear shape, a character shape, a double annular shape, and a Laguerre Gaussian beam shape. It is also possible to control a beam direction, and thus, it is possible to realize a laser processing machine which electrically performs high-speed scanning, for example, by one-dimensionally or two-dimensionally arraying the plurality of semiconductor light-emitting elements in each of the semiconductor light-emitting modules according to the various embodiments described above. Incidentally, the beam projection pattern is represented by angle information in the far field, and thus, the inverse Fourier transform may be performed after being once converted the angle information, and then, converted into a wave number space in the case of a bit map image or the like in which the target beam projection pattern is represented by two-dimensional position information.

As a method for obtaining an intensity distribution and the phase distribution from the complex amplitude distribution obtained by the inverse Fourier transform, for example, an intensity distribution I(x, y) can be calculated by using the abs function of numerical analysis software "MATLAB" of MathWorks, Inc., and the phase distribution P(x, y) can be calculated by using the angle function of MATLAB.

Here, a description will be given regarding points to be noted in the case of performing calculation using a general discrete Fourier transform (or fast Fourier transform) when the distance r(x, y) of each of the modified refractive index regions n04-mb is determined by obtaining the phase distribution P(x, y) from the result of the inverse Fourier transform of the target beam projection pattern. Incidentally, FIGS. 31A and 31B are views for describing points to be noted when a phase angle distribution (corresponding to a rotation angle distribution in the rotation system) is obtained from a result of inverse Fourier transform of a target beam projection pattern to determine the arrangement of the modified refractive index region. The beam projection pattern calculated from the complex amplitude distribution obtained by the inverse Fourier transform of FIG. 31A, which is the target beam projection pattern, is in the state illustrated in FIG. 31B. If the pattern is divided into four quadrants, that is, A1, A2, A3, and A4 as illustrated in FIGS. 31A and 31B, a superimposed pattern in which a pattern obtained by rotating the first quadrant of FIG. 31A by 180 degrees and a pattern in the third quadrant in FIG. 31A are superimposed on each other appears in the first quadrant of the beam projection pattern of FIG. 31B. In the second quadrant of FIG. 31B, a superimposed pattern in which a pattern obtained by rotating the second quadrant of FIG. 31A by 180 degrees and a pattern in the fourth quadrant of FIG. 31A are superimposed on each other appears. In the third quadrant of FIG. 31B, a superimposed pattern in which the pattern obtained by rotating the third quadrant of FIG. 31A by 180 degrees and the pattern in the first quadrant of FIG. 31A are superimposed on each other appears. In the fourth quadrant of FIG. 31B, a superimposed pattern in which the pattern obtained by rotating the fourth quadrant of FIG. 31A by 180 degrees and the pattern in the second quadrant of FIG. 31A are superimposed on each other appears. At this time, the pattern rotated 180 degrees is a pattern formed of negative first-order light components.

Therefore, when a pattern having a value only in the first quadrant is used as an optical image (original optical image) not subjected to the inverse Fourier transform, the pattern in the first quadrant of the original optical image appears in the third quadrant of the obtained beam projection pattern, and the pattern obtained by rotating the first quadrant of the original optical image by 180 degrees appears in the first quadrant of the obtained beam projection pattern.

Incidentally, a material system, a film thickness, and a layer configuration can be variously changed as long as it is configured to include the active layer and the phase modulation layer in the above structure. Here, a scaling rule holds regarding a so-called square lattice photonic crystal laser in which perturbation from the virtual square lattice is zero. That is, when a wavelength becomes constant a times, the same standing wave state can be obtained by multiplying the entire square lattice structure by a. Similarly, it is possible to determine the structure of the phase modulation layer n04-m according to the scaling rule depending on the wavelength even in the present embodiment. Therefore, it is also possible to realize the semiconductor light-emitting element that outputs visible light by using the active layer 12 that emits light such as blue, green, and red, and applying the scaling rule depending on the wavelength.

Incidentally, if unit vectors of orthogonal coordinates are x and y in the case of the square lattice with the lattice interval a, basic translation vectors are $a_1$=ax and $a_2$=ay, and basic reciprocal lattice vectors are $b_1=(2\pi/a)$x, and $b_2=(2\pi/a)$y for the translation vectors $a_1$ and $a_2$. If a wave number vector of a wave present in a lattice is k $nb_1+mb_2$ (n and m are arbitrary integers), a wave number k is present at the Γ point. Further, when the magnitude of the wave number vector is equal to the magnitude of a basic reciprocal lattice vector, a resonance mode (a standing wave within the X-Y plane) in which the lattice interval a is equal to a wavelength λ is obtained. In the above-described various embodiments, oscillation in such a resonance mode (standing wave state) is obtained. Considering a TE mode in which an electric field is present in a plane parallel to the square lattice at this time, there are four modes of the standing wave state where the lattice interval and the wavelength are equal as described above due to the symmetry of the square lattice. In the above-described various embodiments, a desired beam projection pattern can be similarly obtained in any mode of oscillation in any of these four standing wave states.

Incidentally, the desired beam projection pattern can be obtained as the standing wave in the phase modulation layer n04-m is scattered by the hole shape and waterfront obtained in the vertical direction of the plane is phase-modulated. Thus, the desired beam projection pattern can be obtained even without a polarizing plate. This beam projection pattern can be not only a pair of single peak beams (spots) but also a character shape or two or more spot groups having the same shape as described above or a vector beam or the like in which phase or intensity distribution is spatially non-uniform.

Incidentally, as an example, it is preferable that the refractive index of the base region n04-ma be 3.0 to 3.5 and the refractive index of the modified refractive index region n04-mb be 1.0 to 3.4. In addition, an average radius of the respective modified refractive index regions n04-mb in the hole of the base region n04-ma is, for example, 20 nm to 120 nm in the case of a band of 940 nm. As the size of each of the modified refractive index regions n04-mb changes, the diffraction intensity in the Z-axis direction changes. This diffraction efficiency is proportional to an optical coupling coefficient id represented by a first-order coefficient at the time of Fourier transform of the shape of the modified refractive index region n04-mb. The optical coupling coefficient is described, for example, in Non Patent Document 2 described above.

A description will be given regarding an effect obtained by a semiconductor light-emitting element including the phase modulation layer n04-m whose arrangement pattern of the modified refractive index region n04-mb has been determined by the on-axis shift system as described above. Conventionally, as the semiconductor light-emitting element, a semiconductor light-emitting element in which the gravity center G1 of each of the modified refractive index regions n04-mb is arranged to be away from the corresponding lattice point O of the virtual square lattice and has a rotation angle in accordance with an optical image about each of the lattice point O is known (see, for example, Patent Document 1). Meanwhile, if it is possible to realize a new light emission device in which the positional relationship between the gravity center G1 of each of the modified refractive index regions n04-mb and each of the lattice points O is different from that of the related art, a design margin of the phase modulation layer n04-m is expanded, which is extremely advantageous.

The phase modulation layer n04-m optically coupled to the active layer includes the base region n04-ma and the plurality of modified refractive index regions n04-mb each having a different refractive index from the base region n04-ma, and the gravity center G1 of each of the modified refractive index regions n04-mb is arranged on the straight line L, which passes through the lattice point O of the virtual square lattice and is tilted with respect to both the s-axis and the t-axis in the unit configuration region R defined by the orthogonal coordinate system of the s-axis and the t-axis. Further, the distance r(x, y) between the gravity center G1 of each of the modified refractive index regions n04-mb and the corresponding lattice point O is individually set in accordance with the target beam projection pattern. In such a case, a phase of a beam changes depending on the distance between the lattice point O and the gravity center G1. That is, it is possible to control the phase of the beam to be emitted from each of the modified refractive index regions n04-mb by only changing the position of the gravity center G1, and to make the beam projection pattern to be formed as a whole in a desired shape (target beam projection pattern). That is, each of the above-described semiconductor light-emitting elements is an S-iPM laser. According to such a structure, it is possible to output a beam projection pattern of an arbitrary shape in a direction tilted with respect to a direction perpendicular to the first surface from which light is outputted similarly to the conventional structure in which the gravity center G1 of each of the modified refractive index regions n04-mb has the rotation angle about each of the lattice points O in accordance with the target beam projection pattern. In this manner, in the on-axis shift system, it is possible to provide the semiconductor light-emitting element and the semiconductor light-emitting module in which the positional relationship between the gravity center G1 of each of the modified refractive index regions n04-mb and each of the lattice points O is completely different from the related art.

Figure 32A:
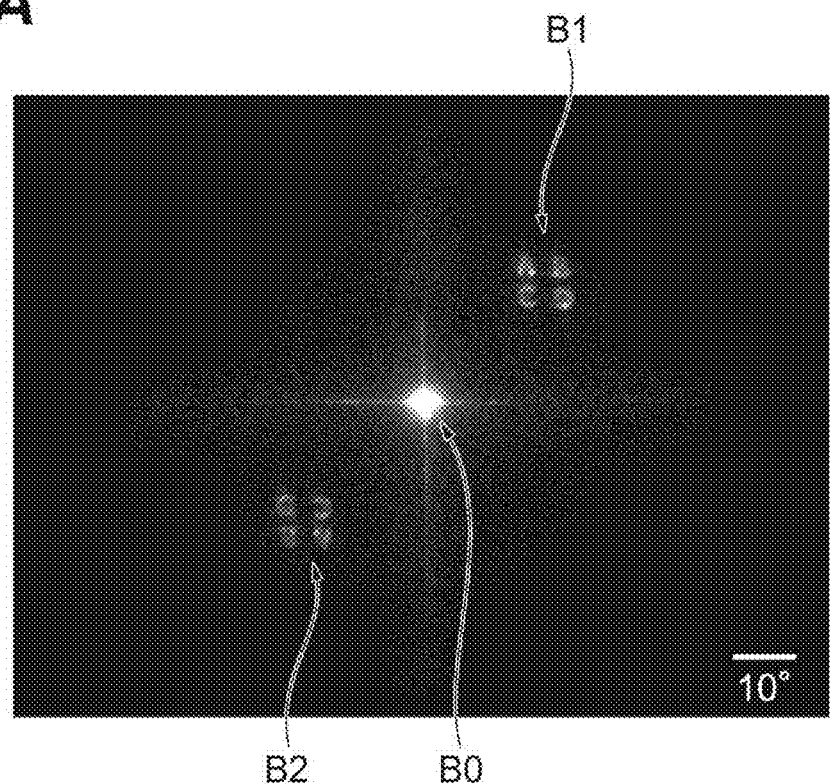
FIGS. 32A and 32B are views illustrating an example of a beam projection pattern outputted from a semiconductor light-emitting element and a light intensity distribution (graph) in a cross section that crosses a light emission surface of the semiconductor light-emitting element and includes an axis perpendicular to the light emission surface.
Figure 32B:
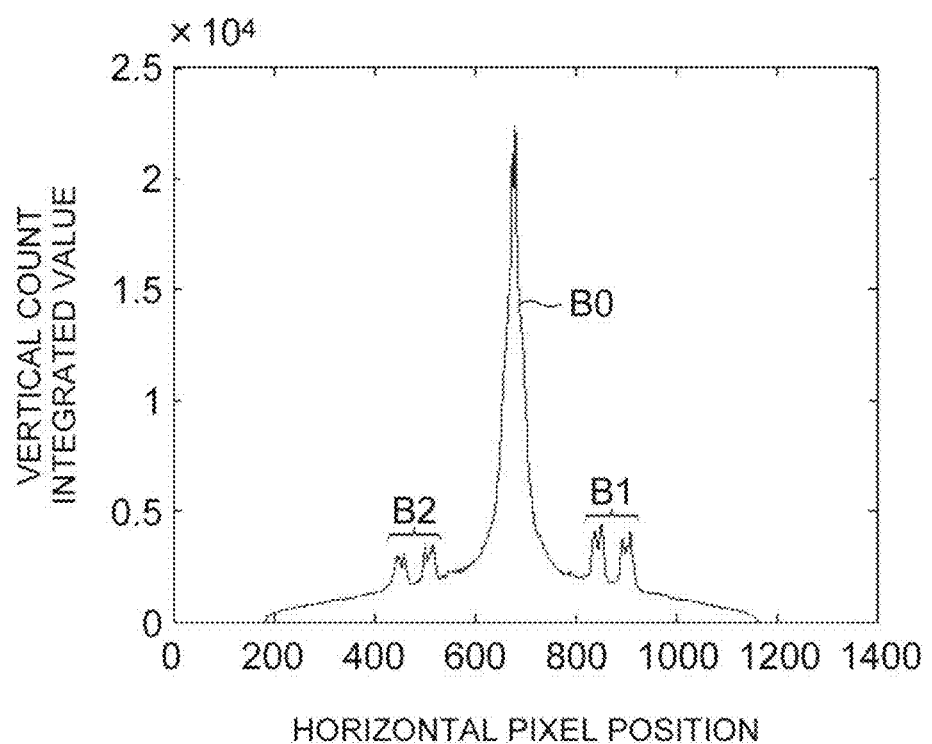
Figure 33A:
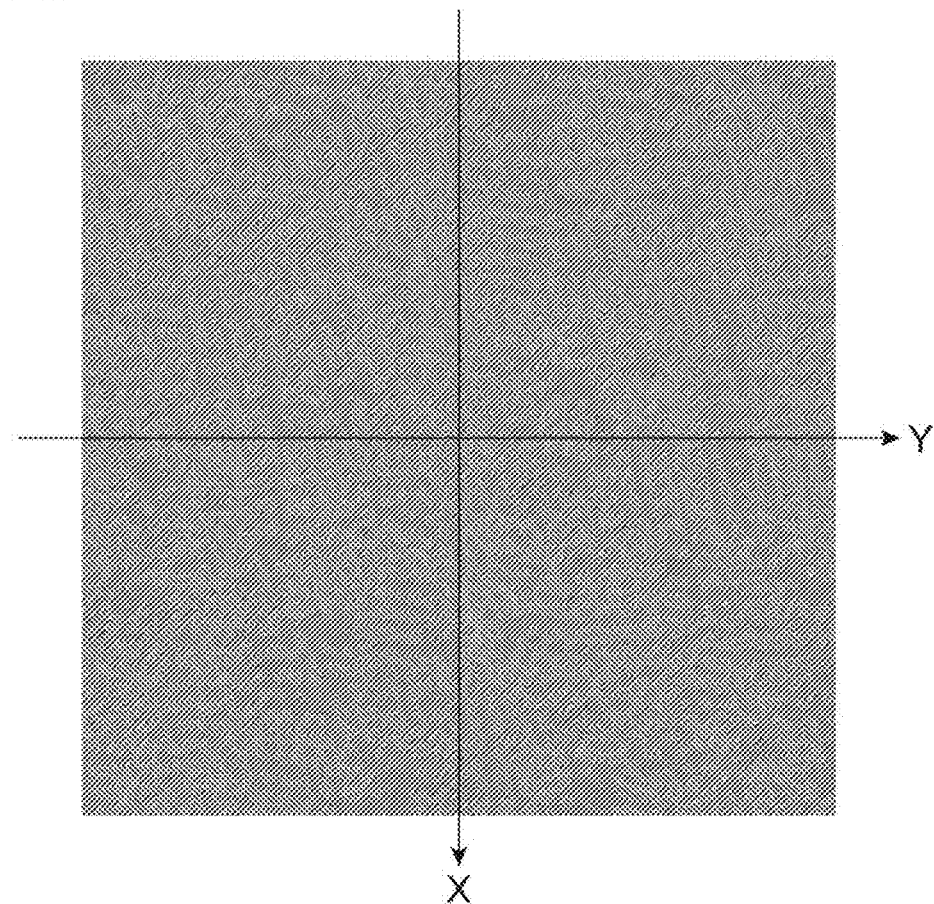
FIGS. 33A and 33B are a phase distribution corresponding to the beam projection pattern illustrated in FIG. 32A and a partially enlarged view thereof.
Figure 33B:
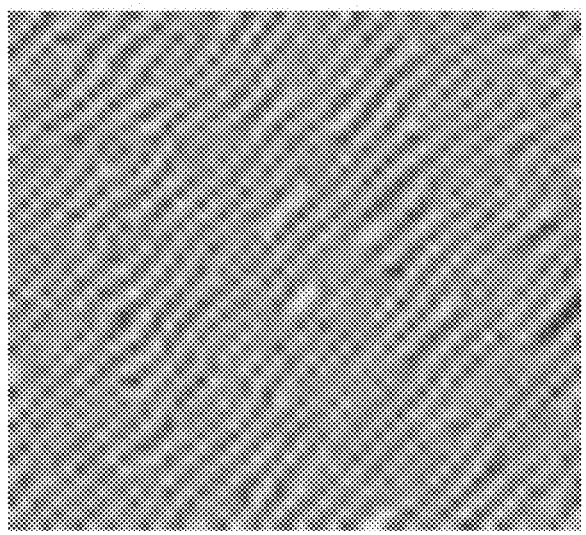

Here, FIG. 32A is a view illustrating an example of the beam projection pattern (optical image) outputted from the semiconductor light-emitting element. The center of FIG. 32A corresponds to an axis that intersects the light emission surface of the semiconductor light-emitting element and is perpendicular to the light emission surface. In addition, FIG. 32B is a graph illustrating a light intensity distribution in a cross section including the axis that intersects the light-emitting surface of the semiconductor light-emitting element and is perpendicular to the light emission surface. FIG. 32B is obtained by integrating and plotting vertical counts of image data of 1344 dots×1024 dots and in a far-field image acquired using an FFP optical system (A3267-12 manufactured by Hamamatsu Photonics K.K.), a camera (ORCA-05G manufactured by Hamamatsu Photonics K.K), and a beam profiler (Lepas-12 manufactured by Hamamatsu Photonics K.K.). Incidentally, a maximum count number in FIG. 32A is normalized to 255, and the zero-order light B0 at the central is saturated in order to clearly illustrate intensity ratios of positive and negative first-order light. An intensity difference between the first-order light and the negative first-order light can be easily understood from FIG. 32B. In addition, FIG. 33A is a view illustrating a phase distribution corresponding to the beam projection pattern illustrated in FIG. 32A. FIG. 33B is a partially enlarged view of FIG. 33A. In FIGS. 33A and 33B, a phase at each point in the phase modulation layer n04-m is indicated by shading. A phase angle approaches 0° as the shading is darker, and the phase angle approaches 360° as the shading is brighter. However, the phase angle is not necessarily set within the range of 0° to 360° since a center value of the phase angle can be arbitrarily set. As illustrated in FIGS. 32A and 32B, the semiconductor light-emitting element outputs the first-order light containing a first optical image portion B1 outputted in a first direction tilted with respect to the axis and the negative first-order light containing a second optical image portion B2 which is outputted in a second direction symmetrical to the first direction with respect to the axis and is rotationally symmetric with the first optical image portion B1 with respect to the axis. Typically, the first optical image portion B1 appears in the first quadrant in the X-Y plane, and the second optical image portion B2 appears in the third quadrant in the X-Y plane. However, there is a case where only the first-order light is used, and the negative first-order light is not used depending on an application. In such a case, it is desirable that the light amount of the negative first-order light be suppressed to be smaller than that of the first-order light.

Figure 34:
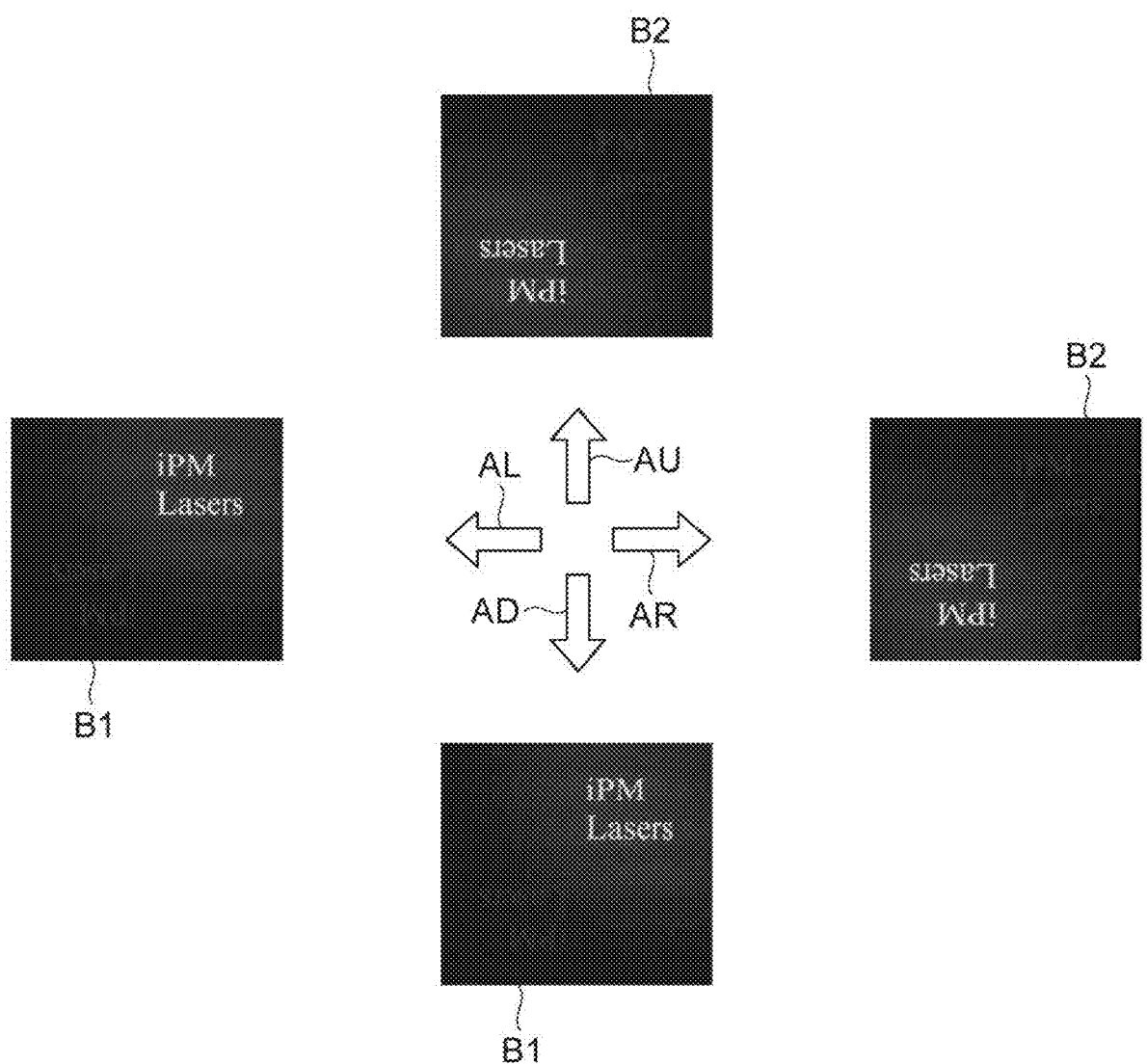
FIG. 34 is a view conceptually illustrating an example of a beam projection pattern of a traveling wave in each direction. In this example, a tilt angle of a straight line L with respect to the X-axis and Y-axis is set to 45°.

FIG. 34 is a view conceptually illustrating an example of a beam projection pattern of a traveling wave in each direction. In this example, a tilt angle of the straight line L with respect to each of the s-axis and the t-axis is 45° in the unit configuration region R. In the phase modulation layer of the S-iPM laser of the square lattice type, basic traveling waves AU, AD, AR, and AL are generated along the X-Y plane. The traveling waves AU and AD are light traveling along sides extending in the Y-axis direction among the respective sides of the square lattice. The traveling wave AU travels in the positive Y-axis direction, and the traveling wave AD travels in the negative Y-axis direction. Further, the traveling waves AR and AL are light traveling along sides extending in the X-axis direction among the respective sides of the square lattice. The traveling wave AR travels in the positive X-axis direction, and the traveling wave AL travels in the negative X-axis direction. In this case, beam projection patterns in opposite directions are obtained from the traveling waves traveling in opposite directions. For example, a beam projection pattern BU including only the second optical image portion B2 is obtained from the traveling wave AU, and a beam projection pattern BD including only the first optical image portion B1 is obtained from the traveling wave AD. Similarly, a beam projection pattern BR including only the second optical image portion B2 is obtained from the traveling wave AR, and a beam projection pattern BL including only the first optical image portion B1 is obtained from the traveling wave AL. In other words, one of the traveling waves traveling in opposite directions becomes the first-order light and the other becomes the negative first-order light. The beam projection pattern outputted from the semiconductor light-emitting element is one in which these beam projection patterns BU, BD, BR, and BL are superimposed on each other.

According to studies of the present inventors, the conventional semiconductor light-emitting element in which the modified refractive index region is rotated about the lattice point necessarily includes both traveling waves traveling in opposite directions due to the nature of the arrangement of the modified refractive index region. That is, in the conventional system, the same amount of the first-order light and negative first-order light appear in any of the four traveling waves AU, AD, AR, and AL forming a standing wave, and the zero-order light is generated depending on a radius of a rotation circle (the distance between the gravity center of the modified refractive index region and the lattice point). Thus, it is difficult to apply a difference between the light amounts of the first-order light and the negative first-order light in principle, and it is difficult to selectively reduce one of them. Therefore, it is difficult to reduce the light amount of the negative first-order light relative to the light amount of the 1st order light.

Figure 35A:
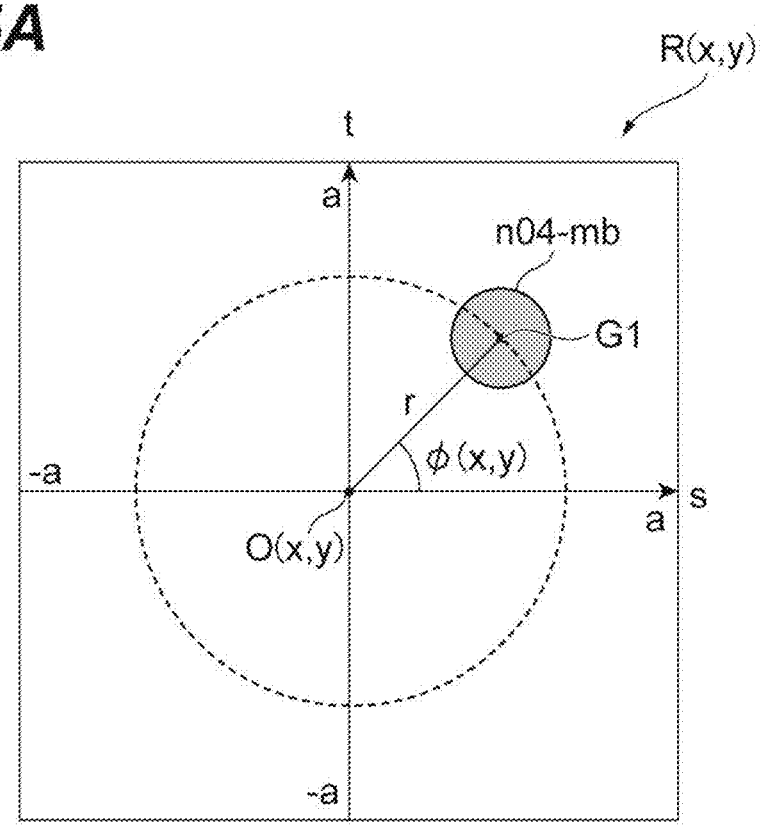
FIGS. 35A and 35B are views illustrating the rotation system of rotating the modified refractive index region around the lattice point, as the method for determining the arrangement pattern of the modified refractive index region, and traveling waves AU, AD, AR, and AL.
Figure 35B:
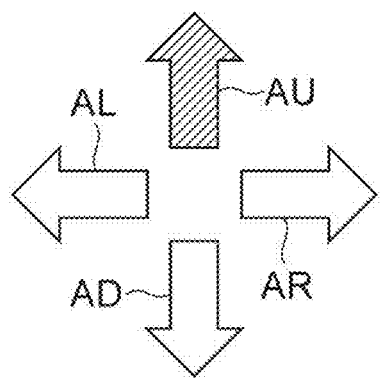

Here, FIGS. 35A and 35B are views illustrating the rotation system of rotating the above-described modified refractive index region n04-mb around the lattice point, as the method for determining the arrangement pattern of the modified refractive index region, and the traveling waves AU, AD, AR, and AL. A description will be given regarding a reason why it is difficult to selectively reduce either the first-order light or the negative first-order-order light in the rotation system in which the modified refractive index region n04-mb is rotated about the lattice point O. The traveling wave AU in the positive direction of the t-axis illustrated in FIG. 35B is considered as an example of four traveling waves with respect to the design phase y(x, y) at certain position At this time, a shift from the lattice point O becomes r·sin φ(x, y) for the traveling wave AU due to a geometrical relationship, and thus, a phase difference satisfies a relationship of (2π/a)r·sin φ(x, y). As a result, a phase distribution Φ(x, y) for the traveling wave AU is given by Φ(x, y)=exp{j(2π/a)r·sin φ(x, y)} when influence of the size of the modified refractive index region n04-mb is little so that the influence can be ignored. The contribution of the phase distribution Φ(x, y) to the zero-order light and the positive and negative first-order light is given by components of n=0 and n=±1 in the case of being expanded by exp{jnΦ(x, y)} (n: an integer). Meanwhile, if using a mathematical formula defined by the following Formula (11) related to a Bessel function Jn(z) of a first kind of the order n, the phase distribution Φ(x, y) can be subjected to series expansion, and each light amount of the zero-order light and the positive and negative first-order light can be described.

$$e^{jz\sin\phi} = \sum_{n=-\infty}^{\infty} J_n(z) \cdot e^{jn\phi} \qquad (11)$$

At this time, a zero-order light component, a first-order light component, and a negative first-order-order light component of the phase distribution ((x, y) are expressed by $J_1(2\pi r/a)$, $J_1(2\pi r/a)$, and $J_{-1}(2\pi r/a)$. Meanwhile, magnitudes of the positive and negative first-order light components become equal since there is the relationship that $J_1(x)=-J_{-1}(x)$ regarding positive and negative first-order Bessel functions. Although the traveling wave AU in the positive Y-axis direction has been considered as the example of four traveling waves here, the same relationship is established for the other three waves (the traveling waves AD, AR, and AL), and the magnitudes of the positive and negative first-order light components become equal. From the above argument, in principle, it is difficult to apply the difference between the light amounts of the positive and negative first-order light components in the conventional system in which the modified refractive index region n04-mb is rotated about the lattice point O.

On the other hand, according to the phase modulation layer n04-m in which the arrangement pattern of the modified refractive index region n04-mb is determined by the on-axis shift system, the difference occurs between the light amounts of the first-order light and the negative first-order light for the single traveling wave, and the ideal phase distribution can be obtained as the shift amount $R_0$ approaches an upper limit value of the above Formula (9), for example, when the tilt angle θ is 45°, 135°, 225°, or 315°. As a result, the zero-order light is reduced, and one of the first-order light and the negative first-order-order light is selectively reduced in each of the traveling waves AU, AD, AR, and AL. Thus, it becomes possible to apply the difference between the light amounts of the first-order light and the negative first-order light, in principle, by selectively reducing one of the traveling waves traveling in opposite directions.

Figure 36A:
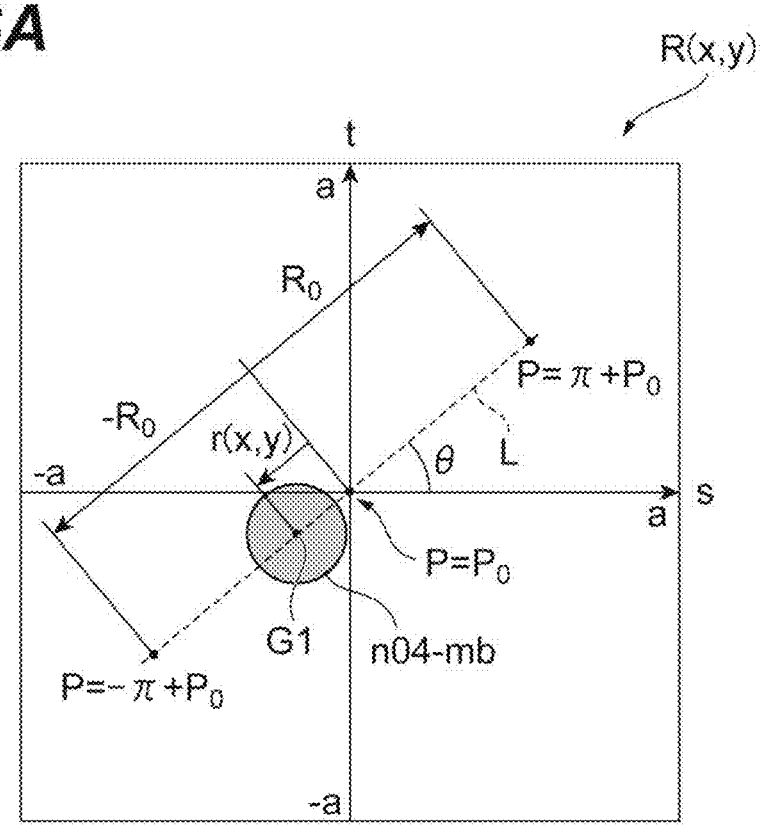
FIGS. 36A and 36B are views illustrating the on-axis shift system of moving the modified refractive index region on the axis tilted with respect to the square lattice through the lattice point, as the method for determining the arrangement pattern of the modified refractive index region, and the traveling waves AU, AD, AR, and AL.
Figure 36B:
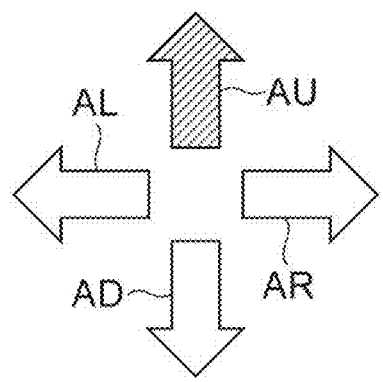

FIGS. 36A and 36B are views illustrating the on-axis shift system of moving the modified refractive index region on the axis tilted with respect to the square lattice through the lattice point, as the method for determining the arrangement pattern of the modified refractive index region n04-mb, and the traveling waves AU, AD, AR, and AL. A description will be given regarding a reason why it is possible to selectively reduce either the first-order light or negative first-order light in the on-axis shift system illustrated in FIG. 36A in which the gravity center G1 of the modified refractive index region n04-mb moves on the straight line L which passes through the lattice point O and is tilted with respect to both the s-axis and the t-axis defining the unit configuration region R. The traveling wave AU in the positive direction of the t-axis illustrated in FIG. 36B is considered as an example of four traveling waves for a design phase φ(x, y) at the unit configuration region R(x, y) (corresponding to the rotation angle of FIG. 5 in the rotation system). At this time, a shift from the lattice point O becomes r·sin θ·{φ(x, y)−φ₀}/π for the traveling wave AU due to the geometrical relationship, and thus, a phase difference satisfies a relationship (2π)/a) r·sin θ·{φ(x, y)−φ₀}/π. Here, it is set such that the tilt angle θ=45° and the phase angle φ₀=0° for the sake of simplicity. At this time, the phase distribution Φ(x, y) (corresponding to the above-described phase distribution P(x, y)) regarding the traveling wave AU is given by the following Formula (12)

when influence of the size of the modified refractive index region n04-mb is small so that the influence can be ignored.

$$\Phi(x, y) = \exp\left\{j\left(\frac{\sqrt{2}\,r}{a}\right)\phi(x, y)\right\} \quad (12)$$

The contribution of the phase distribution $\Phi(x, y)$ to the zero-order light and the positive and negative first-order light is given by components of n=0 and n=±1 in the case of being expanded by $\exp\{n\Phi(x, y)\}$ (n: an integer). Meanwhile, when a function f(z) expressed by the following Formula (13) is subjected to Laurent series expansion, a mathematical formula defined by the following Formula (14) is established.

$$f(z) = z^c \quad (13)$$
wherein
$0 < |c| < 1$
$c = \frac{\sqrt{2}\,r}{a}$
$z = \exp\{j\varphi(x, y)\}$ $$z^c = \sum_{n=-\infty}^{\infty} e^{j\pi(c-n)} \cdot \sin c[\pi(c-n)] \cdot z^n \quad (14)$$

Here, sin c(x) (sin(x))/x. If using a mathematical formula defined by the above Formula (14), the phase distribution $\Phi(x, y)$ can be subjected to series expansion, and each light amount of the zero-order light and the positive and negative first-order light can be described. At this time, when attention is paid to a point that an absolute value of the exponent term $\exp\{j\pi(c-n)\}$ in the above Formula (14) is one, a magnitude of a zero-order light component of the phase distribution $\Phi(x, y)$ is expressed by the following Formula (15).

$$\sin c\left(\frac{\sqrt{2}\,\pi r}{a}\right) \quad (15)$$

In addition, a magnitude of a first-order light component of the phase distribution $\varphi(x, y)$ is expressed by the following Formula (16).

$$\sin c \cdot \pi\left(-1 + \frac{\sqrt{2}\,r}{a}\right) \quad (16)$$

A magnitude of a negative first-order light component of the phase distribution $\Phi(x, y)$ is expressed by the following Formula (17).

$$\sin c \cdot \pi\left(1 + \frac{\sqrt{2}\,r}{a}\right) \quad (17)$$

Further, in the above formulas (15) to (17), the zero-order light component and the negative first-order-order light component appear in addition to the first-order light component except the case of satisfying the condition defined by the following expression (18). However, the magnitudes of the positive and negative first-order light components do not become equal to each other.

$$r = \frac{a}{\sqrt{2}} \quad (18)$$

Although the traveling wave AU in the positive Y-axis direction has been considered as the example of four traveling waves in the above description, the same relationship is established for the other three waves (the traveling waves AD, AR, and AL), and a difference occurs between the magnitudes of the positive and negative first-order light components. From the above argument, in principle, it is possible to apply the difference between the light amounts of the positive and negative first-order light components according to the on-axis shift system in which the modified refractive index region n04-mb moves on the straight line L which passes through the lattice point O and is tilted from the square lattice. Therefore, it becomes possible, in principle, to selectively take out only a desired optical image (the first optical image portion B1 or the second optical image portion B2) by reducing the negative first-order light or the first-order light. Even in FIG. 32B described above, it is understood that the difference in intensity occurs between the first-order light and the negative first-order light.

In addition, the tilt angle θ (the angle between the s-axis and the straight line L) of the straight line L in the unit configuration region R may be constant in the phase modulation layer n04-m in the on-axis shift system. As a result, it is possible to easily design the arrangement of the gravity center G1 of the modified refractive index region n04-mb. In addition, the tilt angle may be 45°, 135°, 225°, or 315° in this case. As a result, the four basic waves (in the case of setting the X and Y axes along the square lattice, light traveling in the positive X-axis direction, light traveling in the negative X-axis direction, light traveling in the positive Y-axis direction, and light traveling in the negative Y-axis direction) can contribute equally to the optical image. Further, when the tilt angle θ is 45°, 135°, 225°, or 315°, directions of electromagnetic fields on the straight line L are aligned in one direction by selecting an appropriate band edge mode, and thus, it is possible to obtain linearly polarized light. As an example of such a mode, there are modes A and B illustrated in FIG. 3 of Non Patent Document 3 described above. Incidentally, when the tilt angle θ is 0°, 90°, 180°, or 270°, a pair of traveling waves traveling in the Y-axis direction or the X-axis direction does not contribute to the first-order light (signal light) among the four traveling waves AU, AD, AR, and AL, and thus, it is difficult to make the signal light highly efficient.

Incidentally, optical coupling can be easily achieved even when the positional relationship between the active layer and the phase modulation layer n04-m is reversed along the Z-axis direction, which is the same as in the above-described rotation system.

Figure 37A:
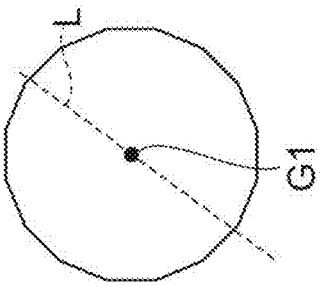
FIGS. 37A to 37G are views illustrating an example (in the on-axis shift system) of a plane shape of the modified refractive index region.
Figure 37B:
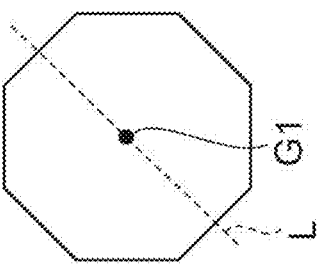
Figure 37C:
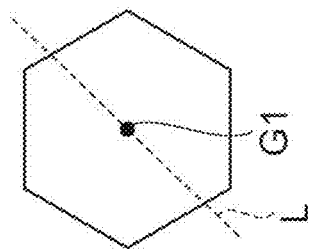
Figure 37D:
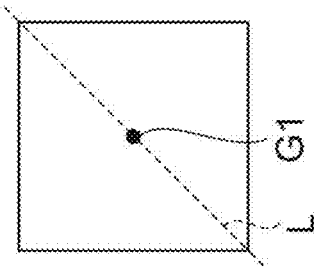
Figure 37E:
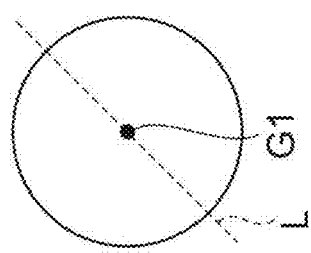
Figure 37F:
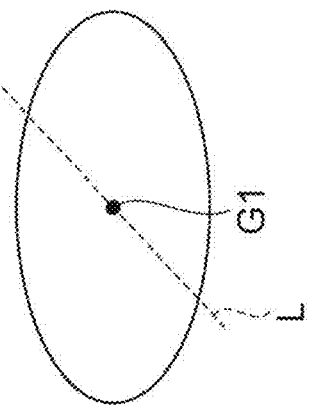
Figure 37G:
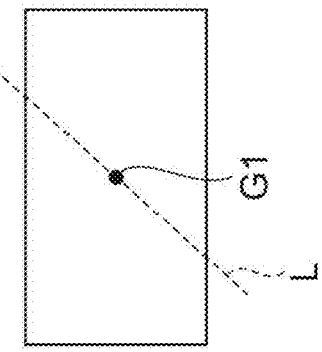

FIGS. 37A to 37G and 38A to 38K are views illustrating various examples (in the on-axis shift system) of a plane shape of the modified refractive index region. In the above-described example, the shape of the modified refractive index region n04-mb on the X-Y plane is the circle. However, the modified refractive index region n04-mb may have a shape other than the circle. For example, the shape of the modified refractive index region n04-mb may have mirror-image symmetry (line symmetry). Here, the mirror-image symmetry (line symmetry) represent that a planar shape of the modified refractive index region n04-mb positioned on one side of a straight line and a planar shape of the modified refractive index region n04-mb positioned on the other side of the straight line can be mirror-image symmetric (line symmetric) with each other with the certain straight line along the X-Y plane interposed therebetween. Examples of the shape having the mirror-image symmetry (line symmetry) include a perfect circle illustrated in FIG. 37A, a square illustrated in FIG. 37B, a regular hexagon illustrated in FIG. 37C, a regular octagon illustrated in FIG. 37D, a regular hexadecagon illustrated in FIG. 37E, a rectangle illustrated in FIG. 37F, an ellipse illustrated in FIG. 37€ and the like. In this manner, when the shape of the modified refractive index region n04-mb on the X-Y plane has mirror symmetry (linear symmetry), each of the unit configuration regions R of the virtual square lattice of the phase modulation layer n04-m has a simple shape, the direction and position of the gravity center G1 of the corresponding modified refractive index region n04-mb can be determined with high accuracy from the lattice point O. That is, it is possible to perform patterning with high accuracy.

In addition, the shape of the modified refractive index region n04-mb on the X-Y plane may have a shape that does not have a 180-degree rotational symmetry. Examples of such a shape include an equilateral triangle illustrated in FIG. 38A, a right-angled isosceles triangle illustrated in FIG. 38B, a shape in which two circles or ellipses partially overlap with each other illustrated in FIG. 38C, an egg shape illustrated in FIG. 38D, a teardrop shape illustrated in FIG. 38E, an isosceles triangle illustrated in FIG. 38F, an arrow shape illustrated in FIG. 38G, a trapezoid illustrated in FIG. 38H, a pentagon illustrated in FIG. 38I, a shape in which two rectangles partially overlap with each other illustrated in FIG. 38J, a shape in which two rectangles partially overlap with each other without mirror-image symmetry illustrated in FIG. 38K, and the like. Incidentally, the "egg shape" is a shape deformed such that a dimension of an ellipse in a short-axis direction in the vicinity of one end portion along a long axis is smaller than a dimension in the short-axis direction in the vicinity of the other end portion. The "teardrop shape" is a shape obtained by deforming one end portion along the long axis of the ellipse into a sharp end portion protruding along a long-axis direction. The "arrow shape" is a shape in which one side of a rectangle is recessed in a triangle shape and a side opposing the one side is made sharp into a triangle shape. Since the shape of the modified refractive index region n04-mb on the X-Y plane does not have the 180-degree rotational symmetry in this manner, it is possible to obtain a higher light output. Incidentally, the modified refractive index region n04-mb may be constituted by a plurality of elements as illustrated in FIGS. 38J and 38K, and in such a case, the gravity center G1 of the modified refractive index region n04-m is a combined gravity center of the plurality of components.

Figure 40:
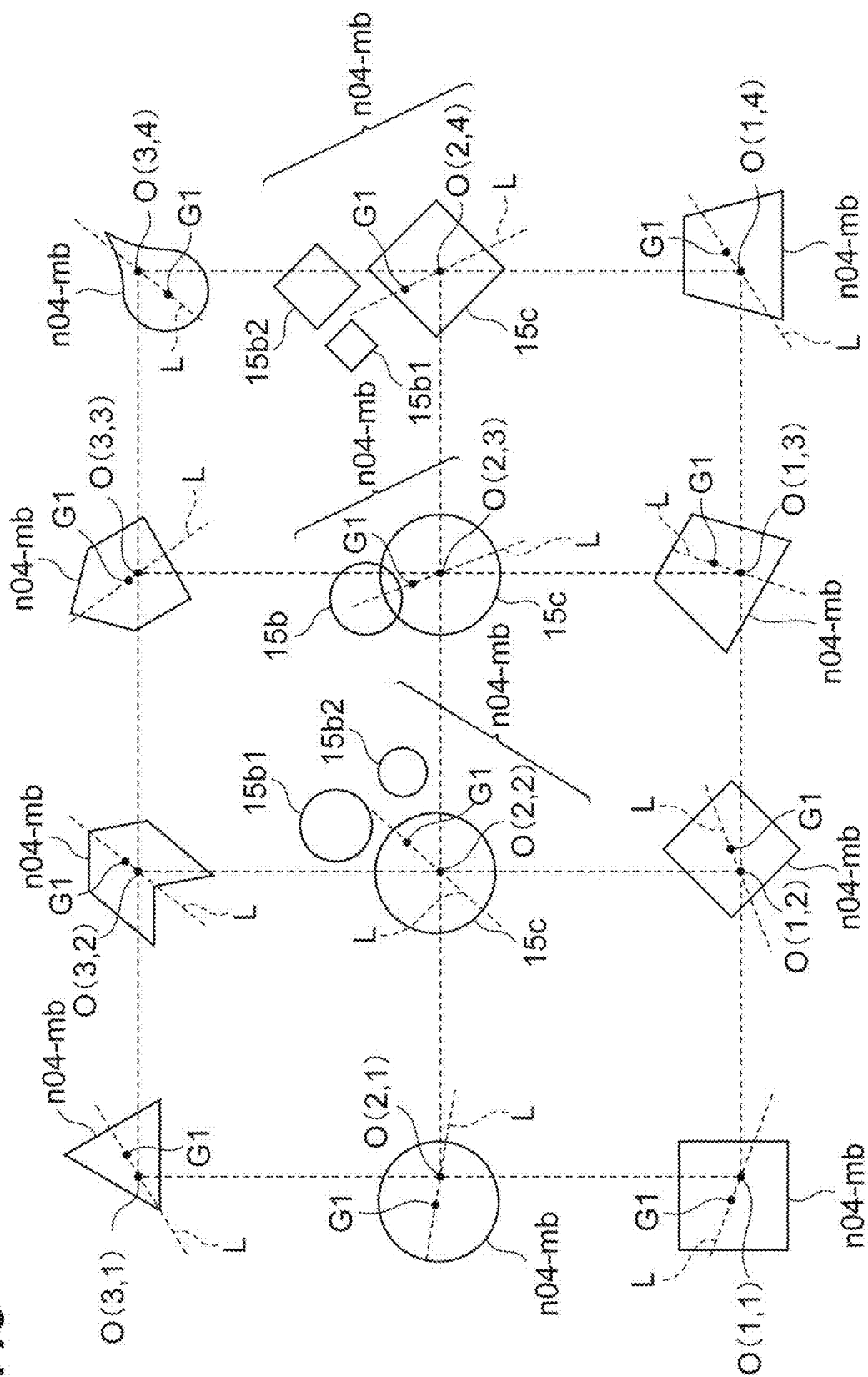
FIG. 40 is a graph illustrating a second modified example of the phase modulation layer of FIG. 28.

FIGS. 39A to 39K are views illustrating still another example (in the on-axis shift system) of the plane shape of the modified refractive index region. In addition, FIG. 40 is a view illustrating a second modified example of the phase modulation layer of FIG. 28.

In the example illustrated in FIGS. 39A to 39K and 40, each of the modified refractive index regions n04-mb is constituted by a plurality of components 15b and 15c. The gravity center G1 is a combined gravity center of all the components, and is positioned on the straight line L. Both the components 15b and 15c have a second refractive index different from the first refractive index of the base region n04-ma. Both of the components 15b and 15c may be holes, and a compound semiconductor may be embedded in the holes. In each of the unit configuration regions R, the components 15c are provided in one-to-one correspondence with the components 15b. Further, the combined gravity center G1 of the components 15b and 15c is positioned on the straight line L crossing the lattice point O of the unit configuration region R forming the virtual square lattice. Incidentally, both the components 15b and 15c are included within the range of the unit configuration region R forming the virtual square lattice. The unit configuration region R is a region surrounded by straight lines bisecting between lattice points of the virtual square lattice.

A plane shape of the component 15c is, for example, a circle, but may have various shapes as in the various examples illustrated in FIGS. 37A to 37G and 38A to 38K. FIGS. 39A to 39K illustrate examples of shapes and relative relationships of the components 15b and 15c on the X-Y plane. FIGS. 39A and 39B illustrate a mode in which both the components 15b and 15c have figures of the same shape. FIGS. 39C and 39D illustrate a mode in which both the components 15b and 15c have figures of the same shape, and pars thereof overlap each other. FIG. 39E illustrates a mode in which both the components 15b and 15c have figures of the same shape, and a distance between gravity centers of the components 15b and 15c is arbitrarily set for each lattice point. FIG. 39F illustrates a mode in which the components 15b and 15c have figures of different shapes. FIG. 39G illustrates a mode in which both the components 15b and 15c have figures of the mutually different shapes, and a distance between gravity centers of the components 15b and 15c is arbitrarily set for each lattice point.

In addition, as illustrated in FIGS. 39H to 39K, the component 15b forming a part of the differential refractive index region n04-mb may be constituted by two regions 15b1 and 15b2 separated from each other. Then, a distance between a combined gravity center (corresponding to the gravity center of the single component 15b) of the regions 15b1 and 15b2 and the gravity center of the component 15c may be arbitrarily set for each lattice point. In addition, in this case, the regions 15b1 and 15b2 and the component 15c may have figures of the same shape as illustrated in FIG. 39H. Alternatively, two figures of the regions 15b1 and 15b2 and the component 15c may be different from the other figure as illustrated in FIG. 39I. In addition, an angle of the component 15c with respect to the s-axis may be arbitrarily set for each lattice point in addition to an angle of a straight line connecting the regions 15b1 and 15b2 with respect to the s-axis as illustrated in FIG. 39J. In addition, the angle of the straight line connecting the regions 15b1 and 15b2 with respect to the s-axis may be arbitrarily set for each lattice point while the regions 15b1 and 15b2 and the component 15c maintain the same relative angle with each other as illustrated in FIG. 39K.

Incidentally, the plane shapes of the modified refractive index regions n04-mb may be the same among the unit configuration regions R. That is, the modified refractive index regions n04-mb may have the same figure in all the unit configuration regions R and can be caused to overlap with each other between the lattice points by a translational operation or the translational operation and a rotational operation. In such a case, it is possible to suppress the generation of noise light and zero-order light that becomes noise in the beam projection pattern. Alternatively, the plane shapes of the modified refractive index regions n04-mb are not necessarily the same among the unit configuration regions R, and the shapes may be different between the adjacent unit configuration regions R, for example, as illustrated in FIG. 40. Incidentally, the center of the straight line L passing through each of the lattice points O is preferably set to coincide with the lattice point O in all the cases of FIGS. 37A to 37G, 38A to 38K, 39A to 39K, and 40 as illustrated in the examples of FIGS. 36A and 36B.

As described above, it is possible to suitably achieve the same effects as those of the embodiments to which the phase modulation layer in which the arrangement pattern of the modified refractive index region is determined by the rotation system has been applied even in the configuration of the phase modulation layer in which the arrangement pattern of the modified refractive index region is determined by the on-axis shift system.

REFERENCE SIGNS LIST 100, 200, 300, 100B . . . semiconductor light-emitting element; 102, 202, 302, 102B first cladding layer; 103, 203, 303, 103B . . . active layer; 104, 204, 304, 104B . . . phase modulation layer; 104-*m* (in is a positive integer), 204-*m*, 304-*m*, 104B-m . . . phase modulation region; 104-*ma*, 204-*ma*, 304-*ma*, 104B-ma . . . base region; 104-*mb*, 204-*mb*, 304-*mb*, 104B-mb . . . plurality of modified refractive index regions; 106, 206, 306, 106B . . . second cladding layer; 108-*m*, 208-*m*, 308-*m*, 108B-m . . . second-surface-side electrode; 110, 210, 310, 110B-m first-surface-side electrode; and 112, 212, 312, 112B . . . separation region.

The invention claimed is:

1. A semiconductor light-emitting element comprising a first surface and a second surface opposing the first surface, one of the first surface and the second surface functioning as a light emission surface that outputs light and another functioning as a support surface, the semiconductor light-emitting element further comprising:

an active layer positioned between the first surface and the second surface;

a phase modulation layer positioned between the first surface and the second surface and including a plurality of phase modulation regions each of which is optically coupled to the active layer, the plurality of phase modulation regions each including a base region having a first refractive index and a plurality of modified refractive index regions each of which is provided in the base region and has a second refractive index different from the first refractive index;

a first cladding layer positioned on a side where the first surface is arranged with respect to a stacked structure including at least the active layer and the phase modulation layer;

a second cladding layer arranged on a side where the second surface is positioned with respect to the stacked structure;

a first-surface-side electrode arranged on a side where the first surface is positioned with respect to the first cladding layer;

a plurality of second-surface-side electrodes arranged on a side where the second surface is arranged with respect to the second cladding layer and corresponding to the plurality of phase modulation regions, respectively, the plurality of second-surface-side electrodes arranged in a plurality of regions overlapping the plurality of phase modulation regions, respectively, as viewed along a stacking direction of the stacked structure; and a common substrate layer arranged between the first cladding layer and the first-surface-side electrode, the common substrate layer having a continuous surface that holds the plurality of phase modulation regions, wherein, in each of the plurality of phase modulation regions included in the phase modulation layer, the plurality of modified refractive index regions are arranged at predetermined positions in the base region according to an arrangement pattern, configured to make a beam projection pattern, which is a projection pattern of light outputted from the light emission surface when a drive current is supplied from a corresponding second-surface-side electrode among the plurality of second-surface-side electrodes, and a beam projection region where the beam projection pattern is formed coincide with a target beam projection pattern and a target beam projection region, respectively, wherein, in a state that a virtual square lattice constituted by M1 (an integer of one or more)×N1 (an integer of one or more) unit configuration regions R each having a square shape is set on an X-Y plane in an XYZ orthogonal coordinate system defined by a Z-axis coinciding with a normal direction of the light emission surface and the X-Y plane, which includes X and Y axes orthogonal to each other and coincides with one surface of the phase modulation layer including the plurality of modified refractive index regions, wherein, the arrangement pattern is defined such that a gravity center G1 of the modified refractive index region positioned in a unit configuration region R(x, y) is separated from a lattice point O(x, y) as a center of the unit configuration region R(x, y) by a distance r in the unit configuration region R(x, y) on the X-Y plane, specified by a coordinate component x (an integer of one or more and M1 or less) in an X-axis direction and a coordinate component y (an integer of one or more and N1 or less) in a Y-axis direction, and a vector from the lattice point O(x, y) to the gravity center G1 is directed in a specific direction, wherein, in a state that the phase modulation layer satisfies the following first to seventh conditions:

the first condition defined such that a lattice constant of the virtual square lattice is a, the distance r satisfies 0≤r≤0.3a, the second condition defined such that coordinates (x, y, z) in the XYZ orthogonal coordinate system satisfy relationships represented by following Formulas (1) to (3) with respect to spherical coordinates (d1, $\theta_{tilt}$, $\theta_{rot}$) defined defined by a length d1 of a radius vector, a tilt angle $\theta_{tilt}$ from the Z-axis, and a rotation angle $\theta_{rot}$ from the X-axis specified on the X-Y plane:

$$x = d1 \sin\theta_{tilt} \cos\theta_{rot} \quad (1)$$

$$y = d1 \sin\theta_{tilt} \sin\theta_{rot} \quad (2)$$

$$z = d1 \cos\theta_{tilt} \quad (3),$$

the third condition defined such that a target beam projection pattern is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by a following Formula (4), on a Kx-axis corresponding to the X-axis and a coordinate value $k_y$ which is a normalized wave number defined by a following Formula (5), on a Ky-axis corresponds to the Y-axis and orthogonal to the Kx-axis:

$$k_x = \frac{a}{\lambda}\sin\theta_{tilt}\cos\theta_{rot} \qquad (4)$$

$$k_y = \frac{a}{\lambda}\sin\theta_{tilt}\sin\theta_{rot} \qquad (5)$$

a: Lattice constant of virtual square lattice
λ: Oscillation wavelength,
the fourth condition defined such that a specific wave number range including the beam projection pattern is constituted by M2 (an integer of one or more)×N2 (an integer of one or more) image regions FR each having a square shape in a wave number space defined by the Kx-axis and the Ky-axis,
the fifth condition defined such that a complex amplitude F(x, y), which is obtained by two-dimensional inverse Fourier transform of each image region FR($k_x$, $k_y$), specified by the coordinate component $k_x$ (an integer of from 0 to M2-1) in the Kx-axis direction and the coordinate component $k_y$ (an integer of from 0 to N2-1) in the Ky-axis direction, to the unit configuration region R(x, y) on the X-Y plane in the wave number space, is given by a following Formula (6) with j as an imaginary unit:

$$F(x, y) = \sum_{k_x=0}^{M2-1} \sum_{k_y=0}^{N2-1} FR(k_x, k_y)\exp\left[j2\pi\left(\frac{k_x}{M2}x + \frac{k_y}{N2}y\right)\right], \qquad (6)$$

the sixth condition defined such that the complex amplitude F(x, y) is defined by a following Formula (7) when an amplitude term is A(x, y) and a phase term is P(x, y) in the unit configuration region R(x, y):

$$F(x,y)=A(x,y)\times\exp\,[jP(x,y)], \qquad (7)$$

the seventh condition defined such that the unit configuration region R(x, y) is defined by an s-axis and a t-axis which are parallel to the X-axis and the Y-axis and orthogonal to each other at the lattice point O(x, y), and
the phase modulation layer is configured such that the corresponding modified refractive index region, which satisfies a relationship that an angle φ(x, y) formed by a line segment connecting the lattice point O(x, y) and the gravity center G1 of the corresponding modified refractive index region and the s-axis is $$\varphi(x,y)=C\times P(x,y)+B$$

(C: a proportional constant,
B: an arbitrary constant), and
is arranged inside the unit configuration region R(x,y).

2. The semiconductor light-emitting element according to claim 1, further comprising
a separation region that electrically separates each of the plurality of phase modulation regions and electrically separate a plurality of corresponding regions in each of the active layer, the first cladding layer, and the second cladding layer which overlap the plurality of phase modulation regions as viewed from a direction along the Z-axis.

3. The semiconductor light-emitting element according to claim 2, wherein
the separation region optically separates the plurality of corresponding regions in each of the active layer, the phase modulation layer, the first cladding layer, and the second cladding layer together with the plurality of phase modulation regions.

4. The semiconductor light-emitting element according to claim 2, wherein
the separation region extends from the second surface to the common substrate layer until reaching the common substrate layer in a region between adjacent phase modulation regions among the plurality of phase modulation regions, and
a distance between a distal end of the separation region and the first-surface-side electrode is equal to or shorter than half of a thickness of the common substrate layer in the direction along the Z-axis.

5. The semiconductor light-emitting element according to claim 2, wherein
the separation region is any of a semiconductor layer modified by an electric field caused by high-intensity light irradiation, a semiconductor layer insulated by impurity diffusion or ion implantation, and an air gap formed by dry etching or wet etching.

6. The semiconductor light-emitting element according to claim 1, wherein
the arrangement pattern in each of the phase modulation regions is set such that the beam projection regions become equal even if a drive current is supplied from any of the second-surface-side electrodes.

7. The semiconductor light-emitting element according to claim 1, wherein
the arrangement pattern in each of the phase modulation regions is set such that the beam projection patterns become equal even if a drive current is supplied from any of the plurality of second-surface-side electrodes.

8. The semiconductor light-emitting element according to claim 1, wherein
at least any of a shape defined on the X-Y plane, an area defined on the X-Y plane, and the distance r defined on the X-Y plane is coincident in all of the plurality of modified refractive index regions in the phase modulation layer in at least one phase modulation region among the plurality of phase modulation regions.

9. The semiconductor light-emitting element according to claim 1, wherein
shapes of the plurality of modified refractive index regions on the X-Y plane are any of a perfect circle, a square, a regular hexagon, a regular octagon, a regular hexadecagon, an equilateral triangle, a right-angled isosceles triangle, a rectangle, an ellipse, a shape in which two circles or ellipses partially overlap each other, an egg shape obtained by deforming an ellipse such that a dimension in a short-axis direction in a vicinity of one end portion along a long axis is smaller than a dimension in the short-axis direction in a vicinity of another end portion, a teardrop shape obtained by deforming one end portion of an ellipse along a long axis into a sharp end portion protruding along a long-axis direction, an isosceles triangle, an arrow shape in which one side of a rectangle forms a triangular notch and a side opposing the one side form's a triangular protrusion, a trapezoid, a pentagon, and a shape in which two rectangles partially overlap each other.

10. The semiconductor light-emitting element according to claim 1, wherein
in at least one phase modulation region among the plurality of phase modulation regions,
the phase modulation region includes:

an inner region constituted by M1×N1 unit configuration regions R; and an outer region provided so as to surround an outer circumference of the inner region, the outer region including a plurality of peripheral lattice-point-located modified-refractive-index-regions arranged to overlap with lattice points, respectively, in an expanded square lattice defined by setting an identical lattice structure as the virtual square lattice on an outer circumference of the virtual square lattice.

11. The semiconductor light-emitting element according to claim 1, wherein in at least one phase modulation region among the plurality of phase modulation regions, the phase modulation region includes a plurality of lattice-point-located modified refractive index regions arranged in the M1×N1 unit configuration regions R, respectively, the plurality of lattice-point-located modified refractive index regions each having a gravity center G2 coinciding with the lattice point O of the corresponding unit configuration region R.

12. A manufacturing method for manufacturing the semiconductor light-emitting element according to claim 1, the manufacturing method comprising:

a first step of forming the common substrate layer;

a second step of forming an element body, which has a third surface and a fourth surface opposing the third surface and opposing the common substrate layer, on the common substrate layer, the element body including at least the active layer, the phase modulation layer, the first cladding layer, and the second cladding layer arranged between the third surface and the fourth surface, the second step of forming the base region in the phase modulation layer with a single layer in which a plurality of portions that need to form the plurality of phase modulation regions, the plurality of portions respectively including the plurality of modified refractive index regions, are arranged in a state of being separated from each other by a predetermined distance; and a third step of forming a separation region, which electrically separates at least the plurality of portions that need to form the plurality of phase modulation regions, in the element body, the third step of forming the separation region from the third surface to the fourth surface until reaching the common substrate layer.

13. The manufacturing method according to claim 12, wherein a distance between a distal end of the separation region and the first-surface-side electrode is equal to or shorter than half of a thickness of the common substrate layer along a direction from the third surface toward the fourth surface.

14. The manufacturing method according to claim 12, wherein the separation region is any of a semiconductor layer modified by an electric field caused by high-intensity light irradiation, a semiconductor layer insulated by impurity diffusion or ion implantation, and an air gap formed by dry etching or wet etching.

* * * * *